United States Patent [19]

Ozaki et al.

[11] Patent Number: 6,104,052
[45] Date of Patent: *Aug. 15, 2000

[54] SEMICONDUCTOR DEVICE ADOPTING A SELF-ALIGNED CONTACT STRUCTURE AND METHOD FOR MANUFACTURING A SEMICONDUCTOR MEMORY DEVICE

[75] Inventors: Tohru Ozaki, Tokyo; Yusuke Kohyama, Yokosuka, both of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/273,573

[22] Filed: Mar. 22, 1999

[30] Foreign Application Priority Data

Mar. 30, 1998 [JP] Japan .................................. 10-084378

[51] Int. Cl.[7] .................................................. H01L 29/72
[52] U.S. Cl. ........................... 257/296; 257/306; 257/509; 257/516; 257/758; 438/239; 438/265; 438/294; 438/439; 438/622
[58] Field of Search ..................................... 257/296, 306, 257/509, 516, 758; 435/239, 265, 294, 439, 622

Primary Examiner—Edward Wojchechowicz
Attorney, Agent, or Firm—Banner & Witcoff, Ltd.

[57] ABSTRACT

In a DRAM adopting a self-aligned contact structure, an opening portion of predetermined size is formed in advance in an insulation film which surrounds an on-field gate electrode formed on an element isolating insulation film. The on-field gate electrode contacts a gate contact through the opening portion. A contact hole for the gate contact can thus be formed in self-alignment as can be the contact holes for a bit-line contact and an active contact. Consequently, the contact hole for the gate contact reaching the on-field gate can be formed simultaneously with the contact holes for the bit-line contact and active contact, thereby greatly reducing the number of manufacturing steps.

74 Claims, 39 Drawing Sheets

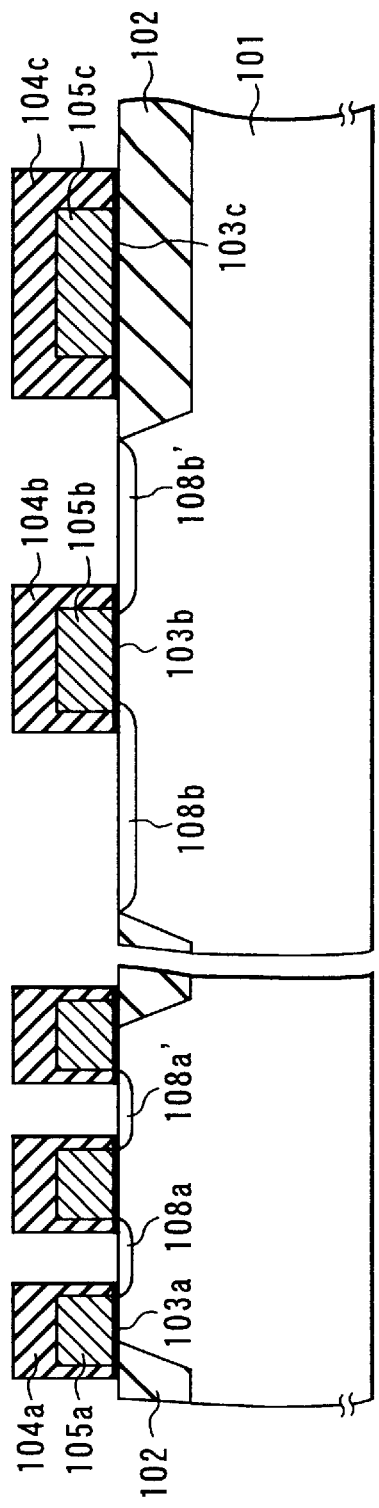
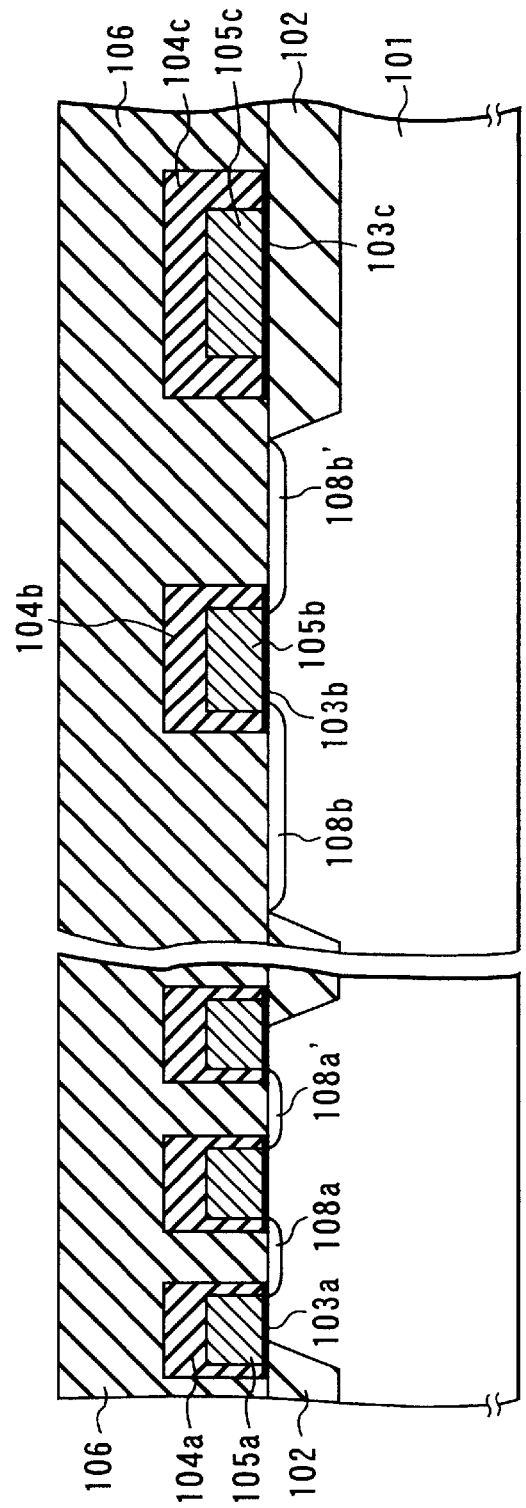
FIG. 2A (PRIOR ART)
FIG. 2B (PRIOR ART)

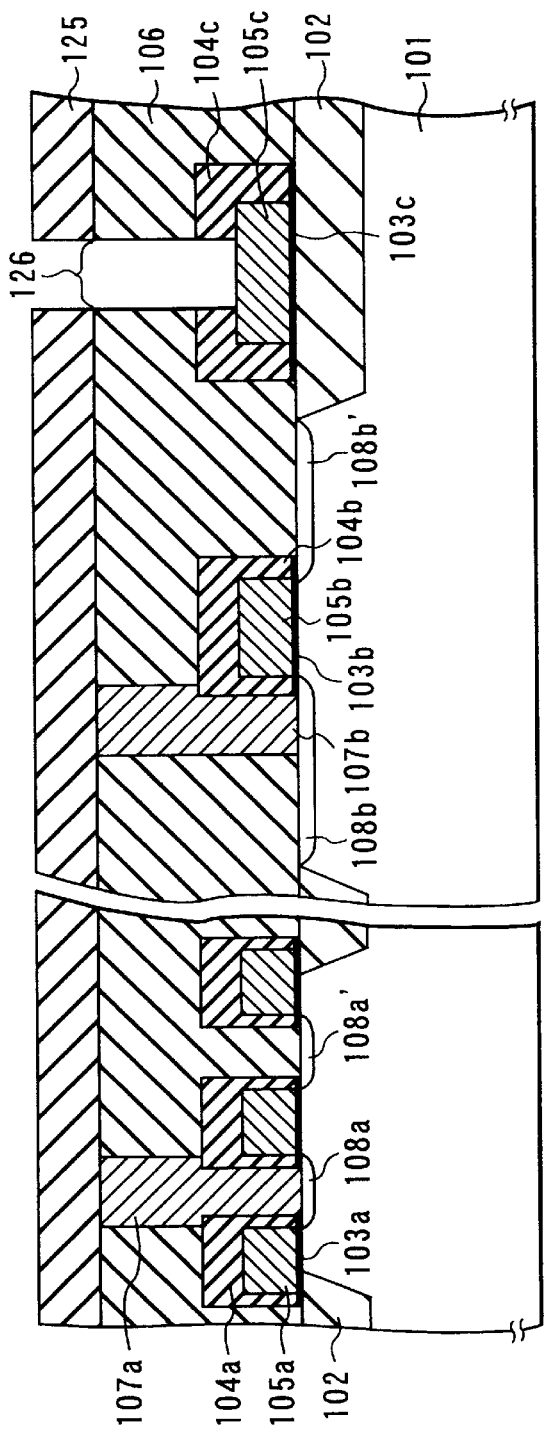
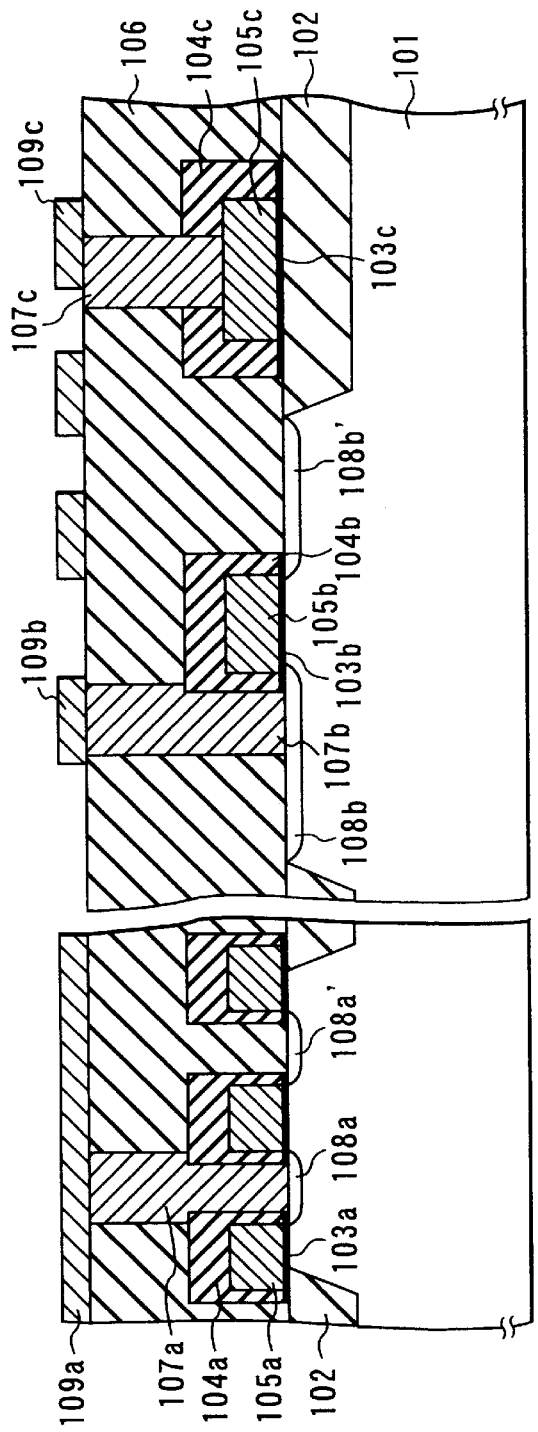
FIG. 2E (PRIOR ART)
FIG. 2F (PRIOR ART)

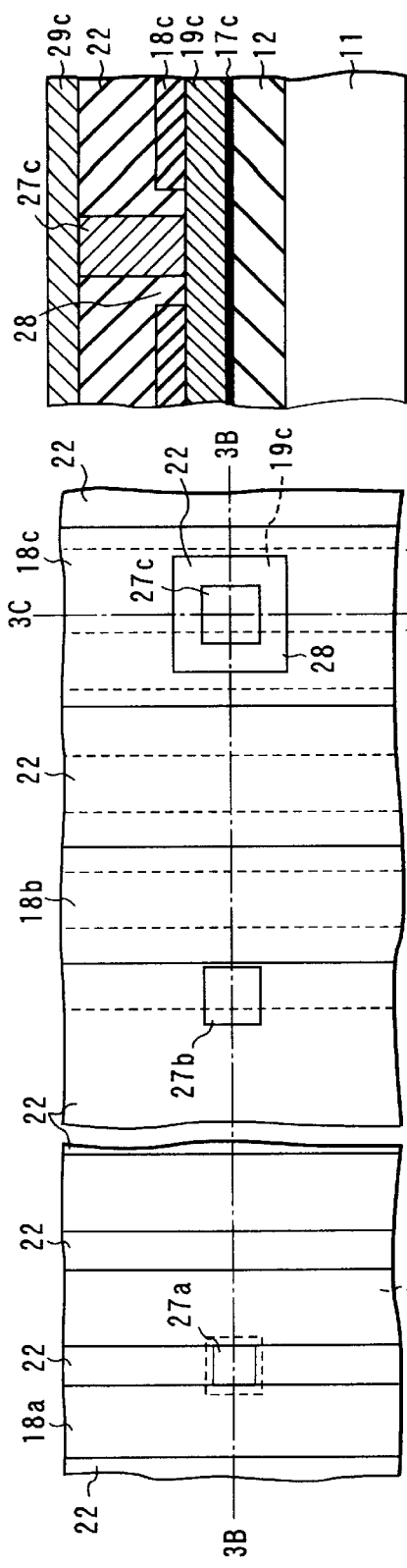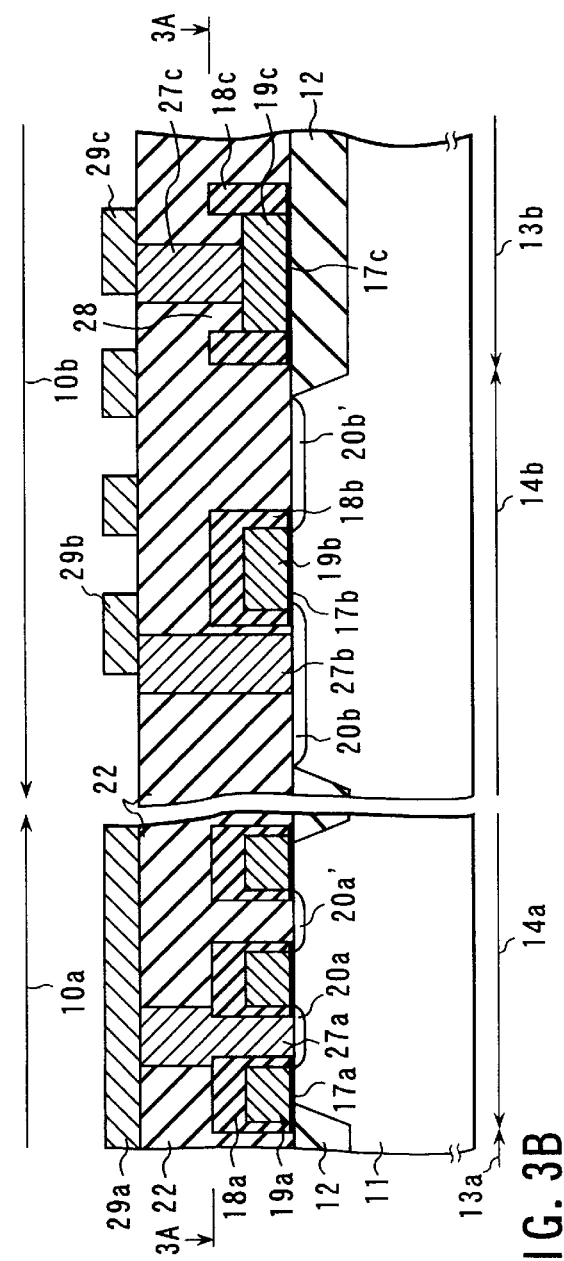
FIG. 3A  FIG. 3B  FIG. 3C

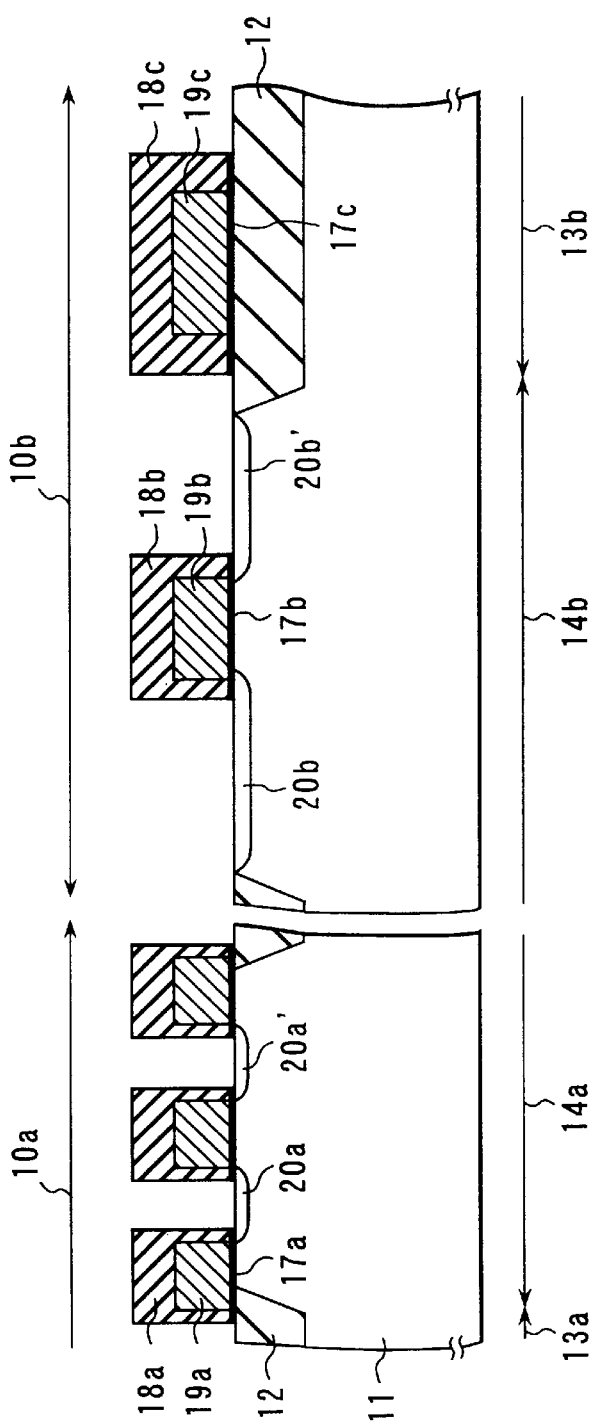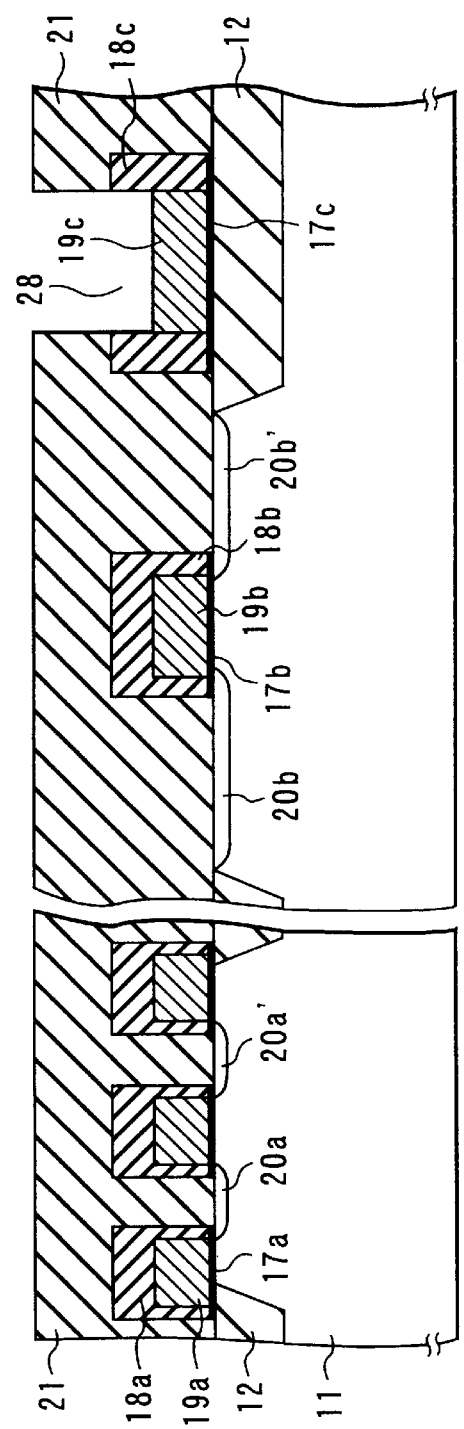
FIG. 4A
FIG. 4B

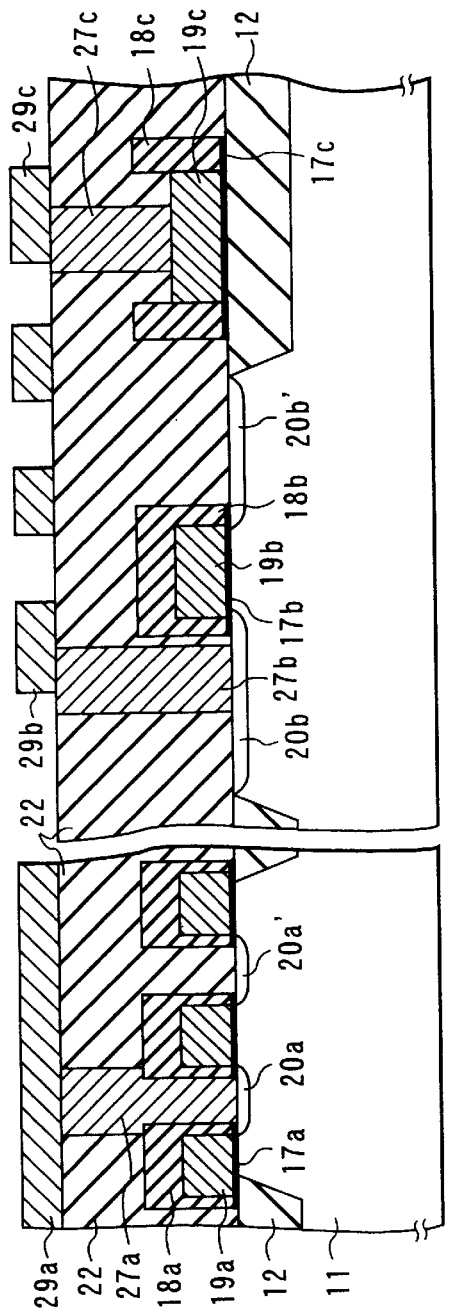
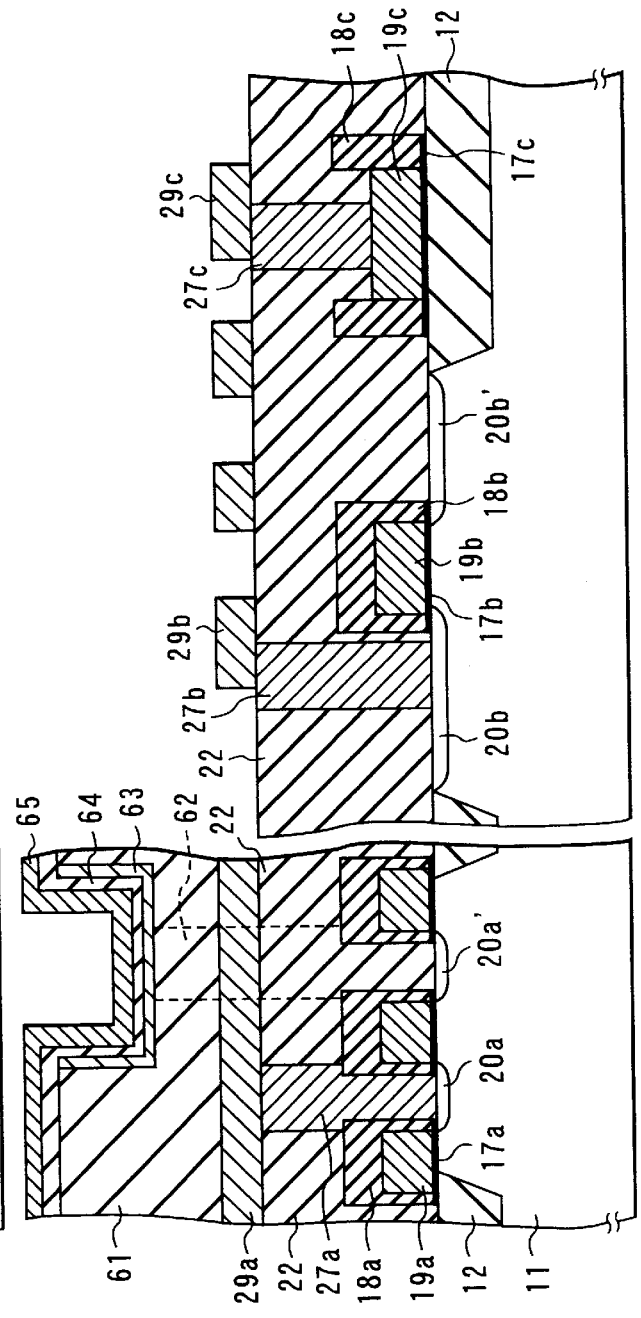
FIG. 4E
FIG. 4F

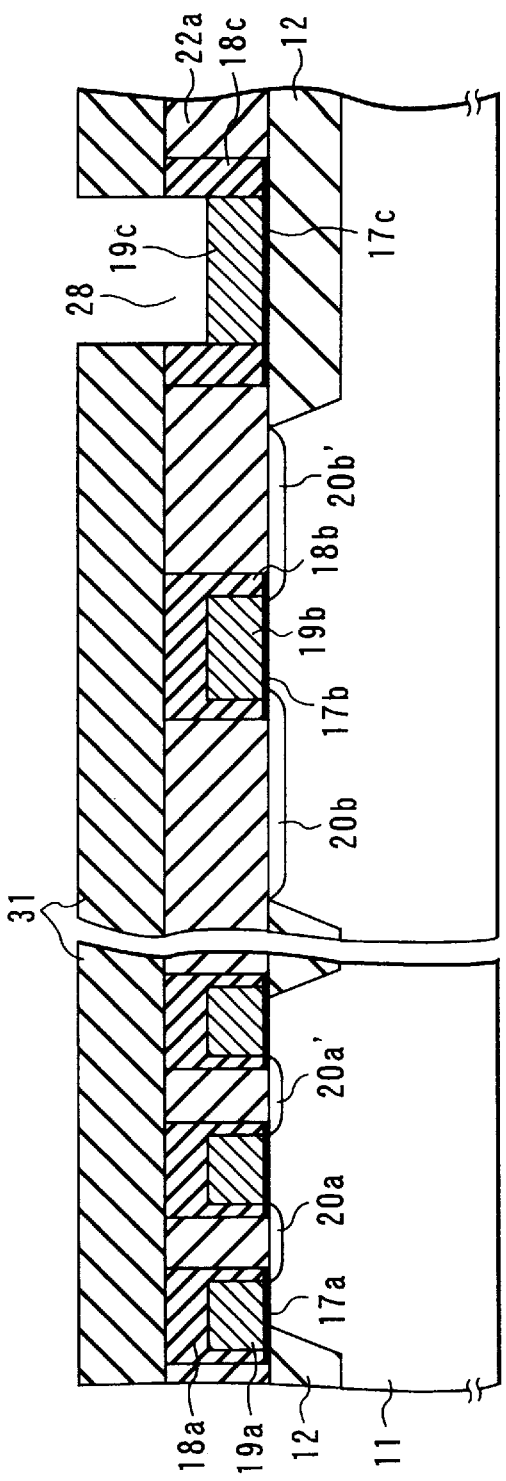
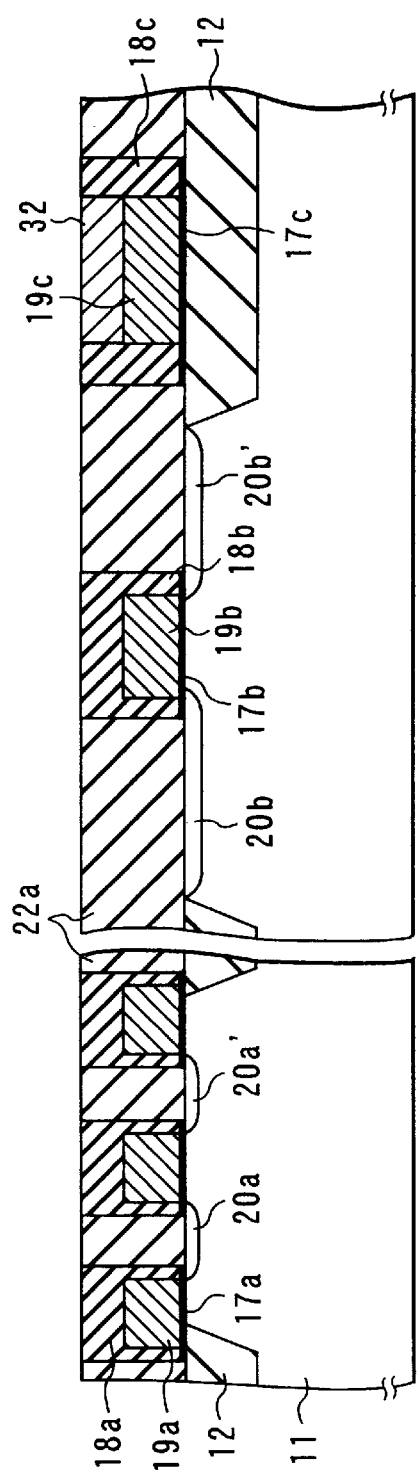
FIG. 5A
FIG. 5B

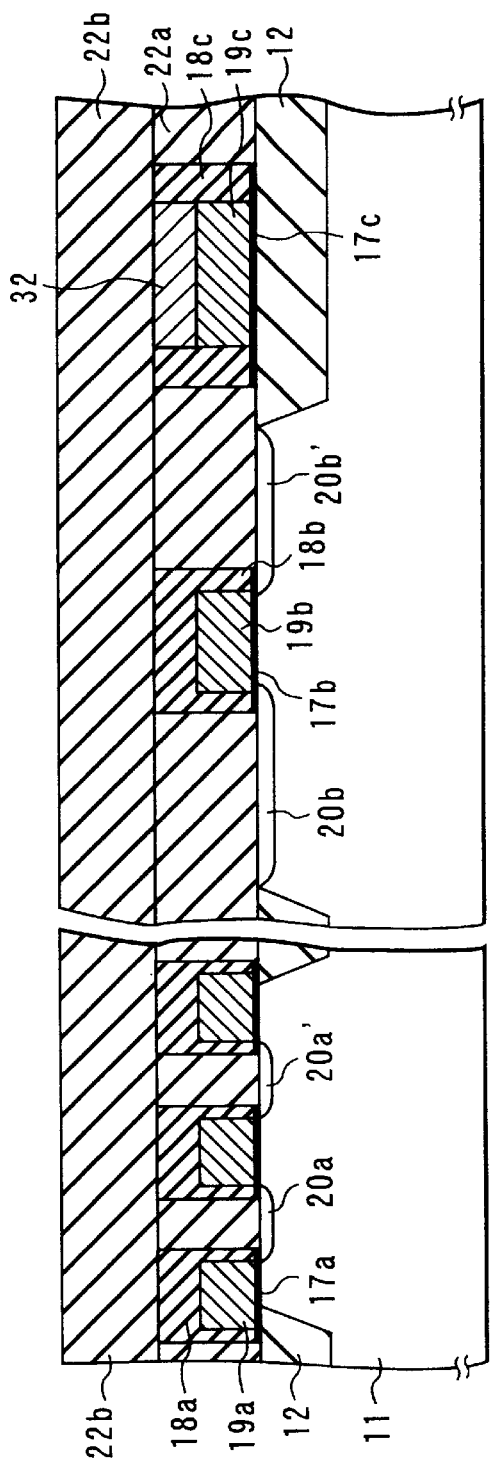
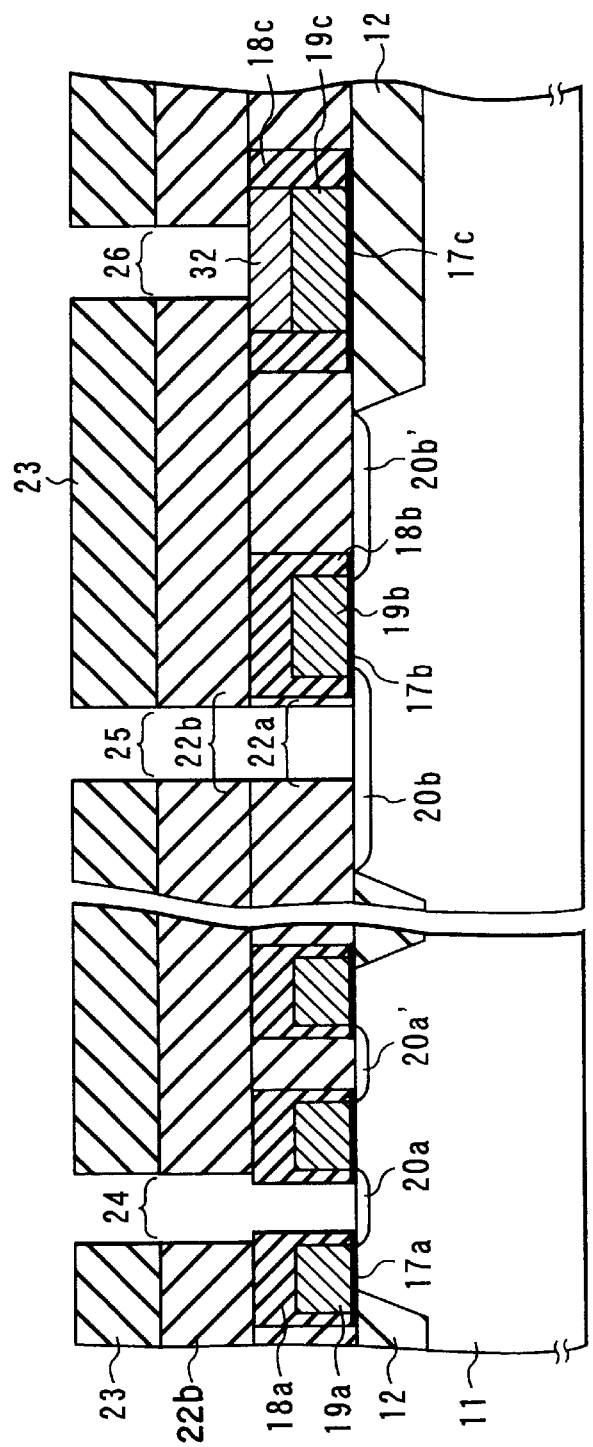
FIG. 5C
FIG. 5D

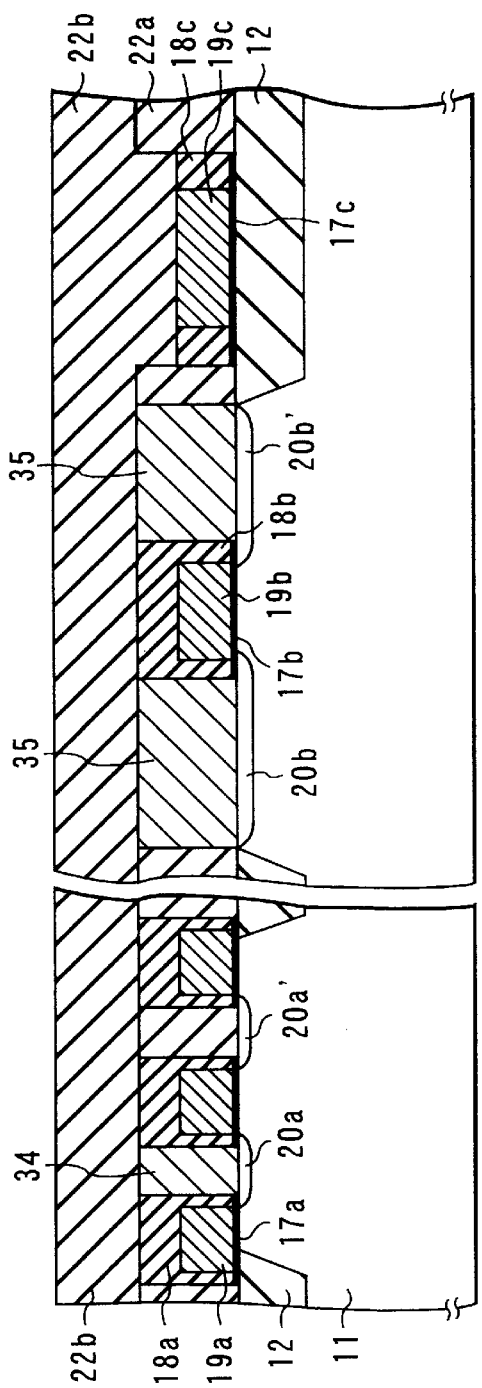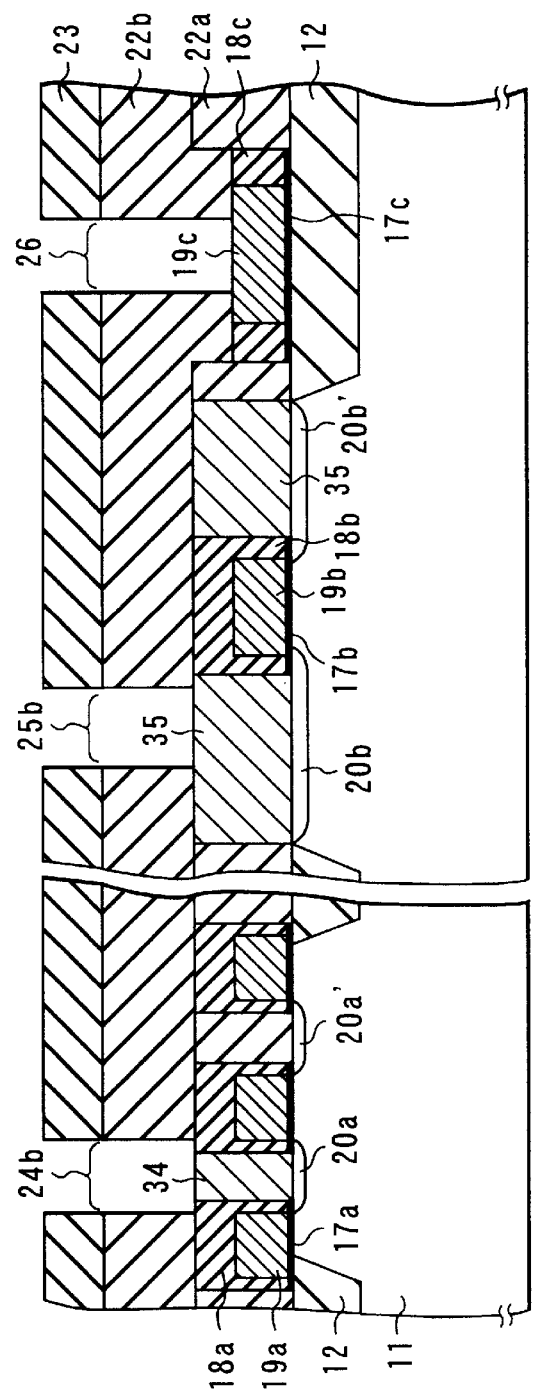
FIG. 6E
FIG. 6F

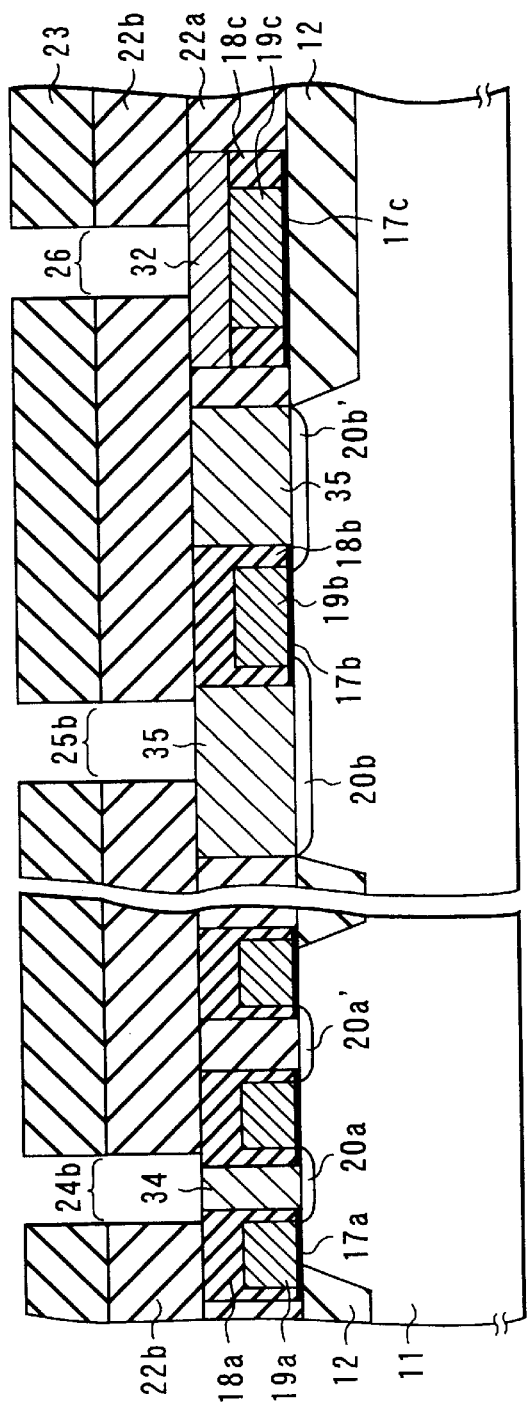
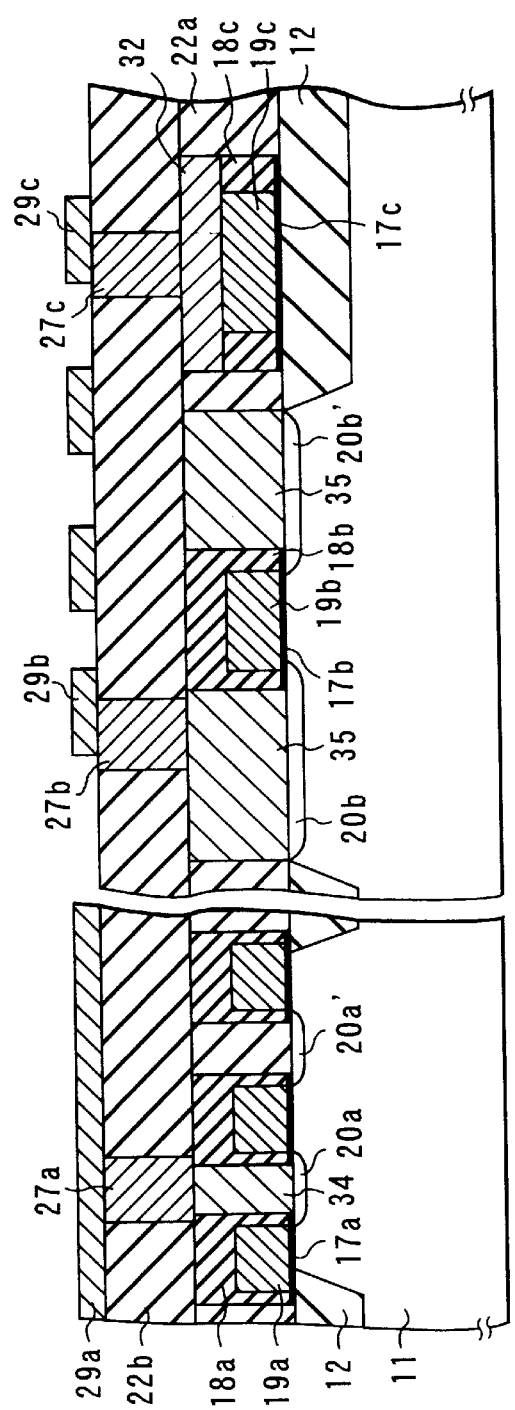
FIG. 7C
FIG. 7D

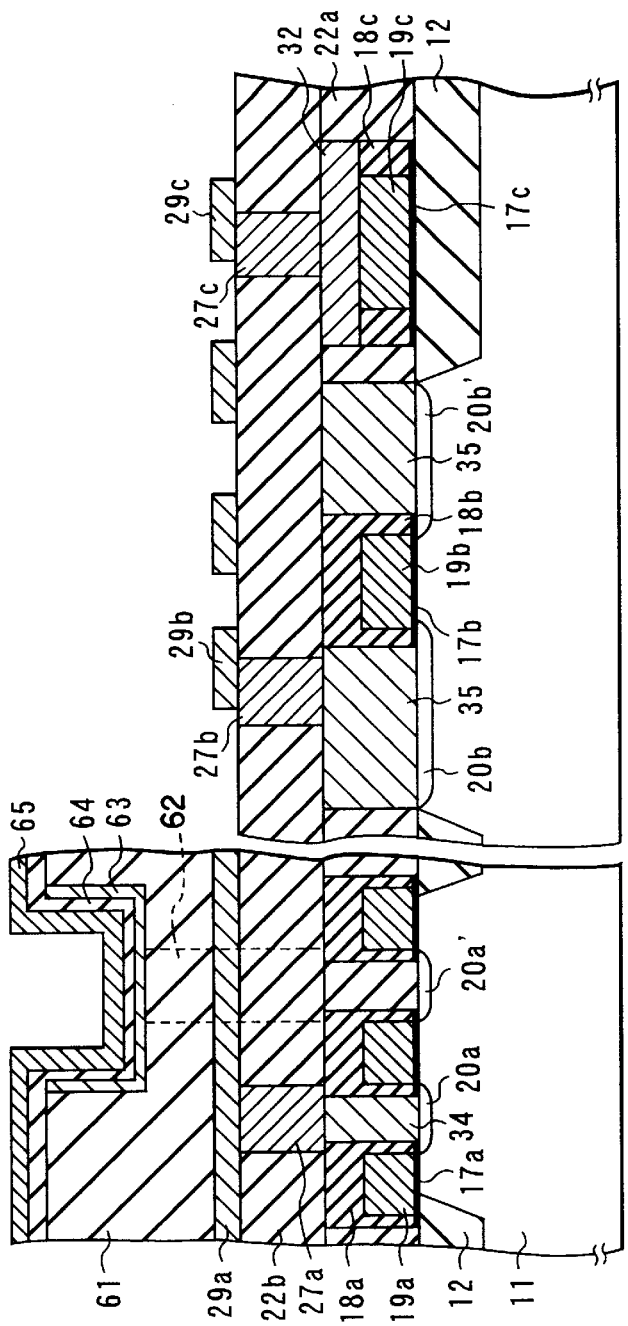
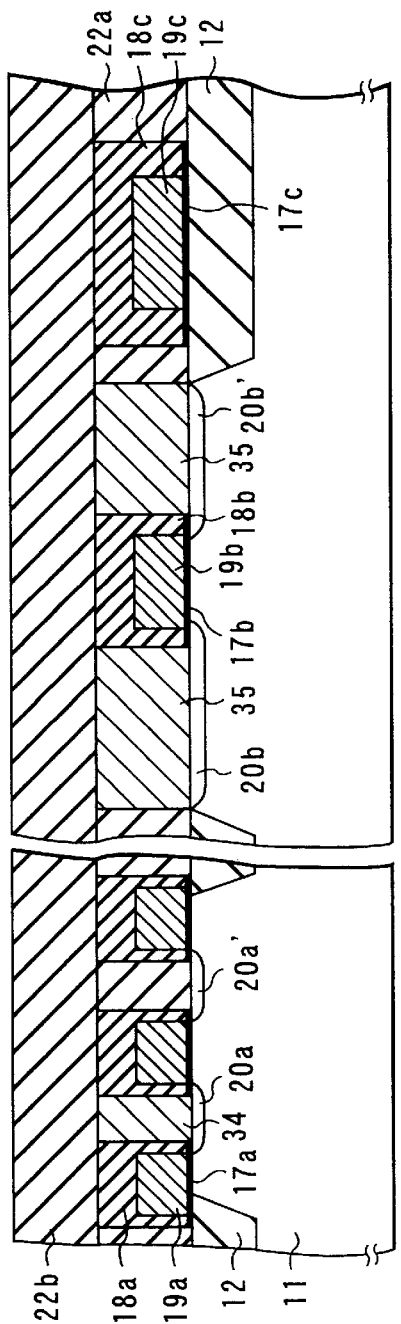
FIG. 7E
FIG. 8A

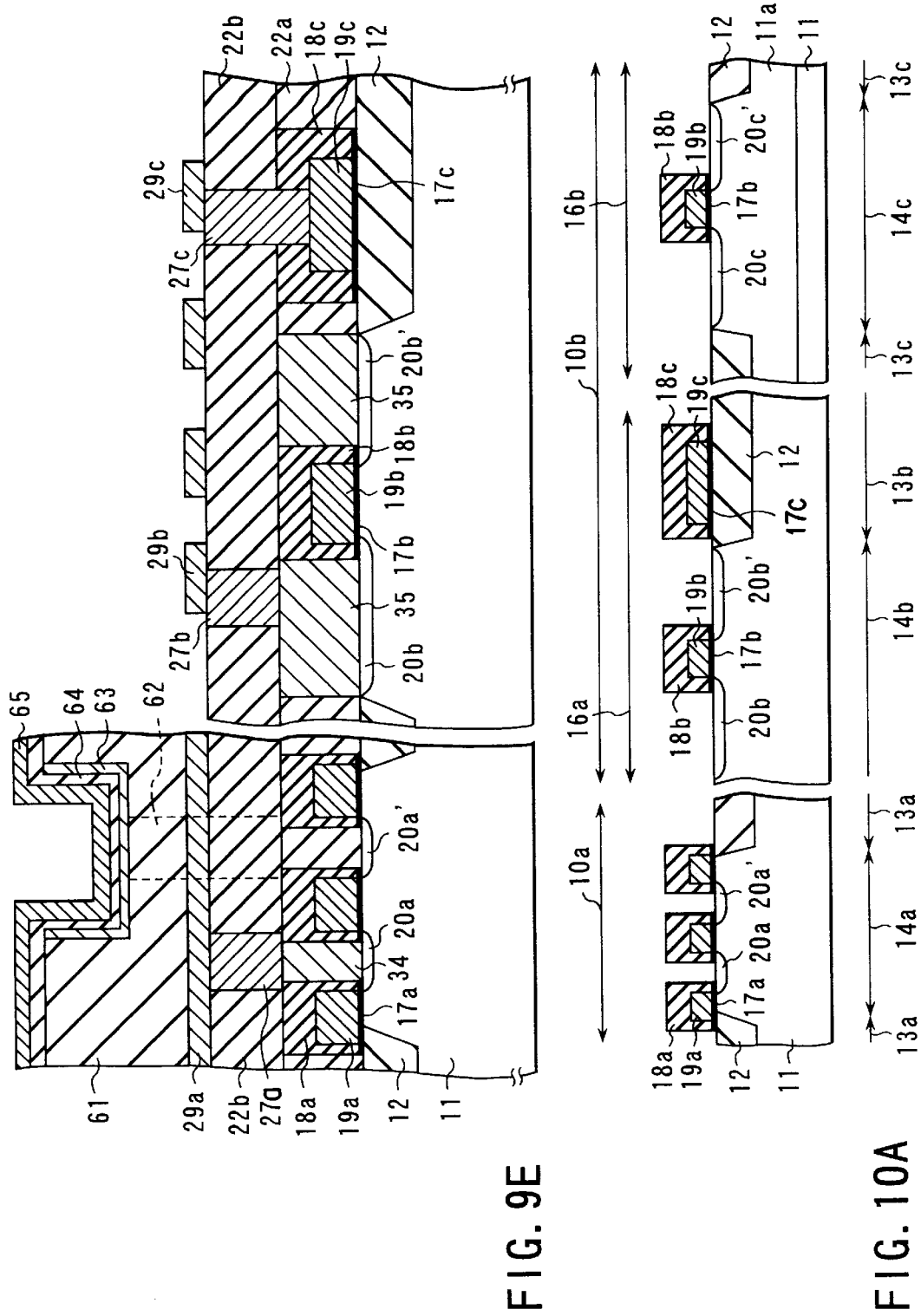

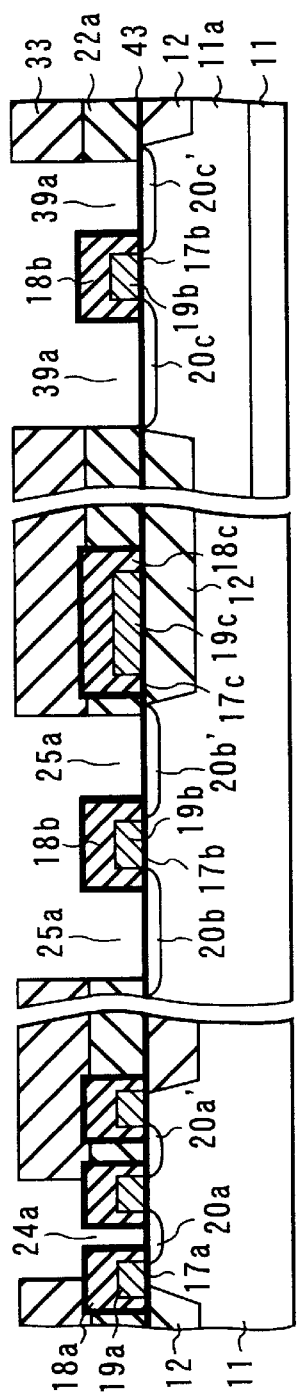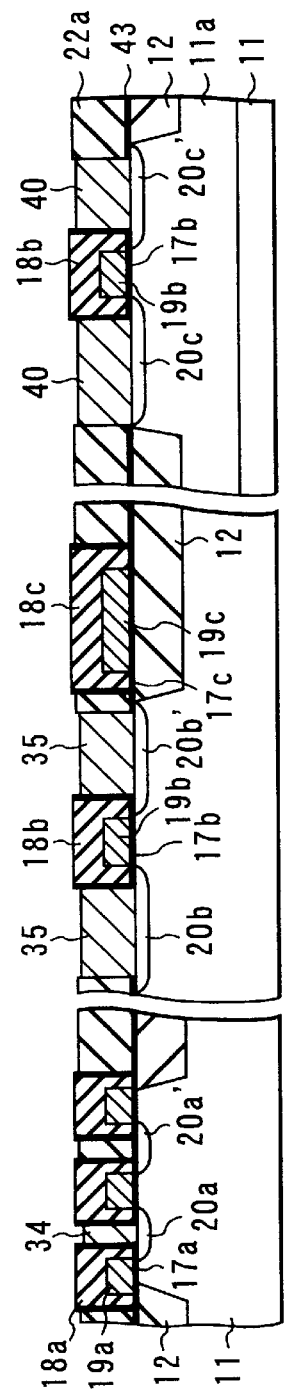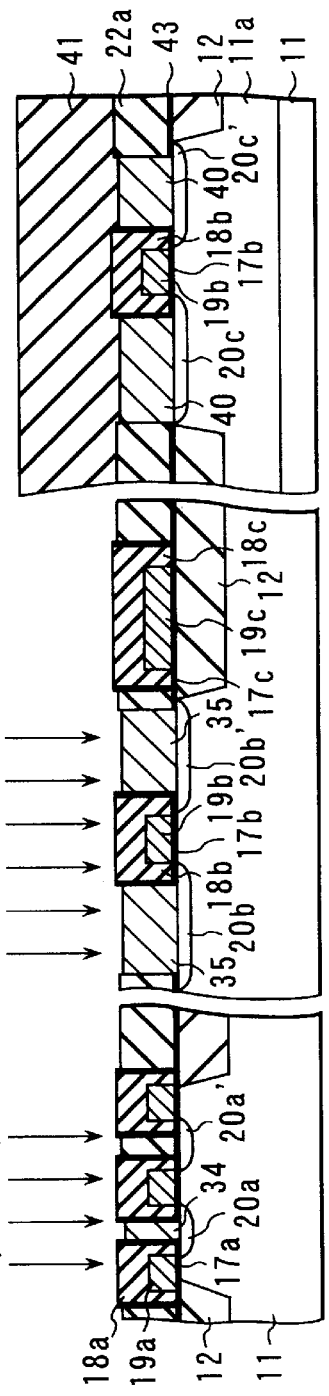
FIG. 11D
FIG. 11E
FIG. 11F

SEMICONDUCTOR DEVICE ADOPTING A SELF-ALIGNED CONTACT STRUCTURE AND METHOD FOR MANUFACTURING A SEMICONDUCTOR MEMORY DEVICE

BACKGROUND OF THE INVENTION

The present invention relates to a semiconductor device and a method for manufacturing a semiconductor memory device and, more specifically, to a DRAM (dynamic random access memory) adopting a self-aligned contact structure.

Recently, in semiconductor memories (semiconductor memory devices) such as a DRAM, a self-aligned contact structure has been adopted more frequently in accordance with a reduction of design rules.

FIG. 1 schematically shows the structure of a prior art DRAM.

The DRAM includes a memory cell section 100a and a peripheral circuit section 100b containing a core circuit section. These sections 100a and 100b are provided on the same semiconductor substrate 101.

In the memory cell section 100a, an element isolating insulation film 102 is formed selectively in a surface area of the semiconductor substrate 101, and an element region is delimited by an element isolation region. A plurality of gate electrodes 105a (three gate electrodes in this prior art case) are each provided on the element region with a gate insulation film 103a interposed therebetween. The top surface of each of the gate electrodes 105a is covered with an insulation film 104a and the sides thereof are protected thereby.

An interlayer insulation film 106 is provided almost all over the resultant structure so as to fill a space between adjacent gate electrodes 105a. A bit-line contact 107a is formed in the interlayer insulation film 106, and one of source and drain diffusion regions 108a is connected to a bit line 109a through the bit-line contact 107a.

An interlayer insulation film 110 is formed on the bit line 109a, and a stacked capacitor including a storage electrode 111, an insulation film 112 and a plate electrode 113 is formed on the film 110. The storage electrode 111 is connected to the other of source and drain diffusion regions 108a' through a plug portion 114.

In the peripheral circuit section 100b, an element isolating insulation film 102 is formed selectively in a surface area of the semiconductor substrate 101, and an element region is delimited by an element isolation region. A gate electrode 105a is provided on the element region with a gate insulation film 103b interposed therebetween. The top surface of the gate electrode 105a is covered with an insulation film 104b and the sides thereof are protected thereby.

Further, in the element isolation region, an on-field gate electrode 105c is provided on the element isolating insulation film 102 with a gate insulation film 103c interposed therebetween. The top surface of the gate electrode 105c is covered with an insulation film 104c and the sides thereof are protected thereby.

The interlayer insulation film 106 is provided almost all over the resultant structure so as to fill a space between the gate electrodes 105b and 105c. An active contact 107b is formed in the interlayer insulation film 106, and one of source and drain diffusion regions 108b is connected to a wiring 109b having the same level as that of the bit line 109a through the active contact 107b.

A gate contact 107c is formed in the interlayer insulation film 106 and insulation film 104c, and the on-field gate electrode 105c is connected to a wiring 109c having the same level as that of the bit line 109 through the gate contact 107c.

In the DRAM so constituted, the bit-line contact 107a in the memory cell section 100a is formed in self-alignment with the gate electrodes 105a and usually filled with polysilicon which is advantageous to filling of a very small hole (a so-called self-aligned contact structure).

Since, in contrast, the peripheral circuit section 100b necessitates a low-resistance contact, metal such as tungsten is generally employed to fill the active contact 107b and gate contact 107c.

According to the self-aligned contact structure, the gate electrodes 105a are covered with the insulation films 104a such as SiN, and the films 104a stop etching to form a very small contact while keeping insulating properties between the bit-line contact 107a and gate electrodes 105a.

However, the foregoing prior art DRAM adopting the self-aligned contact structure has the problem that the bit-line contact 107a and active contract 107b connected to the semiconductor substrate 101 (properly speaking, connected to the source and drain diffusion layers 108a and 108b) and the gate contact 107c formed on the on-field gate electrode 105c, cannot be formed simultaneously using a single mask.

FIGS. 2A to 2F schematically show a process of manufacturing the prior art DRAM described above.

First, as illustrated in FIG. 2A, element isolating insulation films 102 are formed selectively in surface areas of a semiconductor substrate 101 to delimit element regions in a memory cell section 100a and a peripheral circuit section 100b. In the memory cell section 100a, gate electrodes 105a are each formed on the element region with a gate insulation film 103a interposed therebetween. The top surface of each of the gate electrodes 105a is covered with an insulation film 104a and the sides thereof are protected thereby. In the peripheral circuit section 100b, a gate electrode 105b is formed on the element region with a gate insulation film 103b interposed therebetween, and the top surface of the gate electrode 105b is covered with an insulation film 104b and the sides thereof are protected thereby.

Simultaneously, an on-field gate electrode 105c is formed on the element isolating insulation film 102 in the peripheral circuit section 100b with a gate insulation film 103c interposed therebetween., The top surface of the on-field gate electrode 105c is covered with an insulation film 104c and the sides thereof are protected thereby.

After that, impurities are ion-implanted into the surface areas of the semiconductor substrate 101 to form source and drain diffusion layers 108a and 108a' in the memory cell section 10a and source and drain diffusion layers 108b and 108b' in the peripheral circuit section 100b.

Then, as illustrated in FIG. 2B, an interlayer insulation film 106 is formed thick almost all over the semiconductor substrate 101 so as to fill a space between adjacent gate electrodes 105a, 105b and 105c. The top surface of the interlayer insulation film 106 is flattened by CMP (chemical mechanical polishing) or the like.

As shown in FIG. 2C, a resist pattern (first mask) 121 is formed on the interlayer insulation film 106. Using this resist pattern as a mask, the interlayer insulation film 106 is etched to form a contact hole 122, which reaches one of the source and drain diffusion regions 108a, in self-alignment with the gate electrodes 105a.

In FIG. 2D, the resist pattern 121 is removed and then conductive materials (e.g., polysilicon) are buried into only the contact hole 122 to form a bit-line contact 107a in the memory cell section 100a.

A resist pattern (second mask) 123 is formed on the interlayer insulation film 106. Using this pattern as a mask, the interlayer insulation film 106 is etched to form a contact hole 124, which reaches one of the source and drain diffusion regions 108b, in self-alignment with the gate electrode 105b.

Next, as illustrated in FIG. 2E, the resist pattern 123 is removed and then metal (e.g., tungsten) is buried into only the contact hole 124 to form an active contact 107b in the peripheral circuit section 100b.

A resist pattern (third mask) 125 is formed on the interlayer insulation film 106. Using this pattern, the interlayer insulation film 106 and insulation film 104c are etched to form a contact hole 126 which reaches the on-field gate electrode 105c.

Referring to FIG. 2F, the resist pattern 125 is removed and then metal (e.g., tungsten) is buried into only the contact hole 126 to form a gate contact 107c on the on-field gate electrode 105c.

A tungsten wiring is patterned on the interlayer insulation film 106 to form a bit line 109a connected to the bit-line contact 107a of the memory cell section 100a, a wiring 109b connected to the active contact 107b of the peripheral circuit section 100b, and a wiring 109c connected to the gate contact 107c on the on-field gate electrode 105c.

After that, in the memory cell section 100a, an interlayer insulation film 110 is formed, and a plug portion 114, which is connected to the other of the source and drain diffusion layers 108a', is formed through the interlayer insulation films 110 and 106. A storage electrode 111, a capacitor insulation film 112 and a plate electrode 113 are formed in the surface area of the interlayer insulation film 110 to constitute a stacked capacitor communicating with the plug portion 114. The DRAM having the structure shown in FIG. 1 is thus obtained.

As described above, in the prior art DRAM, the insulation film 104c on the on-field gate electrode 105c has to be eliminated at the same time when the contact hole 126 is made in order to form the gate contact 107c on the electrode 105c. For this reason, both the formation of the contact hole 126 and that of the contact holes 122 and 124 cannot be performed at the same time, the contact holes 122 and 124 being made by the self-aligned contact technique in which the insulation films 104a and 104b stop etching to form a contact.

Assume that, when the contact holes 124 and 126 are formed simultaneously using a single mask, a mask misalignment is caused to shift the opening position of the contact hole 124 toward the gate electrode 105b. In this case, the insulation film 104b covering the gate electrode 105b will also be etched in accordance with the mask misalignment.

When the insulation film 104b is so etched that the gate electrode 105b is exposed because of excessive mask misalignment, no contact-to-gate insulating properties can be maintained and accordingly the gate electrode 105b and active contact 107b are short-circuited with each other.

Especially, in a DRAM having a storage capacitor of about 1GB, a distance between a gate electrode and a contact formed on one of source and drain diffusion layers in the peripheral circuit section is about 0.1 μm. The mask misalignment in a direction approaching the gate electrode makes the distance much smaller.

In manufacturing such a prior art DRAM, the gate contact 107c of the peripheral circuit section 100b, the bit-line contact 107a of the memory cell section 100a, or the active contact 107b of the peripheral circuit section 100b cannot be formed at once, and at least two types of masks are required to form a contact below the first-layered wiring layer. Consequently, the prior art DRAM has the drawbacks that not only the number of manufacturing steps is increased but also a yield against a short circuit between the wiring layer and contact is difficult to improve.

BRIEF SUMMARY OF THE INVENTION

An object of the present invention is to provide a semiconductor device favorably used in a DRAM adopting a self-aligned contact structure and a method for manufacturing a semiconductor memory device.

More specifically, an object of the present invention is to provide a semiconductor device capable of reducing a number of manufacturing steps by simultaneously forming contacts below a first-layered wiring layer using a single mask, and a method for manufacturing a semiconductor memory device capable of doing the same.

Otherwise, an object of the present invention is to provide a semiconductor device capable of improving a yield against a short circuit between a wiring layer and a contact, and a method for manufacturing a semiconductor memory device.

To attain the above objects, according to a first aspect of the present invention, there is provided a semiconductor device comprising a semiconductor substrate, an element isolating insulation film selectively provided in a surface area of the semiconductor substrate, at least one first electrode layer formed on a surface of the semiconductor substrate, which corresponds to an element region delimited by the element isolating insulation film, with a first insulation film interposed therebetween, the first electrode layer having a top and a side both covered with a second insulation film, a diffusion layer formed in a surface area of the semiconductor substrate and adjacent to the first electrode layer, a second electrode layer formed on the element isolating insulation film corresponding to an element isolation region, and having a top and a side both covered with a second insulation film having an opening portion of predetermined size, an interlayer insulation film provided almost all over the semiconductor substrate so as to fill a space between the electrode layers, a substrate contact formed in the interlayer insulation film in self-alignment with the first electrode layer and connected to the diffusion layer, and an electrode contact formed in the interlayer insulation film simultaneously with the substrate contact and connected the second electrode layer through the opening portion of the second insulation film.

According to a second aspect of the present invention, there is provided a semiconductor device comprising a semiconductor substrate, an element isolating insulation film selectively provided in a surface area of the semiconductor substrate, at least one first electrode layer formed on a surface of the semiconductor substrate, which corresponds to an element region delimited by the element isolating insulation film, with a first insulation film interposed therebetween, the first electrode layer having a top and a side both covered with a second insulation film, a diffusion layer formed in a surface area of the semiconductor substrate and adjacent to the first electrode layer, a second electrode layer formed on the element isolating insulation film corresponding to an element isolation region, and having a top and a side both covered with a second insulation film having an opening portion of predetermined size, a first interlayer insulation film provided substantially flush with the electrode layers so as to fill a space between the electrode layers, a side-wall layer formed on a side wall of a contact hole provided in the first interlayer insulation film in self-alignment with the second electrode layer, a connection electrode buried into the contact hole and connected to the diffusion layer through the side-wall layer, a second interlayer insulation film provided on the first interlayer insulation film so as to bury the connection electrode, a first contact formed in the second interlayer insulation film and connected to the connection electrode, and a second contact formed in the second interlayer insulation film simultaneously with the first contact and connected to the first electrode layer through the opening portion of the second insulation film.

According to a third aspect of the present invention, there is provided a method of manufacturing a semiconductor memory device in which a memory cell section and a peripheral circuit section including a core circuit section are provided on a semiconductor substrate, the method comprising the steps of forming each of a plurality of first electrode layers on an element region on the semiconductor substrate with a first insulation film interposed therebetween, each of the first electrode layers having a top and a side both covered with a second insulation film, and forming at least one second electrode layer on an element isolation region on the semiconductor substrate, the second electrode layer having a top and a side both covered with the second insulation film, selectively removing the second insulation film on the second electrode layer to form an opening portion of predetermined size, depositing an interlayer insulation film almost all over the semiconductor substrate, selectively removing the interlayer insulation film using a single mask so as to leave the second insulation film, and simultaneously forming a substrate contact hole reaching the semiconductor substrate and an electrode contact hole reaching the second electrode layer through the opening portion, and filling the substrate contact hole and the electrode contact hole with conductive materials to form a contact connected to the semiconductor substrate and the second electrode layer.

According to a fourth aspect of the present invention, there is provided a method of manufacturing a semiconductor memory device in which a memory cell section and a peripheral circuit section including a core circuit section are provided on a semiconductor substrate, the method comprising the steps of forming each of a plurality of first electrode layers on an element region on the semiconductor substrate with a first insulation film interposed therebetween, each of the first electrode layers having a top and a side both covered with a second insulation film, and forming at least one second electrode layer on an element isolation region on the semiconductor substrate, the second electrode layer having a top and a side both covered with the second insulation film, depositing a first interlayer insulation film almost all over the semiconductor substrate, etching back the first interlayer insulation film to expose a top surface of the second insulation film, selectively removing the second insulation film on the second electrode layer to form an opening portion of predetermined size, filling the opening portion with electrode materials, depositing a second interlayer insulation film almost all over the semiconductor substrate, selectively removing the first and second interlayer insulation films using a single mask so as to leave the second insulation film, and simultaneously forming a substrate contact hole reaching the semiconductor substrate and an electrode contact hole reaching the electrode materials, and filling the substrate contact hole and the electrode contact hole with conductive materials to form a contact connected to the semiconductor substrate and the electrode materials.

According to a fifth aspect of the present invention, there is provided a method of manufacturing a semiconductor memory device in which a memory cell section and a peripheral circuit section including a core circuit section are provided on a semiconductor substrate, the method comprising the steps of, forming each of a plurality of first electrode layers on an element region on the semiconductor substrate with a first insulation film interposed therebetween, each of the first electrode layers having a top and a side both covered with a second insulation film, and forming at least one second electrode layer on an element isolation region on the semiconductor substrate, the second electrode layer having a top and a side both covered with the second insulation film, depositing a first interlayer insulation film almost all over the semiconductor substrate, etching back the first interlayer insulation film to expose a top surface of the second insulation film, selectively removing the first interlayer insulation film so as to leave the second insulation film to form a substrate contact hole reaching the semiconductor substrate, filling the substrate contact hole with conductive materials to form a connection electrode, selectively removing the second insulation film on the second electrode layer to form an opening portion of predetermined size, depositing a second interlayer insulation film almost all over the semiconductor substrate, selectively removing the second interlayer insulation film using a single mask so as to leave the second insulation film, and simultaneously forming an electrode contact hole reaching the connection electrode and an electrode contact hole reaching the second electrode layer through the opening portion, and filling each of the electrode contact holes with conductive materials to form a contact connected to the connection electrode and the second electrode layer.

According to a sixth aspect of the present invention, there is provided a method of manufacturing a semiconductor memory device in which a memory cell section and a peripheral circuit section including a core circuit section are provided on a semiconductor substrate, the method comprising the steps of forming each of a plurality of first electrode layers on an element region on the semiconductor substrate with a first insulation film interposed therebetween, each of the first electrode layers having a top and a side both covered with a second insulation film, and forming at least one second electrode layer on an element isolation region on the semiconductor substrate, the second electrode layer having a top and a side both covered with the second insulation film, depositing a first interlayer insulation film almost all over the semiconductor substrate, etching back the first interlayer insulation film to expose a top surface of the second insulation film, selectively removing the first interlayer insulation film so as to leave the second insulation film to form a substrate contact hole reaching the semiconductor substrate, filling the substrate contact hole with conductive materials to form a connection electrode, depositing a second interlayer insulation film almost all over the semiconductor substrate, selectively removing the second interlayer insulation film using a single mask so as to leave the second insulation film, and simultaneously forming an electrode contact hole reaching the connection electrode and a first contact hole reaching the second insulation film on the second electrode layer, selectively removing the second insulation film exposed to the first contact hole and forming a second contact hole reaching the second electrode layer, and filling the electrode contact hole and each of the first and second contact holes with conductive materials to form a contact connected to the connection electrode and the second electrode layer.

In the foregoing semiconductor device and method for manufacturing a semiconductor memory device, contact holes for a bit-line contact and an active contact and a contact hole for a gate contact can be formed simultaneously using a single mask. These contacts can thus be formed in the same layer and a misalignment of a mask for lithography used to form a wiring layer with each of the contacts can be minimized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A to 2F are cross-sectional views schematically showing steps of manufacturing the prior art DRAM of FIG. 1;

FIG. 3A is a schematic plan view taken along line 3A—3A of FIG. 3B and showing a major part of the constitution of a stacked type DRAM according to a first embodiment of the present invention, FIG. 3B is a schematic cross-sectional view taken along line 3B—3B of FIG. 3A, and FIG. 3C is also a schematic cross-sectional view taken along line 3C—3C of FIG. 3A;

FIGS. 4A to 4F are cross-sectional views schematically showing steps of manufacturing the stacked type DRAM according to the first embodiment of the present invention;

FIGS. 5A to 5F are cross-sectional views schematically showing steps of manufacturing a stacked type DRAM according to a second embodiment of the present invention;

FIGS. 6A to 6H are cross-sectional views schematically showing steps of manufacturing a stacked type DRAM according to a third embodiment of the present invention;

FIGS. 7A to 7E are cross-sectional views schematically showing steps of manufacturing a stacked type DRAM according to a fourth embodiment of the present invention;

FIGS. 8A to 8E are cross-sectional views schematically showing steps of manufacturing a stacked type DRAM according to a fifth embodiment of the present invention;

FIGS. 9A to 9E are cross-sectional views schematically showing steps of manufacturing a stacked type DRAM according to a sixth embodiment of the present invention;

FIGS. 10A to 10H are cross-sectional views schematically showing a DRAM of the pre sen t invention to explain a method for forming a connection electrode;

FIGS. 11A to 11H are cross-sectional views schematically showing a DRAM of the present invention to explain another method for forming a connection electrode;

DETAILED DESCRIPTION OF THE INVENTION

Figure 1:
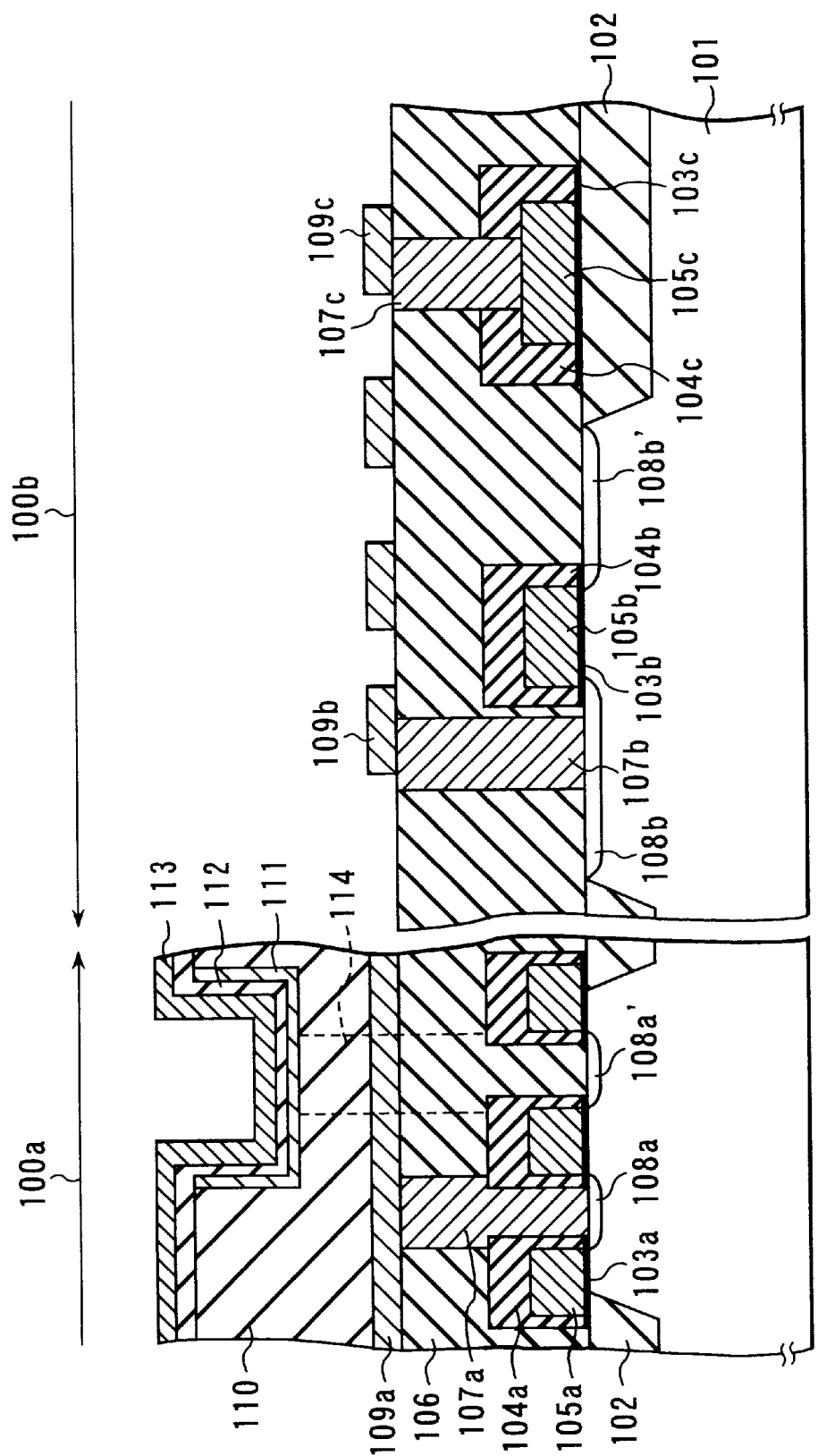
FIG. 1 is a cross-sectional view schematically showing a major part of the constitution of a prior art DRAM.
Figure 2C:
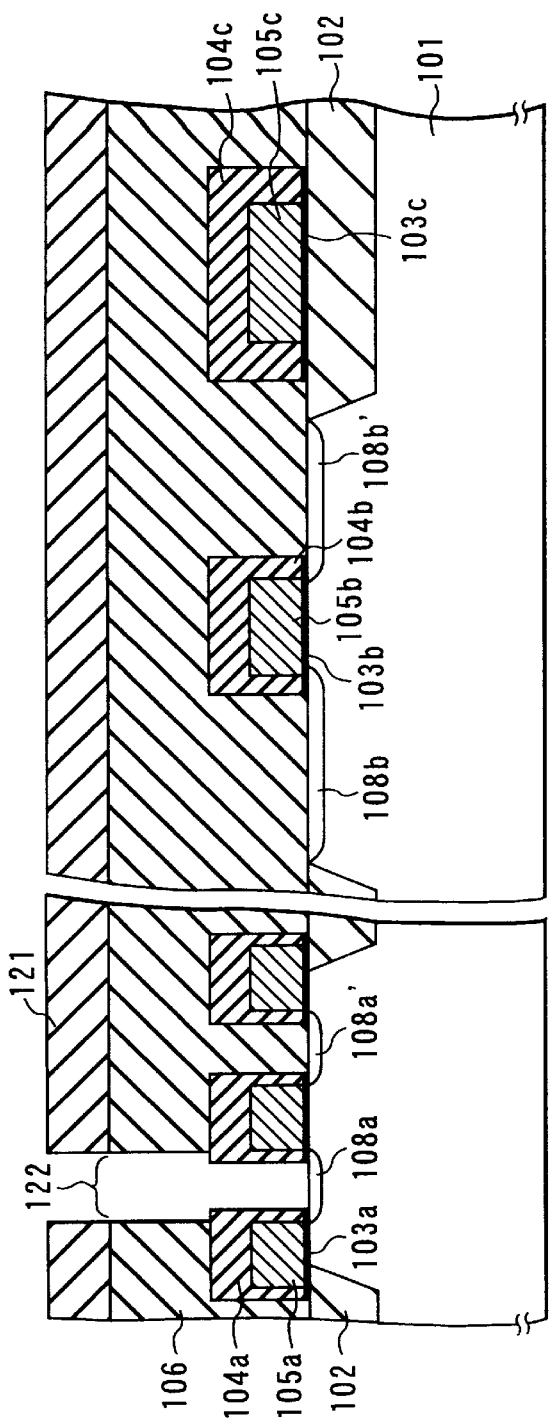
Figure 2D:
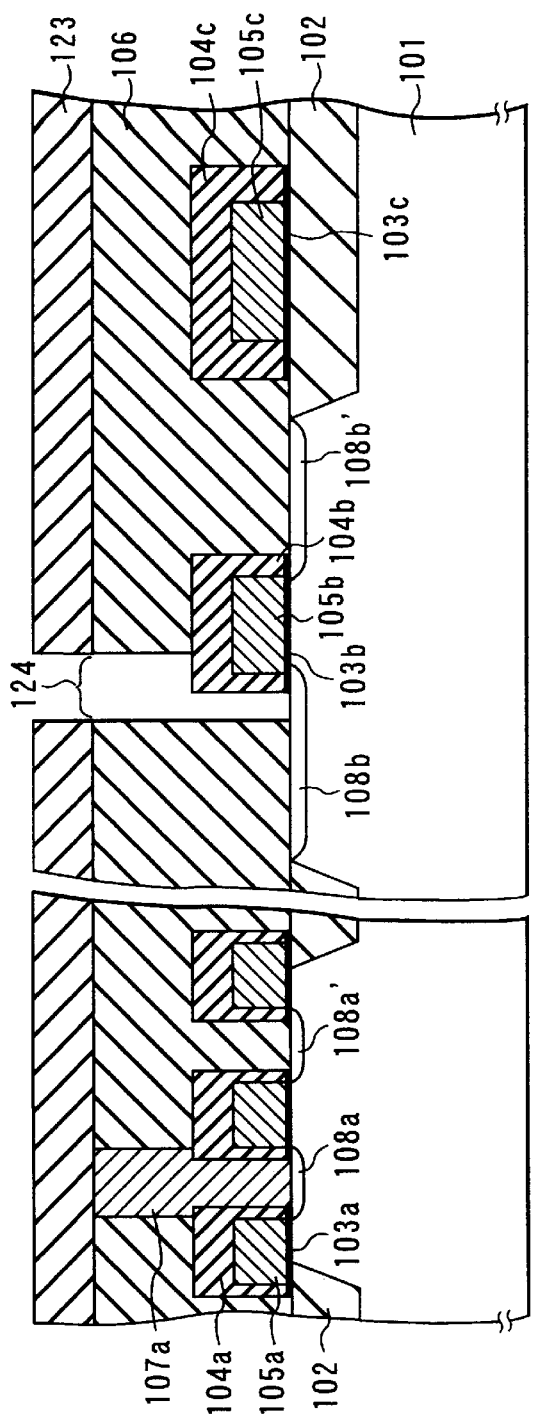

Embodiments of the present invention will now be described with reference to the accompanying drawings.

(First Embodiment)

FIGS. 3A to 3C schematically show a major part of the constitution of a stacked type DRAM according to a first embodiment of the present invention. FIG. 3A is a schematic plan view taken along line 3A—3A of FIG. 3B and showing the inside of the DRAM, FIG. 3B is a schematic cross-sectional view taken along line 3B—3B of FIG. 3A, and FIG. 3C is also a schematic cross-sectional view taken along line 3C—3C of FIG. 3A.

The DRAM is so constituted that a memory cell section 10a and a peripheral circuit section 10b including a core circuit section (only the NMOS transistor section is shown) are provided on the same P-type silicon substrate (semiconductor substrate) 11.

In the memory cell section 10a, an element isolating insulation film 12 is formed selectively in a surface area of the P-type silicon substrate 11, and a plurality (three in this embodiment) of gate electrodes (first electrode layers) 19a are each provided on an element region 14a, which is delimited by an element isolation region 13a, with a gate insulation film (first insulation film) 17a interposed therebetween. The top of each of the gate electrodes 19a is covered with an insulation film (second insulation film) 18a and the sides thereof are protected thereby.

An interlayer insulation film 22 is formed thick almost all over the substrate 11 so as to fill a space between adjacent gate electrodes 19a. A bit-line contact (substrate contact) 27a is formed in the interlayer insulation film 22, and one of source and drain diffusion layers (diffusion regions) 20a is connected to a bit line (wiring layer) 29a through the bit-line contact 27a.

Though not shown in FIGS. 3A to 3C, a stacked capacitor including a storage electrode, a capacitor insulation film and a plate electrode is formed on the interlayer insulation film, and the storage electrode of the capacitor is connected to the other of source and drain diffusion layers 20a' via a plug portion.

In the peripheral circuit section 10b, an element isolating insulation film 12 is formed selectively in a surface area of the P-type silicon substrate 11, and a gate electrode (second electrode layer) 19b is provided on an element region 14b, which is delimited by an element isolation region 13b, with a gate insulation film (first insulation film) 17b interposed therebetween. The top of the gate electrode 19b is covered with an insulation film (second insulation film) 18b and the sides thereof are protected thereby.

An on-field gate electrode (electrode layer) 19c is also provided on the element isolating insulation film 12 in the element isolation region 13b with a gate insulation film (first insulation film) 17c interposed therebetween. The top of the on-field gate electrode 19c is covered with an insulation film (second insulation film) 18c having an opening portion 28 of predetermined size, and the sides thereof are protected thereby.

The interlayer insulation film 22 is formed thick almost all over the substrate 11 so as to fill a space between the gate electrodes 19b and 19c. An active contact (substrate contact) 27b is formed in the interlayer insulation film 22, and one of source and drain diffusion layers (diffusion regions) 20b is connected to a wiring (wiring layer) 29b having the same level as that of the bit line 29a, through the active contact 27b.

Moreover, a gate contact (electrode contact) 27c is formed in the interlayer insulation film 22 so as to fill the opening portion 28 of the insulation film 18c, and the on-field gate electrode 19c is connected to a wiring (wiring layer) 29c having the same level as that of the bit line 29a, through the gate contact 27c.

Referring to FIGS. 4A to 4F, a method for manufacturing a DRAM having the above constitution will now be described briefly.

First, as illustrated in FIG. 4A, an element isolating insulation film 12 is formed selectively in a surface area of a P-type silicon substrate 11, and element isolation regions 13a and 13b and element regions 14a and 14b are formed such that their surfaces are substantially flush with each other. Gate electrodes 19a are each formed on the element region 14a in the memory cell section 10a with a gate insulation film 17a of SiN interposed therebetween. The top and sides of each of the gate electrodes 19a are covered with an insulation film 18a. A gate electrode 19b is formed on the element region 14b in the peripheral circuit section 10b with a gate insulation film 17b of SiN interposed therebetween. The top and sides of the gate electrode 19b are covered with an insulation film 18b.

Simultaneously an on-field gate electrode 19c is formed on the element isolating insulation film 12 in the element isolation region 13b of the peripheral circuit section 10b with a gate insulation film 17c interposed therebetween. The top and sides of the on-field gate electrode 19c are covered with an insulation film 18c.

After that, N-type impurities are ion-implanted into surface areas of the P-type silicon substrate 11 and thermally diffused therein to form source and drain diffusion layers 20a and 20a' in the memory cell section 10a and source and drain diffusion layers 20b and 20b' in the peripheral circuit section 10b.

As shown in FIG. 4B, a resist pattern 21 is formed almost all over the silicon substrate 11 so as to cover the top surface of the on-field gate electrode 19c. Using this resist pattern as a mask, part of the insulation film 18c is selectively removed by etching to form an opening portion 28 through which the top surface of the on-field gate electrode 19c is partly exposed.

Figure 4C:
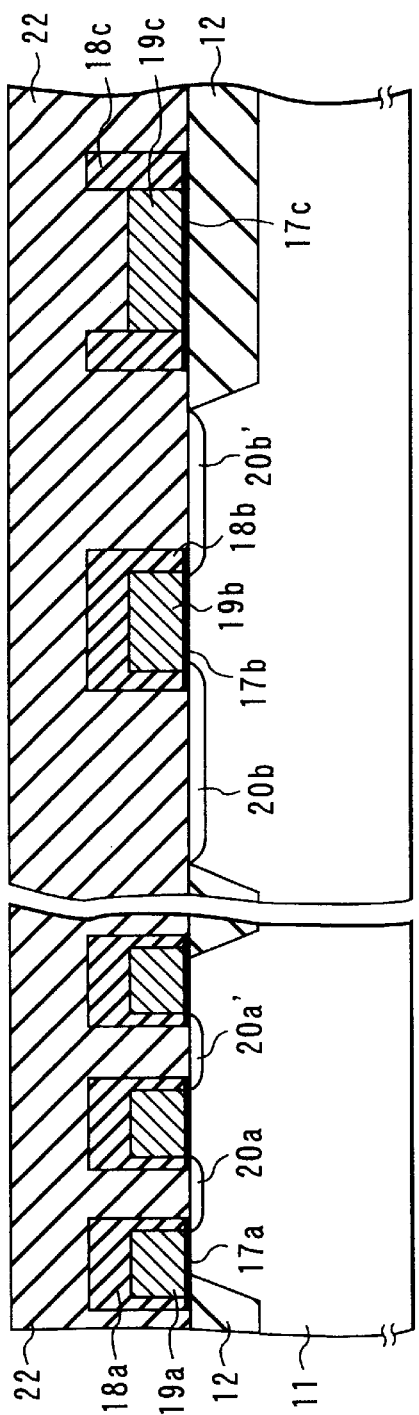

The resist pattern 21 is removed and, as shown in FIG. 4C, an interlayer insulation film 22 is deposited thick so as to fill a space between the gate electrodes 19a, 19b and 19c. The film 22 is then polished by CMP (chemical mechanical polishing) and its top surface is flattened.

Figure 4D:
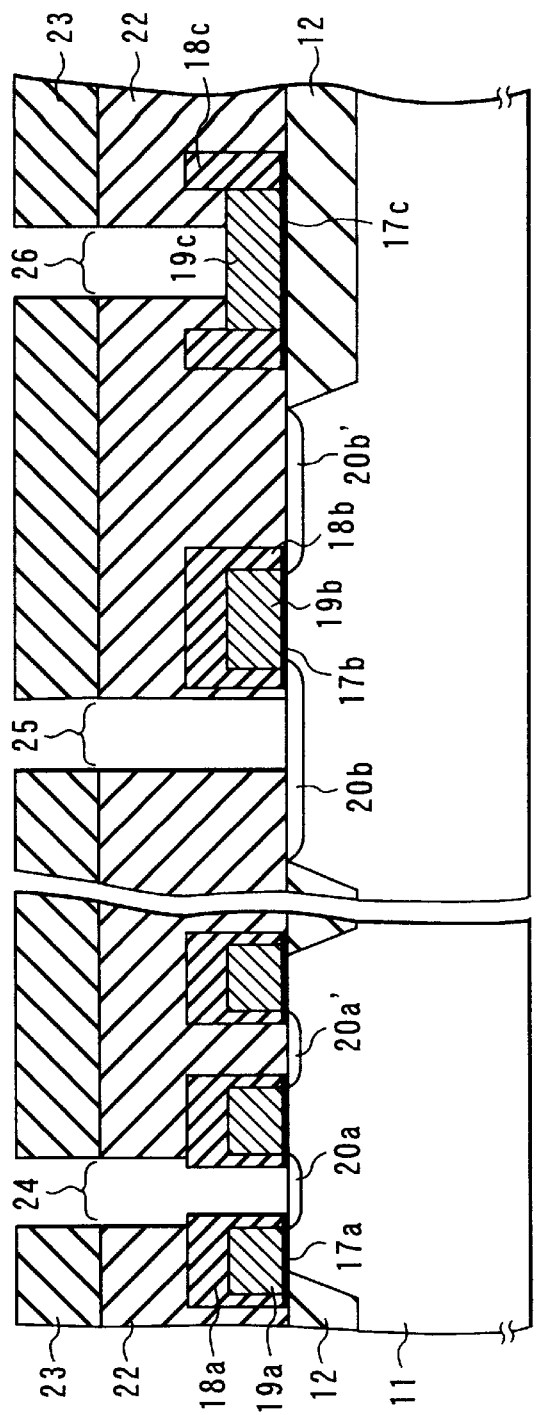

As illustrated in FIG. 4D, a resist pattern 23 is formed on the interlayer insulation film 22. Using this pattern as a mask, the film 22 is etched to simultaneously form a contact hole (substrate contact hole) 24 reaching one of the source and drain diffusion layers 20a, a contact hole (substrate contact hole) 25 reaching one of the source and drain diffusion layers 20b, and a contact hole (electrode contact hole) 26 reaching the on-field gate electrode 19c.

The resist pattern 23 is removed and, as shown in FIG. 4E, conductive materials (e.g., tungsten) are completely buried into only the contact holes 24, 25 and 26 to form a bit-line contact (substrate contact) 27a connected to one of the source and drain diffusion layers 20a of the memory cell section 10a.

At the same time, an active contact (substrate contact) 27a connected to one of the source and drain diffusion layers 20b and a gate contact (electrode contact) 27c connected to the on-field gate electrode 19c, are formed.

After that, in order to form a first-layered wiring layer, a tungsten wiring is patterned on the interlayer insulation film 22 to form a bit line 29a connected to the bit-line contact 27a in the memory cell section 10a, a wiring 29b connected to the active contact 27b in the peripheral circuit section 10b, and a wiring 29c connected to the gate contact 27c therein.

A mask for lithography used to form the first-layered wiring layer can directly be aligned with each of the contacts 27a, 27b and 27c.

After that, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 4F.

According to the above method, the contact holes for forming contacts on the source and drain diffusion layers and the on-field gate electrode, can be formed simultaneously using a single mask.

If that part of the insulation film which is located on the on-field gate electrode and in which a contact hole is to be formed, is removed in advance, the electrode contact on the on-field gate electrode can be considered to be the same self-aligned contact as the substrate contacts of the memory cell section and peripheral circuit section.

Since, therefore, the contact holes under the bit line can be formed simultaneously, the electrode contact on the on-field gate electrode and the substrate contacts in the memory cell section and peripheral circuit section can be formed on the same layer.

Consequently, the number of types of masks used for forming a contact hole can be reduced to one and the manufacturing process can be simplified, though conventionally at least two types of masks were needed.

Furthermore, a short yield between wirings or a yield against a short-circuit between the first-layered wiring layer and each of the contacts, can be improved.

Since, in particular, only the relative position of a mask used for forming a bit line to each of the contacts is important, the mask is aligned with the bit-line contact and thus can be aligned directly with all other contacts. As a result, there is no fear that the respective wirings may be shifted greatly from the active and gate contacts of the peripheral circuit section or only from one of the active and gate contacts.

(Second Embodiment)

FIGS. 5A to 5F illustrate a stacked type DRAM according to a second embodiment of the present invention in order to explain a method of manufacturing the same in brief. The second embodiment is directed to the DRAM of the first embodiment in which a connection electrode is buried into an opening portion formed on an on-field gate electrode from which an insulation film is eliminated.

First, as in the first embodiment, source and drain diffusion layers 20a and 20a' and source and drain diffusion layers 20b and 20b' are formed in a memory cell section 10a and a peripheral circuit section 10b, respectively (see FIG. 4A) and then an interlayer insulation film (first interlayer insulation film) 22a is deposited almost all over a P-type silicon substrate 11 so as to fill a space between gate electrodes 19a, 19b and 19c, as shown in FIG. 5A. The top surface of the interlayer insulation film 22a is flattened by CMP to expose the top surfaces of insulation films 18a, 18b and 18c.

A resist pattern 31 is formed on the surfaces of the interlayer insulation film 22a and insulation films 18a, 18b and 18c so as to cover the surface of the on-field gate electrode 19c. Using the resist pattern 31 as a mask, part of the insulation film 18c is selectively etched using a heated phosphoric acid solution to form an opening portion 28 through which the top surface of the on-field gate electrode 19c is partly exposed.

After the resist pattern 31 is eliminated, electrode materials (e.g., tungsten) are deposited on the entire surface of the resultant structure as shown in FIG. 5B. The top surface thereof is polished by CMP, and the electrode materials are completely buried into only the opening portion 28 on the on-field gate electrode 19c from which the insulation film 18c is selectively removed, thereby forming a connection electrode 32.

As illustrated in FIG. 5C, an interlayer insulation film (second interlayer insulation film) 22b is deposited again almost all over the P-type silicon substrate 11. The film 22b is polished by CMP and its top surface is flattened.

As shown in FIG. 5D, a resist pattern 23 is formed on the second interlayer insulation film 22b. Using this pattern as a mask, the first and second interlayer insulation films 22a and 22b are etched to simultaneously form a contact hole (substrate contact hole) 24 reaching one of the source and drain diffusion layers 20a, a contact hole (substrate contact hole) 25 reaching one of the source and drain diffusion layers 20b, and a contact hole (electrode contact hole) 26 reaching the connection electrode 32 on the on-field gate electrode 19c.

Since the top surface of the on-field gate electrode 19c is protected by the connection electrode 32, the electrode 19c can be prevented from being over-etched by formation of the contact hole 26.

Figure 5E:
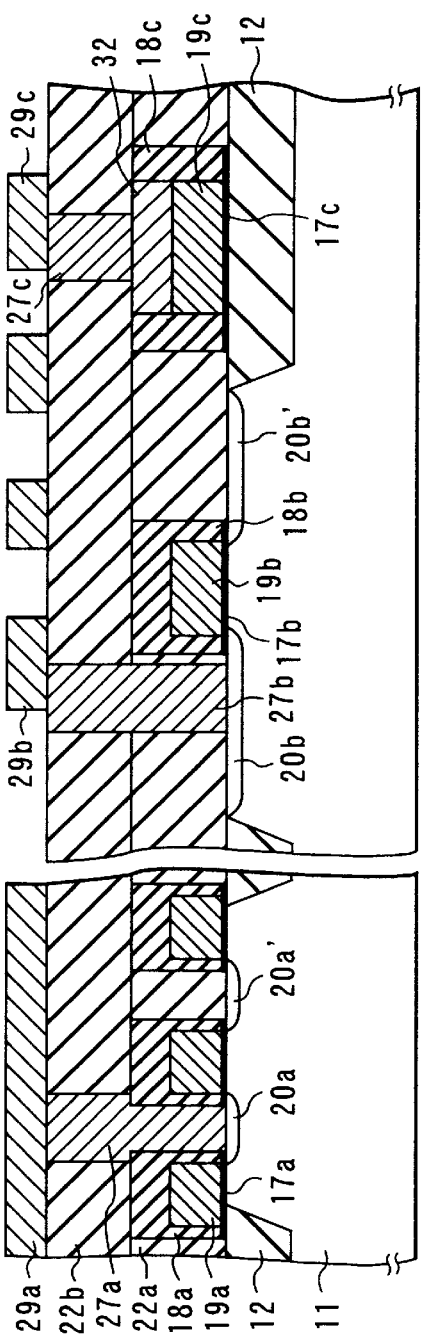

The resist pattern 23 is removed and then, as shown in FIG. 5E, conductive materials (e.g., tungsten) are completely buried into only the contact holes 24, 25 and 26 to form a bit-line contact (substrate contact) 27a connected to one of the source and drain diffusion layers 20a in the memory cell section 10a, an active contact (substrate contact) 27b connected to one of the source and drain diffusion layers 20b in the peripheral circuit section 10b, and a gate contact (electrode contact) 27c connected to the connection electrode 32 on the on-field gate electrode 19c in the section 10b.

After that, in order to form a first-layered wiring layer, a tungsten wiring is patterned on the interlayer insulation film 22b to form a bit line 29a connected to the bit-line contact 27a in the memory cell section 10a, a wiring 29b connected to the active contact 27b in the peripheral circuit section 10b, and a wiring 29c connected to the gate contact 27c therein.

In the DRAM of the second embodiment, too, a mask used for lithography to form the bit line 29a can directly be aligned with each of the contacts 27a, 27b and 27c.

Figure 5F:
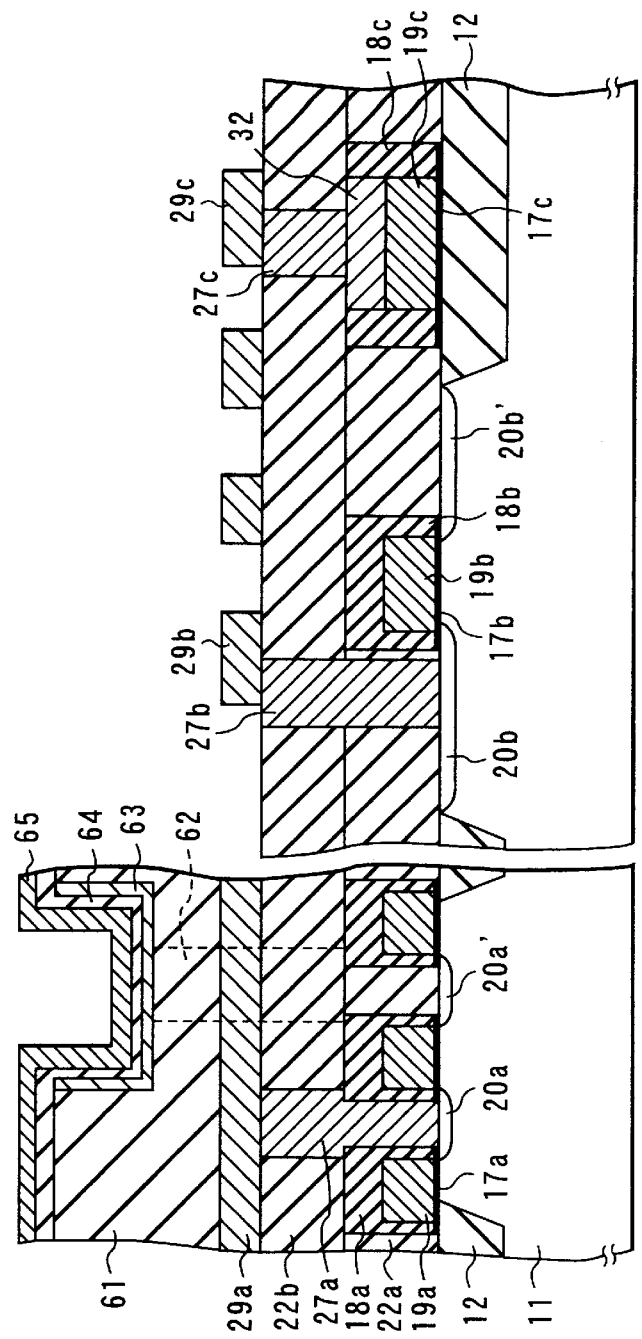

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 5F.

According to the method of the second embodiment, too, substantially the same advantage as that of the first embodiment can be expected.

(Third Embodiment)

FIGS. 6A to 6H illustrate a stacked type DRAM according to a third embodiment of the present invention in order to explain a method of manufacturing the same in brief. The third embodiment is directed to the DRAM of the first embodiment in which a connection electrode is formed at the bottom of a substrate contact and bit-line and active contacts and source and drain diffusion layers are connected to each other through the connection electrode.

Figure 6A:
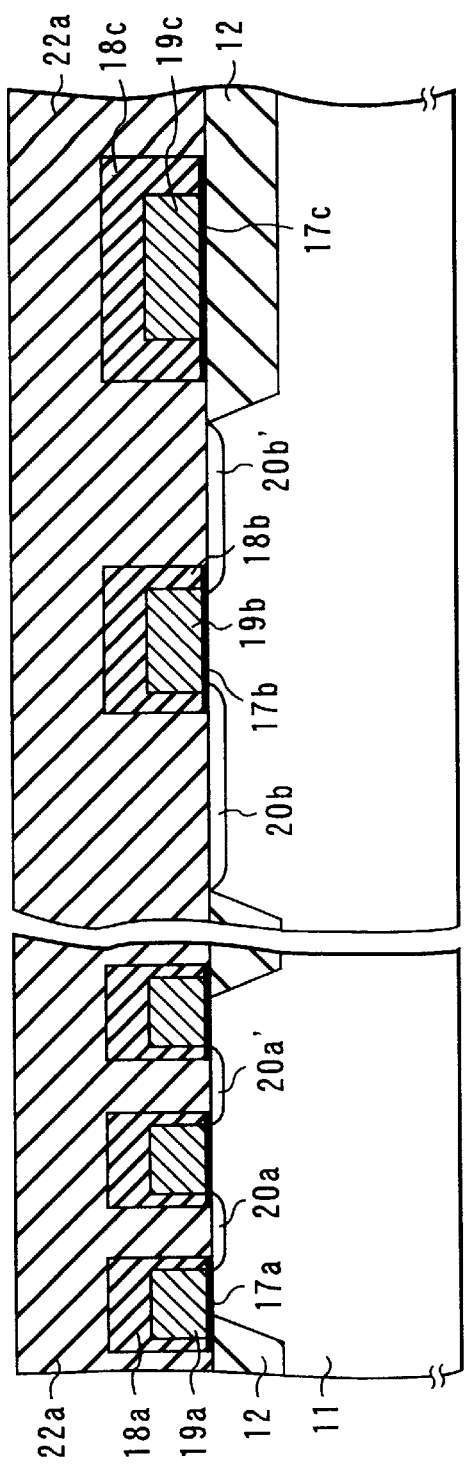

First, as in the first embodiment, source and drain diffusion layers 20a and 20a' and source and drain diffusion layers 20b and 20b' are formed in a memory cell section 10a and a peripheral circuit section 10b, respectively (see FIG. 4A) and then a first interlayer insulation film 22a is deposited almost all over a P-type silicon substrate 11 so as to fill a space between gate electrodes 19a, 19b and 19c, as shown in FIG. 6A.

Figure 6B:
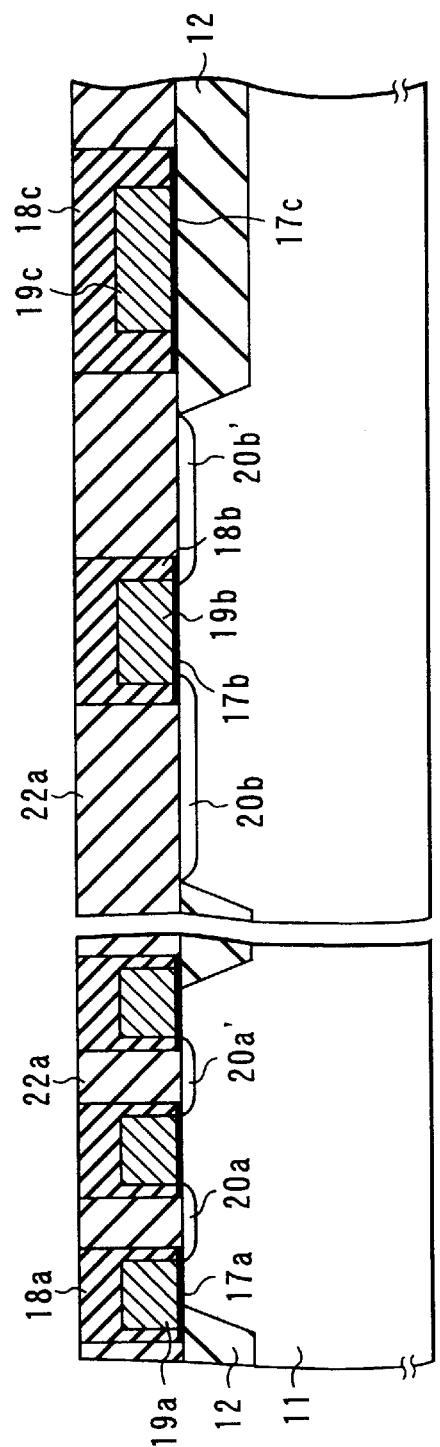

As illustrated in FIG. 6B, the top surface of the interlayer insulation film 22a is flattened by CMP to expose the top surfaces of insulation films 18a, 18b and 18c.

Figure 6C:
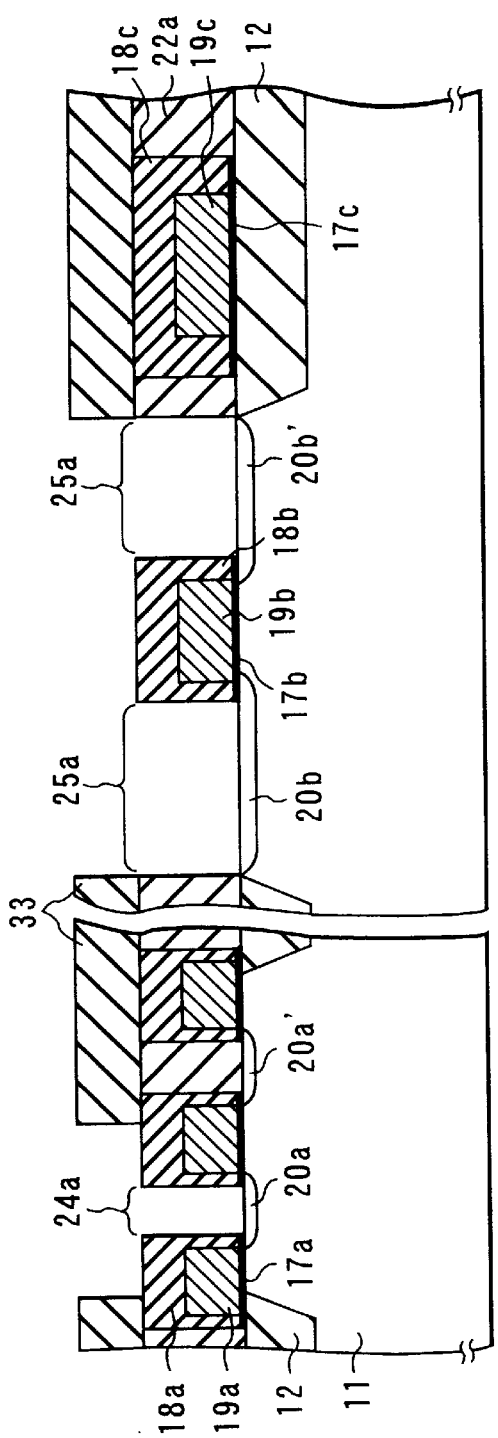

As shown in FIG. 6C, a resist pattern 33 is formed almost all over the resultant structure. Using this pattern as a mask, the interlayer insulation film 22a is etched in self-alignment to simultaneously form a contact hole (substrate contact hole) 24a reaching one of the source and drain diffusion layers 20a and contact holes (substrate contact holes) 25a and 25a reaching the source and drain diffusion layers 20b and 20b', respectively.

The contact holes 25a and 25a are formed as large as possible such that the source and drain diffusion layers 20b and 20b' are almost exposed.

Figure 6D:
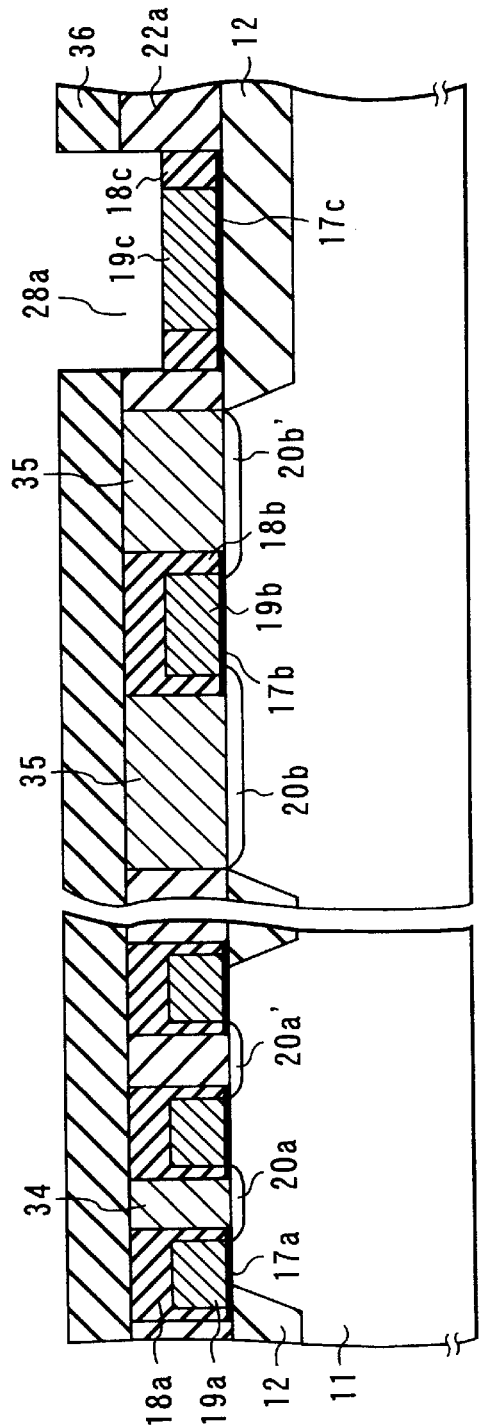

The resist pattern 33 is then removed and, as shown in FIG. 6D, conductive materials (e.g., polysilicon) are deposited on the entire surface of the resultant structure and its top surface is polished by CMP. The conductive materials are completely buried into only the contact holes 24a, 25a and 25a to form a connection electrode 34 connected to one of the source and drain diffusion layers 20a and connection electrodes 35 and 35 connected to the source and drain diffusion layers 20b and 20b', respectively.

A method of forming these connection electrodes 34, 35 and 35 will be described in detail later on.

After that, a resist pattern 36 having an opening pattern which is larger than the on-field gate electrode 19c is formed almost all over the resultant structure so as to cover the top surface of the electrode 19c. Using the resist pattern 36 as a mask, the insulation film 18c is selectively etched using a heated phosphoric acid solution to form an opening portion 28a through which the top surfaces of the on-field gate electrode 19c and insulation film 18c are exposed.

The resist pattern 36 is removed and then, as shown in FIG. 6E, an interlayer insulation film (second interlayer insulation film) 22b is deposited almost all over the resultant structure. The film 22b is thus polished by CMP and its top surface is flattened.

As illustrated in FIG. 6F, a resist pattern 23 is formed on the second interlayer insulation film 22b. Using this pattern as a mask, the interlayer insulation film 22b is etched to simultaneously form a contact hole (electrode contact hole) 24b reaching the connection electrode 34, a contact hole (electrode contact hole) 25b reaching one of the connection electrodes 35, and a contact hole (electrode contact hole) 26 reaching the on-field gate electrode 19c.

Figure 6G:
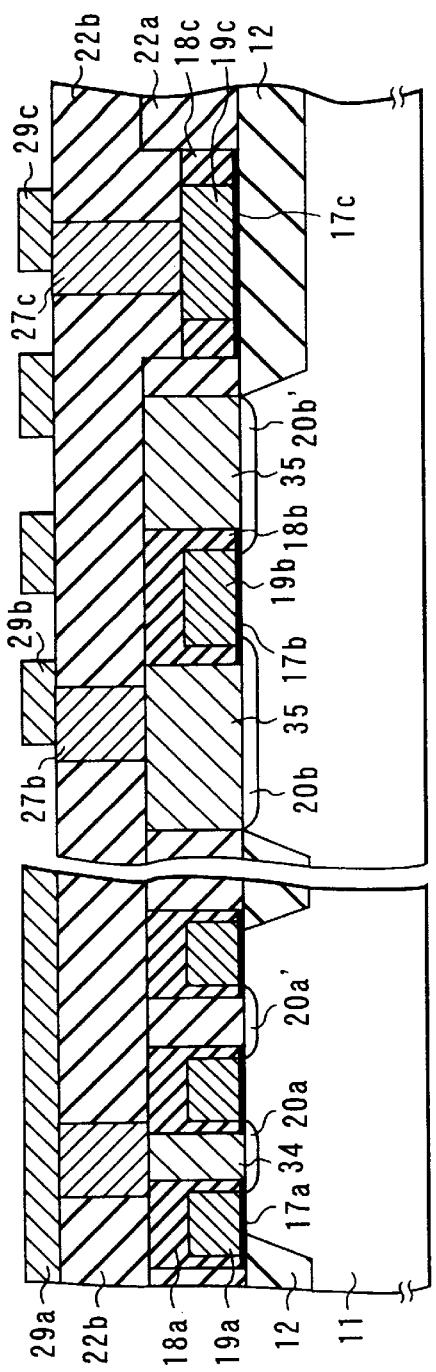

The resist pattern 23 is then removed and, as shown in FIG. 6G, conductive materials (e.g., tungsten) are completely buried into only the contact holes 24b, 25b and 26 to simultaneously form a bit-line contact (electrode contact)

27a connected to the connection electrode 34 and one of the source and drain diffusion layers 20a in the memory cell section 10a, an active contact (electrode contact) 27b connected to the connection electrode 35 and one of the source and drain diffusion layers 20b in the peripheral circuit section 10b, and a gate contact (electrode contact) 27c connected to the on-field gate electrode 19c in the section 10b.

After that, in order to form a first-layered wiring layer, a tungsten wiring is patterned on the interlayer insulation film 22b to form a bit line 29a connected to the bit-line contact 27a in the memory cell section 10a, a wiring 29b connected to the active contact 27b in the peripheral circuit section 10b, and a wiring 29c connected to the gate contact 27c therein.

In the DRAM of the third embodiment, too, a mask used for lithography to form the bit line 29a can directly be aligned with each of the contacts 27a, 27b and 27c.

Figure 6H:
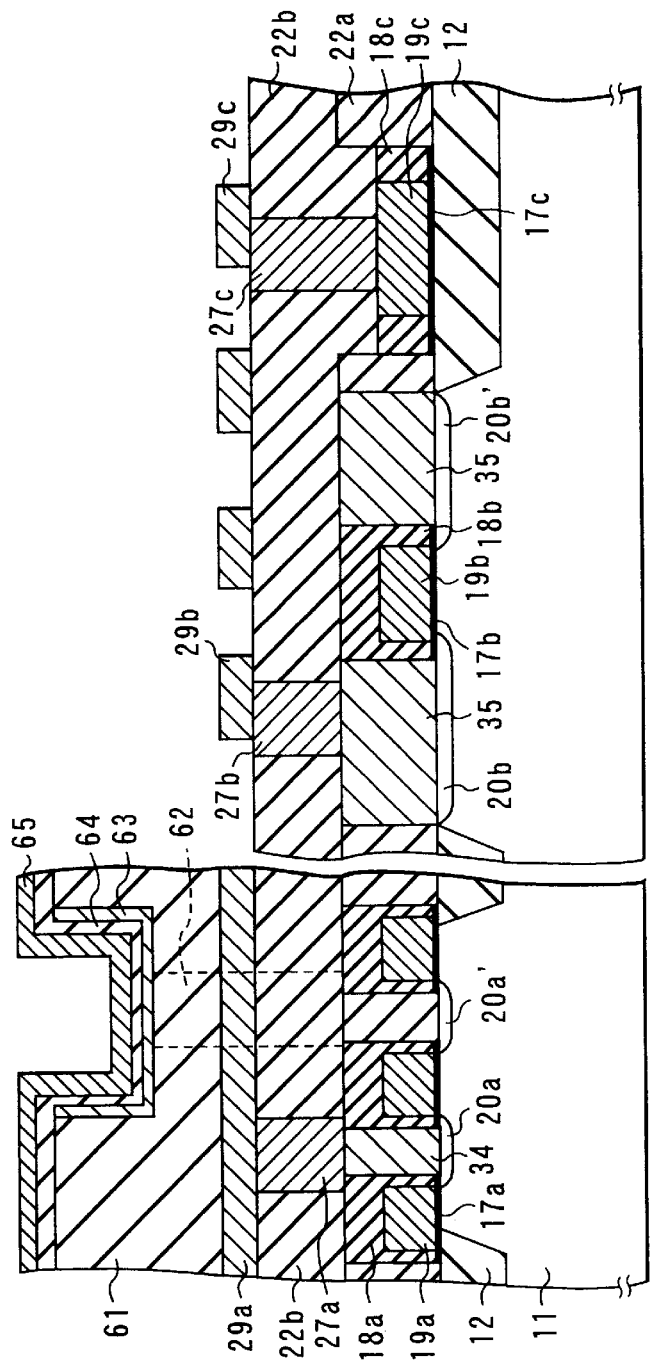

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 6H.

In the foregoing method of the third embodiment, the number of types of masks used for forming the contact holes cannot be reduced, but a mask used for forming the bit line is aligned with the bit-line contact and thus can be aligned directly with all of the other contacts. Therefore, a misalignment between the mask and each of the contacts is uniform and small.

Since the connection electrodes of the peripheral circuit section are formed as large as possible, polysilicon can be employed in the contacts of the peripheral circuit section which require low resistance. For this reason, the contacts of the memory cell section using polysilicon as in the prior art, are compatible with the low-resistance contacts of the peripheral circuit section.

In other words, the polysilicon used in the bit-line contact of the memory cell section, can be used in the active contact of the peripheral circuit section, with the result that both the bit-line and active contacts can be formed completely in the same layer. Consequently, the peripheral circuit section can be achieved with the same design rules as those of the memory cell section, and an alignment error in the peripheral circuit section can be decreased to the same extent as that in the memory cell section.

Since, in particular, the contact holes of the memory cell section and peripheral circuit section are formed simultaneously using a single mask in forming the connection electrodes, misalignments between the mask and the contact holes reaching the connection electrodes can be almost the same in all the layers and regions.

The insulation film formed on the on-field gate electrode is eliminated using a resist pattern having an opening which is larger than a pattern of the on-field gate electrode. If, therefore, a mask for making a contact hole to form a connection electrode is aligned with its corresponding gate electrode, the opening portion formed on the on-field gate electrode has only to be aligned indirectly with the contact hole reaching the on-field gate electrode. A margin of about 0.15 μm therefore allows the DRAM to be achieved with high manufacturing yield.

(Fourth Embodiment)

FIGS. 7A to 7E illustrate a stacked type DRAM according to a fourth embodiment of the present invention in order to explain a method of manufacturing the same in brief. The fourth embodiment is directed to the DRAM of the third embodiment in which a connection electrode is buried into an opening portion formed on an on-field gate electrode from which an insulation film is eliminated.

First, as in the third embodiment described above, a resist pattern 36 having an opening pattern which is larger than an on-field gate electrode 19c is formed almost all over the resultant structure and, using this pattern as a mask, the on-field gate electrode 19c and insulation film 18c are etched to expose their top surfaces (see FIG. 6D) and then the resist pattern 36 is removed.

Figure 7A:
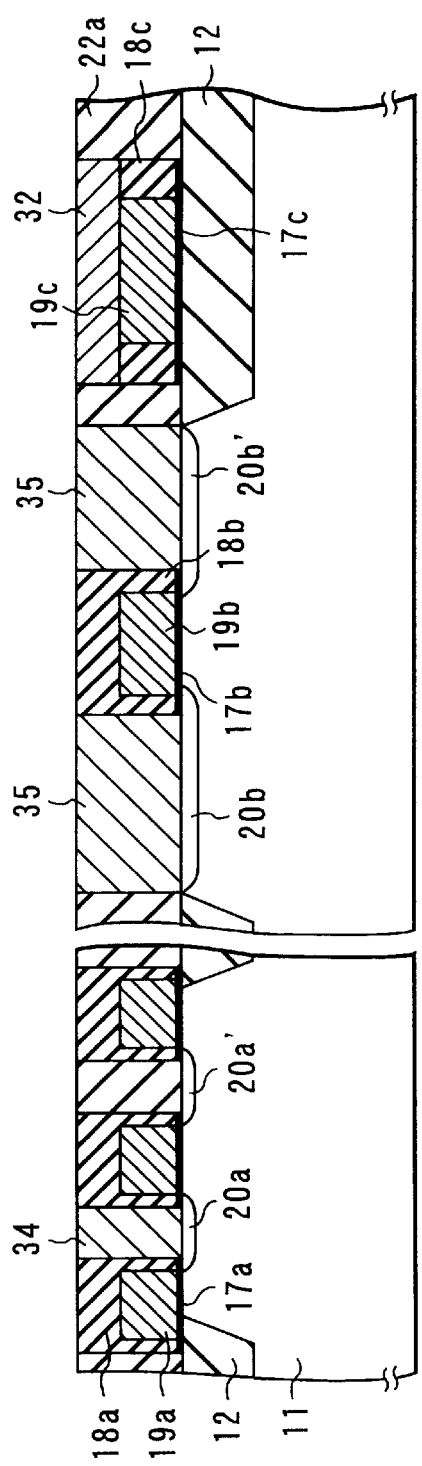

As illustrated in FIG. 7A, electrode materials (e.g., tungsten) are deposited almost all over the resultant structure, and the top thereof is polished by CMP to completely fill the opening portion 28a on the on-field gate electrode 19c, thus obtaining a connection electrode 32.

Figure 7B:
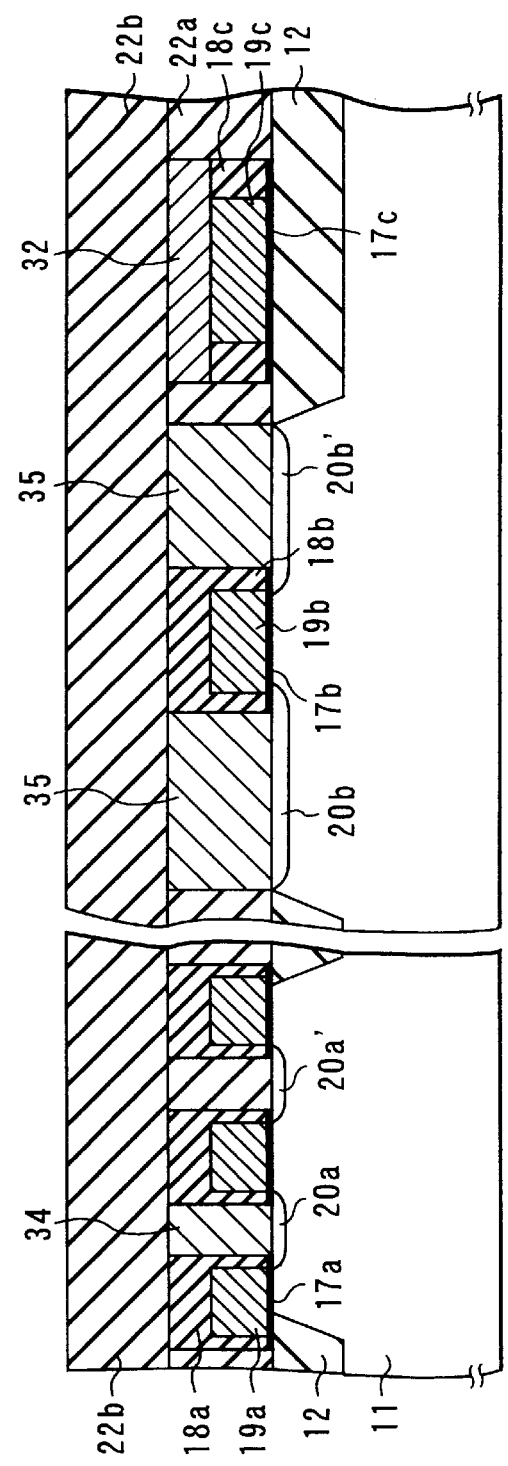

Next, as shown in FIG. 7B, an interlayer insulation film (second interlayer insulation film) 22b is deposited again almost all over the resultant structure and then polished by CMP to flatten its top surface.

As shown in FIG. 7C, a resist pattern 23 is formed on the second interlayer insulation film 22b. Using this pattern as a mask, the interlayer insulation film 22b is etched to simultaneously form a contact hole (electrode contact hole) 24b reaching a connection electrode 34, a contact hole (electrode contact hole) 25b reaching one of connection electrodes 35, and a contact hole (electrode contact hole) 26 reaching the connection electrode 32 formed on the on-field gate electrode 19c.

The resist pattern 23 is then removed and, as shown in FIG. 7D, conductive materials (e.g., tungsten) are completely buried into only the contact holes 24b, ax 25b and 26 to form a bit-line contact (electrode contact) 27a connected to the connection electrode 34 and one of source and drain diffusion layers 20a in the memory cell section 10a, an active contact (electrode contact) 27b connected to the connection electrode 35 and one of source and drain diffusion layers 20b in the peripheral circuit section 10b, and a gate contact (electrode contact) 27c connected to the connection electrode 32 formed on the on-field gate electrode 19c in the section 10b.

After that, in order to form a first-layered wiring layer, a tungsten wiring is patterned on the interlayer insulation film 22b to form a bit line 29a connected to the bit-line contact 27a in the memory cell section 10a, a wiring 29b connected to the active contact 27b in the peripheral circuit section 10b, and a wiring 29c connected to the gate contact 27c therein.

In the DRAM of the fourth embodiment, too, a mask used for lithography to form the bit line 29a can directly be aligned with each of the contacts 27a, 27b and 27c.

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 7E.

According to the foregoing method of the fourth embodiment, in addition to the advantage of the third embodiment, the depths of the respective contact holes are almost the same; therefore, the etching for forming the contact holes can be improved in controllability.

(Fifth Embodiment)

FIGS. 8A to 8E illustrate a stacked type DRAM according to a fifth embodiment of the present invention in order to explain a method of manufacturing the same in brief. The fifth embodiment is directed to the DRAM of the third embodiment in which an insulation film is removed from above an on-field gate electrode after a contact hole for forming a bit-line contact is made.

First, as in the third embodiment, a connection electrode 34 connected to one of source and drain diffusion layers 20a and connection electrodes 35 and 35 connected to the source and drain diffusion layers 20b and 20b' are formed and then, as shown in FIG. 8A, an interlayer insulation film (second interlayer insulation film) 22b is deposited again almost all over the resultant structure. The film 22b is then polished by CMP to flatten its top surface.

Figure 8B:
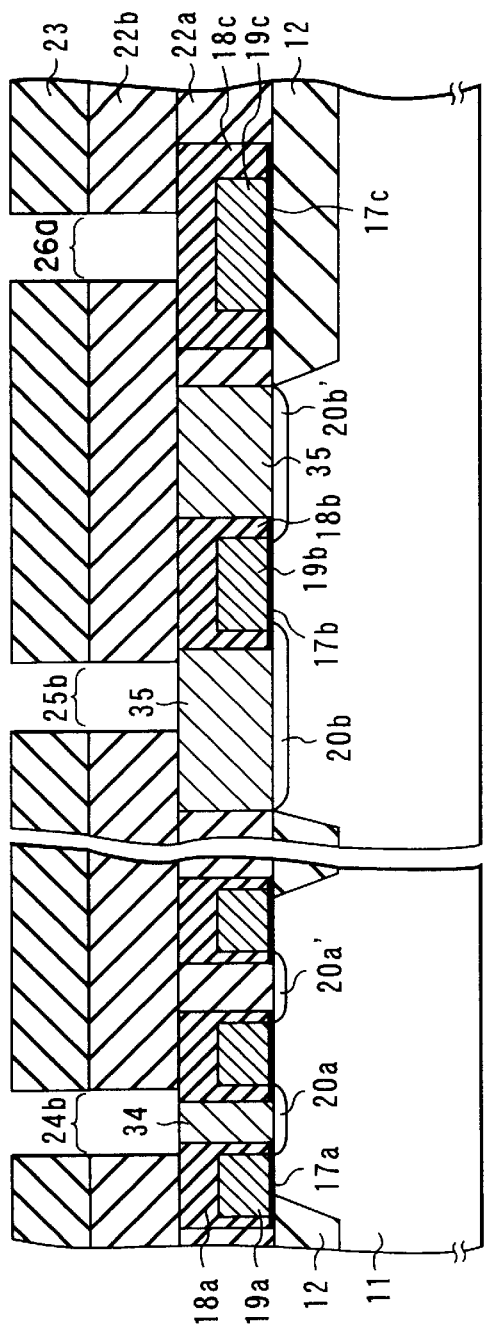

As shown in FIG. 8B, a resist pattern 23 is formed on the second interlayer insulation film 22b. Using this pattern as a mask, the interlayer insulation film 22b is etched to simultaneously form a contact hole (electrode contact hole) 24b reaching the connection electrode 34, a contact hole (electrode contact hole) 25b reaching one of the connection electrodes 35, and a contact hole (first contact hole) 26a reaching an insulation film 18c formed on an on-field gate electrode 19c.

Figure 8C:
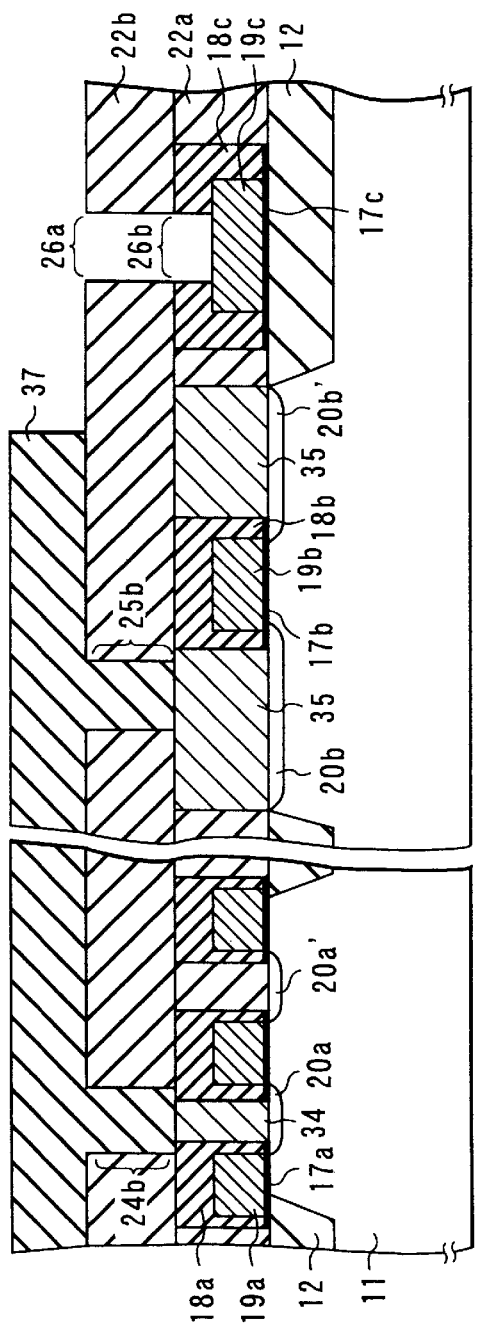

After that, the resist pattern 23 is removed and, as shown in FIG. 8C, a resist pattern 37 is formed on the interlayer insulation film 22b so as to cover the contact holes 24b and 25b with a resist film.

Using the resist pattern 37 as a mask, the insulation film 18c, which is exposed to the bottom of the contact hole 26a, is etched in self-alignment using a heated phosphoric acid solution to form a contact hole (second contact hole) 26b reaching the on-field gate electrode 19c.

Figure 8D:
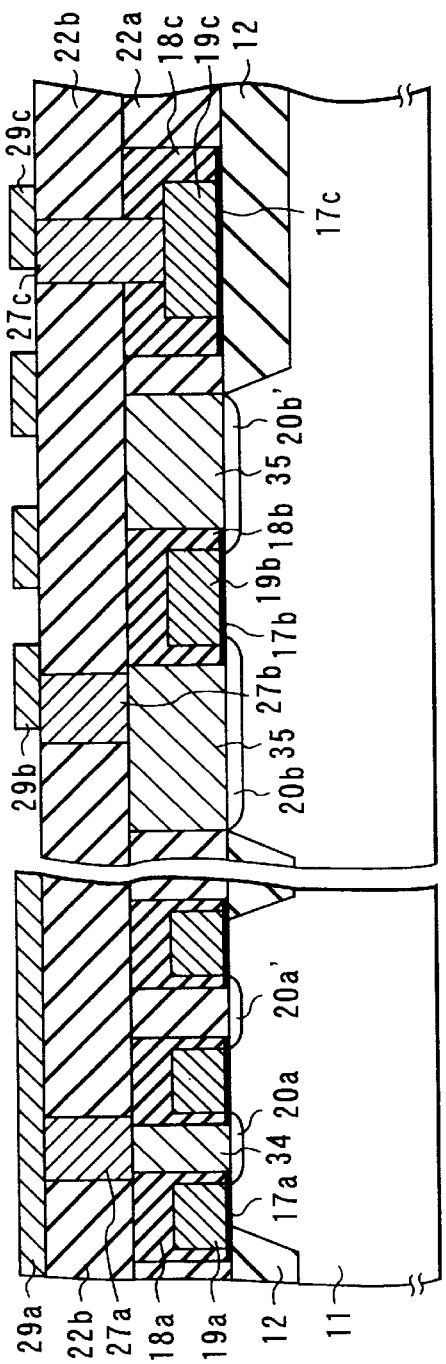

The resist pattern 37 is then removed and, as shown in FIG. 8D, conductive materials (e.g., tungsten) are completely buried into only the contact holes 24b, 25b, 26a and 26b to form a bit-line contact (electrode contact) 27a connected to the connection electrode 34 and one of source and drain diffusion layers 20a in the memory cell section 10a, an active contact (electrode contact) 27b connected to the connection electrode 35 and one of source and drain diffusion layers 20b in the peripheral circuit section 10b, and a gate contact (electrode contact) 27c connected to the on-field gate electrode 19c in the section 10b.

After that, in order to form a first-layered wiring layer, a tungsten wiring is patterned on the interlayer insulation film 22b to form a bit line 29a connected to the bit-line contact 27a in the memory cell section 10a, a wiring 29b connected to the active contact 27b in the peripheral circuit section 10b, and a wiring 29c connected to the gate contact 27c therein.

In the DRAM of the fifth embodiment, too, a mask used for lithography to form the bit line 29a can directly be aligned with each of the contacts 27a, 27b and 27c.

Figure 8E:
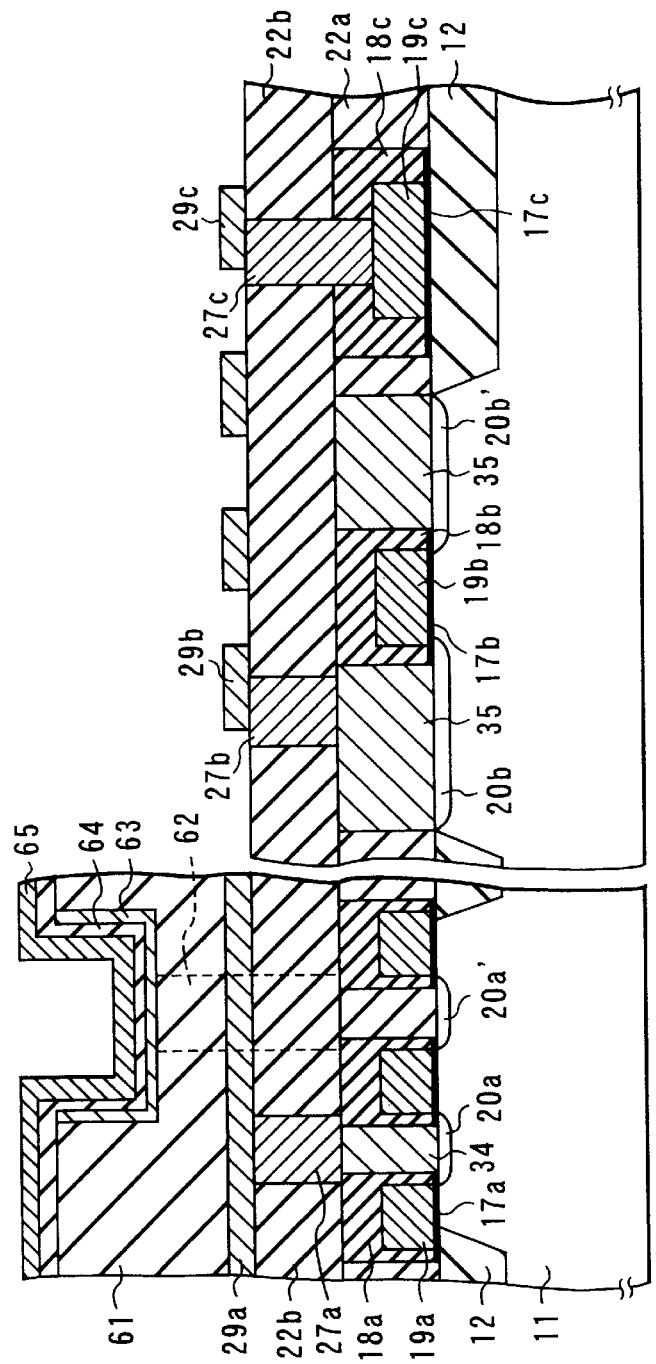

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 8E.

According to the method described above, substantially the same advantage as that of the fourth embodiment can be expected, and a mask having a relatively rough pattern can be used for elimination of the insulation film on the on-field gate electrode.

(Sixth Embodiment)

FIGS. 9A to 9E illustrate a stacked DRAM according to a sixth embodiment of the present invention in order to explain a method of manufacturing the same in brief. The sixth embodiment is directed to the DRAM of the fifth embodiment in which the surface of an interlayer insulation film is protected when an insulation film is removed from above an on-field gate electrode.

Figure 9A:
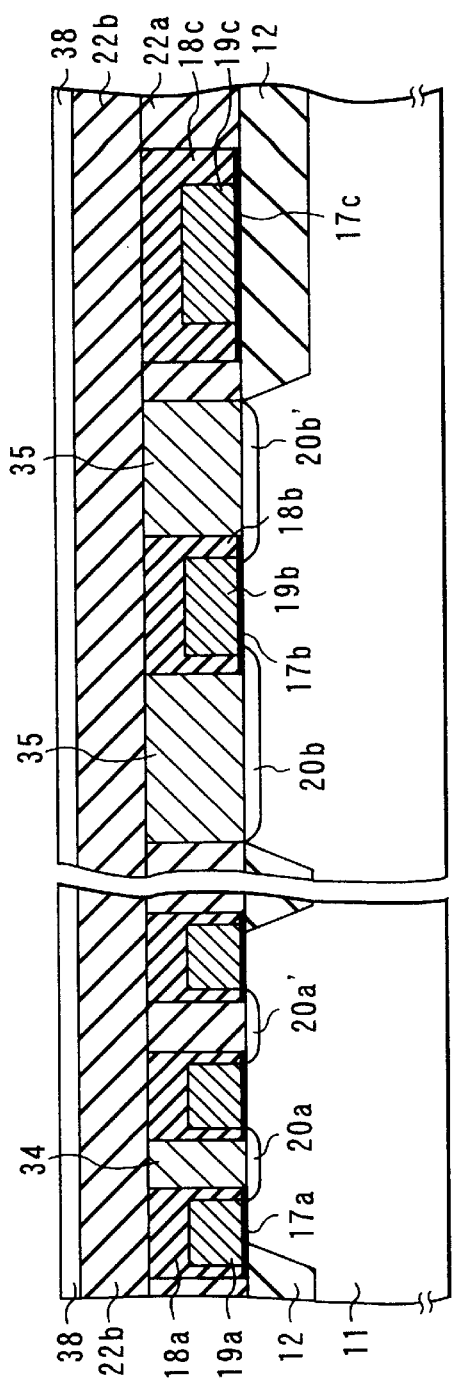

First, as in the fifth embodiment, an interlayer insulation film (second interlayer insulation film) 22b is deposited almost all over the structure and its top surface is flattened (see FIG. 8A). After that, as illustrated in FIG. 9A, a protection film (surface protection film) 38 is formed on the interlayer insulation film 22b. For example, polysilicon, amorphous silicon, or a carbon film, which is resistant to etching of the film 22b, can be used as the protection film 38.

Figure 9B:
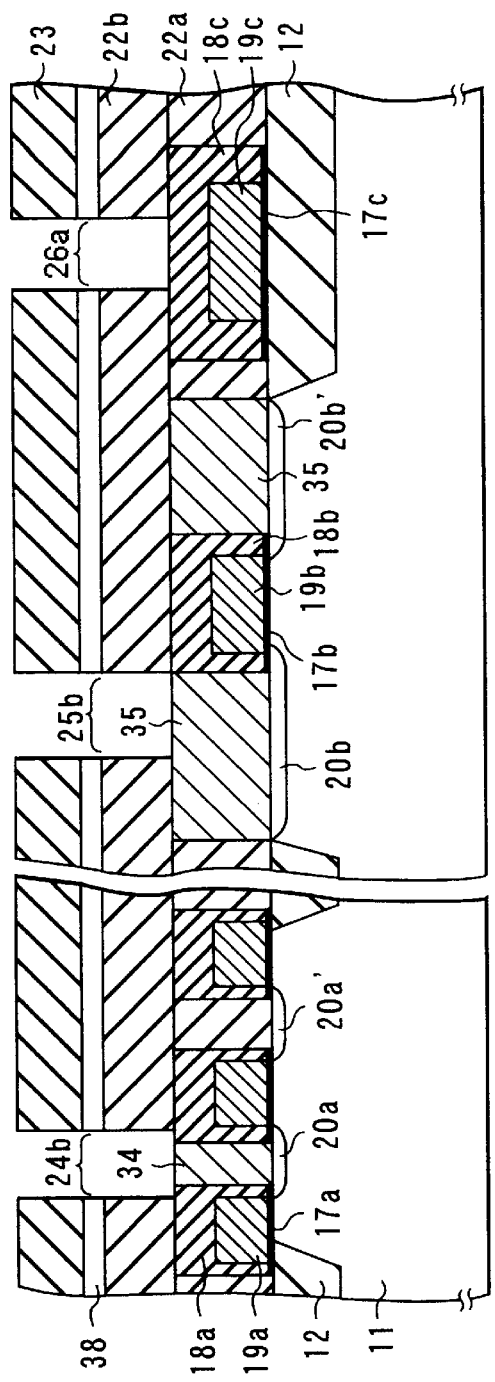

As shown in FIG. 9B, a resist pattern 23 is formed on the protection film 38. Using this pattern as a mask, the protection film 38 and interlayer insulation film 22b are etched to simultaneously form a contact hole (electrode contact hole) 24b reaching a connection electrode 34, a contact hole (electrode contact hole) 25b reaching one of connection electrodes 35, and a contact hole (first contact hole) 26b reaching an insulation film 18c formed on an on-field gate electrode 19c.

Figure 9C:
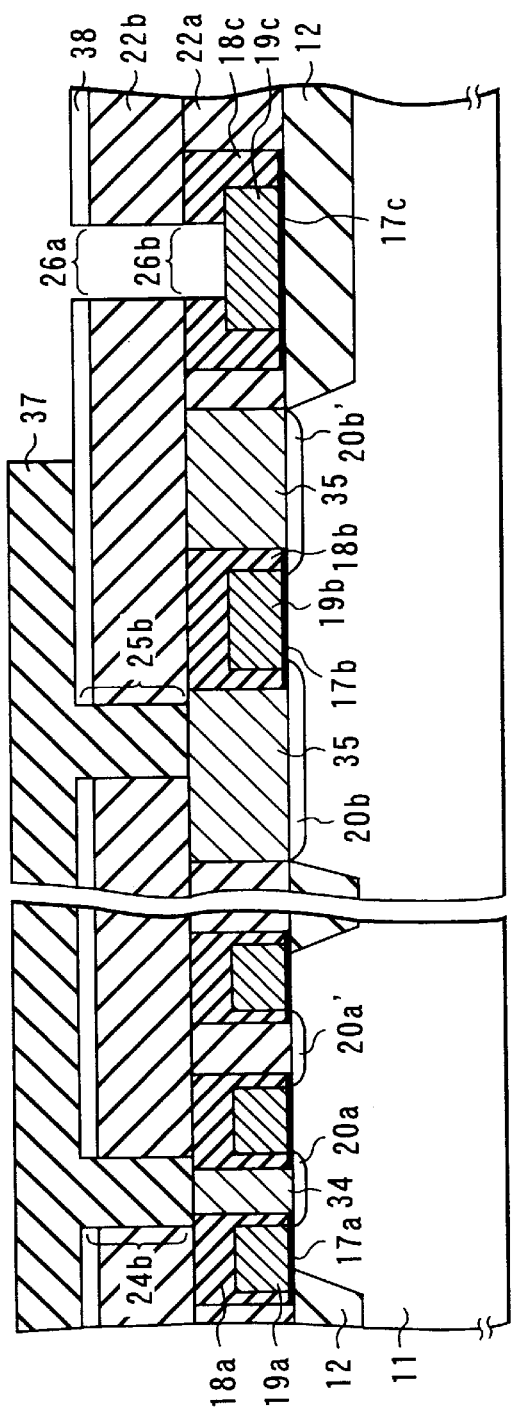

The resist pattern 23 is then removed and, as shown in FIG. 9C, a resist pattern 37 is formed on the protection film 38 so as to cover the contact holes 24b and 25b with a resist film.

Using the resist pattern 37 as a mask, the insulation film 18c, which is exposed to the bottom of the contact hole 26a, is etched in self-alignment using a heated phosphoric acid solution to form a contact hole (second contact hole) 26b reaching the on-field gate electrode 19c.

Figure 9D:
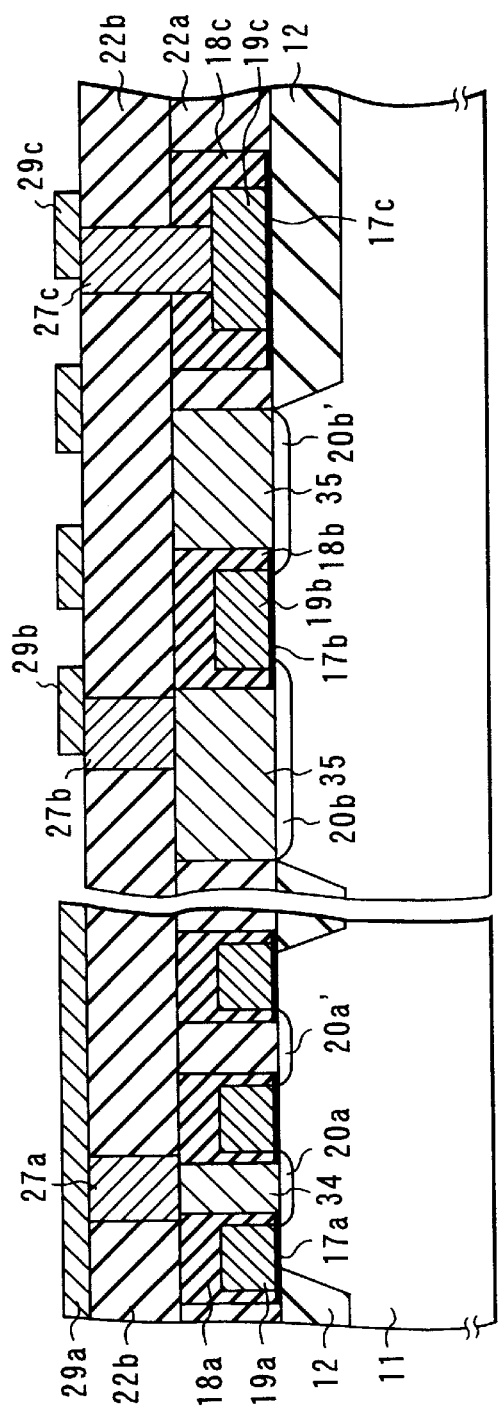

The resist pattern 37 and protection film 38 are removed and, as shown in FIG. 9D, conductive materials (e.g., tungsten) are completely buried into only the contact holes 24b, 25b, 26a and 26b to form a bit-line contact (electrode contact) 27a connected to the connection electrode 34 and one of source and drain diffusion layers 20a in the memory cell section 10a, an active contact (electrode contact) 27b connected to the connection electrode 35 and one of source and drain diffusion layers 20b in the peripheral circuit section 10b, and a gate contact (electrode contact) 27c connected to the on-field gate electrode 19c in the section 10b.

After that, in order to form a first-layered wiring layer, a tungsten wiring is patterned on the interlayer insulation film 22b to form a bit line 29a connected to the bit-line contact 27a in the memory cell section 10a, a wiring 29b connected to the active contact 27b in the peripheral circuit section 10b, and a wiring 29c connected to the gate contact 27c therein.

In the DRAM of the sixth embodiment, too, a mask used for lithography to form the bit line 29a can directly be aligned with each of the contacts 27a, 27b and 27c.

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 9E.

According to the method described above, not only substantially the same advantage as that of the fifth embodiment can be expected, but also the top surface of the interlayer insulation film can be prevented from becoming rough even when a mask having a relatively rough pattern is used to remove the insulation film on the on-field gate electrode, thereby maintaining good flatness.

A method of forming a connection electrode in the foregoing third to sixth embodiments will now be described.

FIGS. 10A to 10H illustrate a stacked type DRAM according to the present invention in which a connection electrode is formed using polysilicon. The DRAM includes an NMOS transistor section and a PMOS transistor section as a peripheral circuit section.

First, as shown in FIG. 10A, element isolating insulation films 12 are formed selectively in surface areas of a P-type silicon substrate (semiconductor substrate) 11, and element isolation regions 13a, 13b and 13c and element regions 14a, 14b and 14c are delimited such that their top surfaces are made almost flush with each other. Then, gate electrodes 19a are each formed on the element region 14a in the memory cell section 10a with a gate insulation film (first insulation film) 17a interposed therebetween. The top and sides of each of the gate electrodes 19a are covered with an insulation film (second insulation film) 18a.

At the same time, gate electrodes 19b are formed on the element regions 14b and 14c of the NMOS and PMOS transistor sections 16a and 16b in the peripheral circuit section 10b, respectively, with a gate insulation film 17b interposed therebetween. The top and sides of each of the gate electrodes 19b are covered with a gate insulation film 18b.

Moreover, at the same time, an on-field gate electrode 19c is formed on the element isolating insulation film 12 in the element isolation region 13b of the NMOS transistor section 16a, with a gate insulation film 17c interposed therebetween. The top and sides of the electrodes 19c are covered with an insulation film 18c.

After that, N-type impurities are ion-implanted into surface areas of the P-type silicon substrates 11 and thermally diffused to form source and drain diffusion layers 20a and 20a' in the memory cell section 10a and source and drain diffusion layers 20b and 20b' in the NMOS transistor section 16a.

In the PMOS transistor section 16b, P-type impurities are ion-implanted into an N-type well region 11a of the P-type silicon substrate 11 and thermally diffused to form source and drain diffusion layers 20c and 20c'.

Figure 10B:
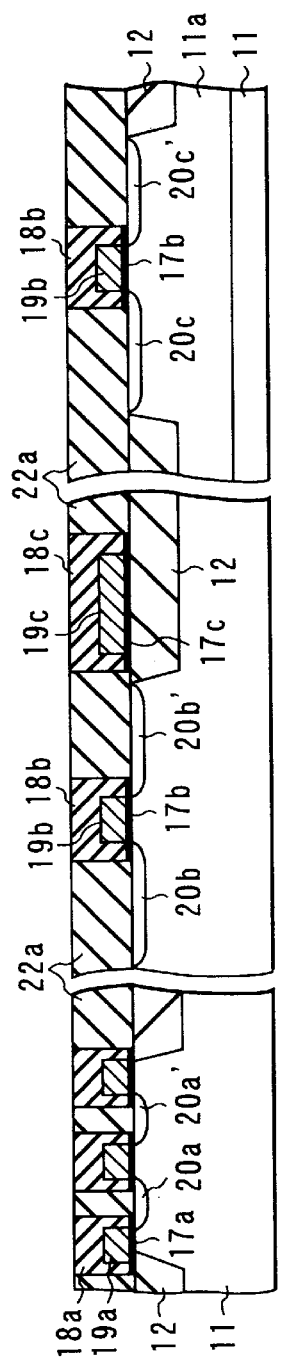

As illustrated in FIG. 10B, an interlayer insulation film (first interlayer insulation film) 22a is deposited almost all over the P-type silicon substrate 11 so as to fill a space between the gate electrodes 19a, 19b, 19c and 19b. The top surface of the interlayer insulation film 22a is polished and flattened by CMP to expose the top surfaces of the insulation films 18a, 18b, 18c and 18b.

Figure 10C:
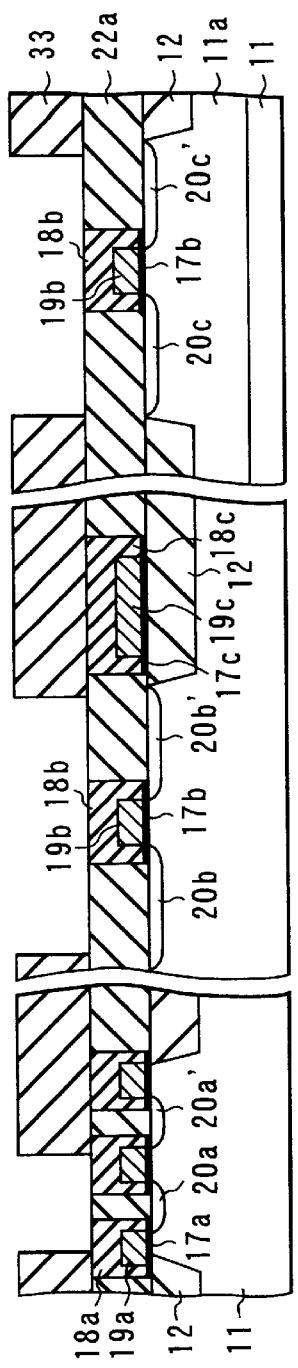
Figure 10D:
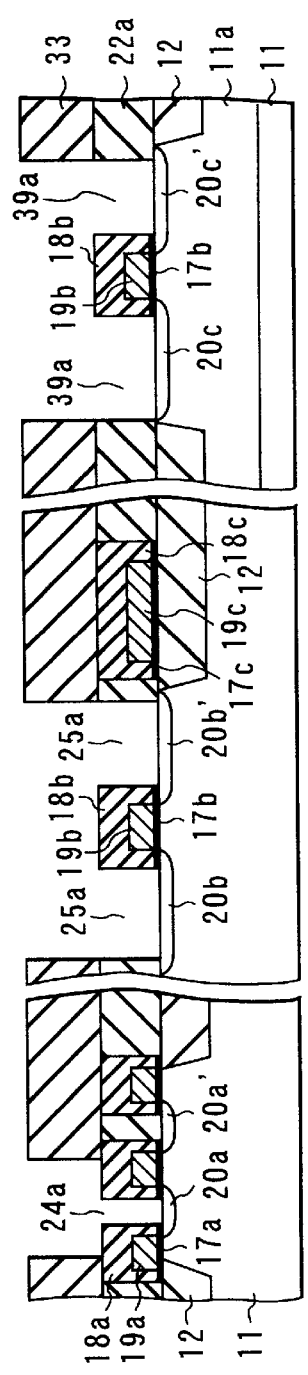

Then a resist pattern 33 is, as shown in FIG. 10C, formed almost all over the resultant structure. Using this pattern as a mask, as shown in FIG. 10D, the interlayer insulation film 22a is etched in self-alignment to simultaneously form a contact hole (substrate contact hole) 24a reaching one of the source and drain diffusion layers 20a, contact holes (substrate contact holes) 25a and 25a reaching the source and drain diffusion layers 20b and 20b', and contact holes (substrate contact holes) 39a and 39a reaching the source and drain diffusion layers 20c and 20c'.

The contact holes 25a and 25a are formed as large as possible such that their underlying source and drain diffusion layers 20b and 20b' are almost exposed. Similarly, the contact holes 39a and 39a are formed as large as possible such that their underlying source and drain diffusion layers 20c and 20c' are almost exposed.

Figure 10E:
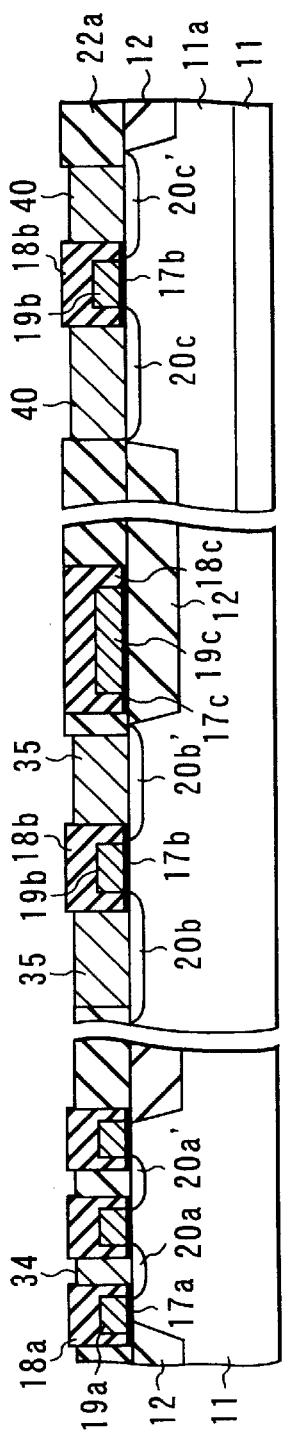

Then the resist pattern 33 is removed and, as shown in FIG. 10E, electrode materials (e.g., polysilicon) are deposited almost all over the resultant structure and its top surface is polished by CMP to completely fill only the contact holes 24a, 25a, 25a, 39a and 39a. Thus, a connection electrode 34 connected to one of the source and drain diffusion layers 20a, connection electrodes 35 and 35 connected to the source and drain diffusion layers 20b and 20b', and connection electrodes 40 and 40 connected to the source and drain diffusion layers 20c and 20c' are formed.

Figure 10F:
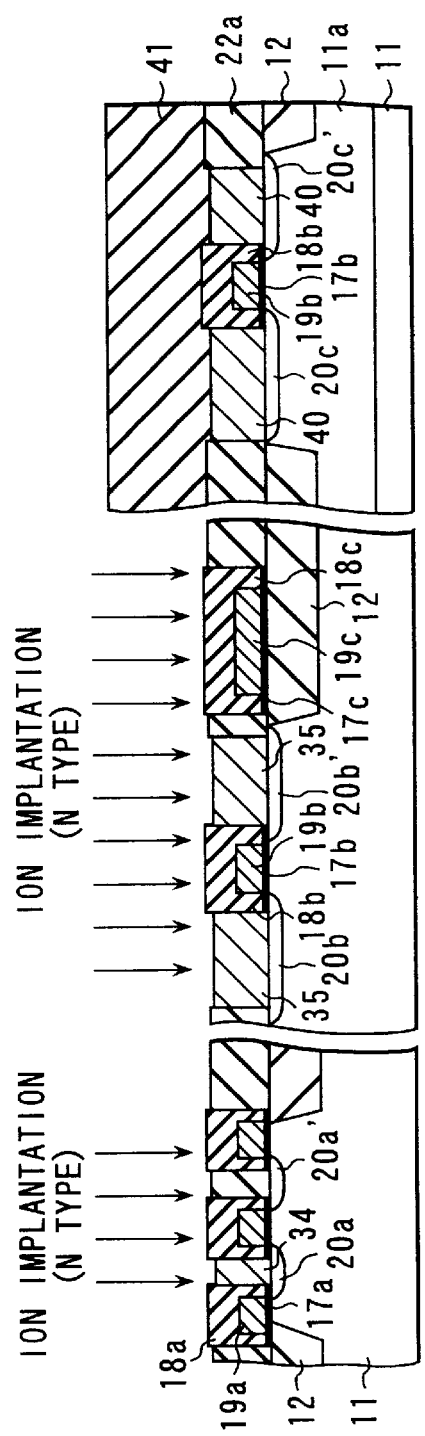

As illustrated in FIG. 10F, a resist film 41 is formed so as to cover the PMOS transistor section 16b and, in this state, N-type impurities (e.g., arsenic) are ion-implanted into the connection electrodes 34, 35 and 35 in the memory cell section 10a and NMOS transistor section 16a.

Figure 10G:
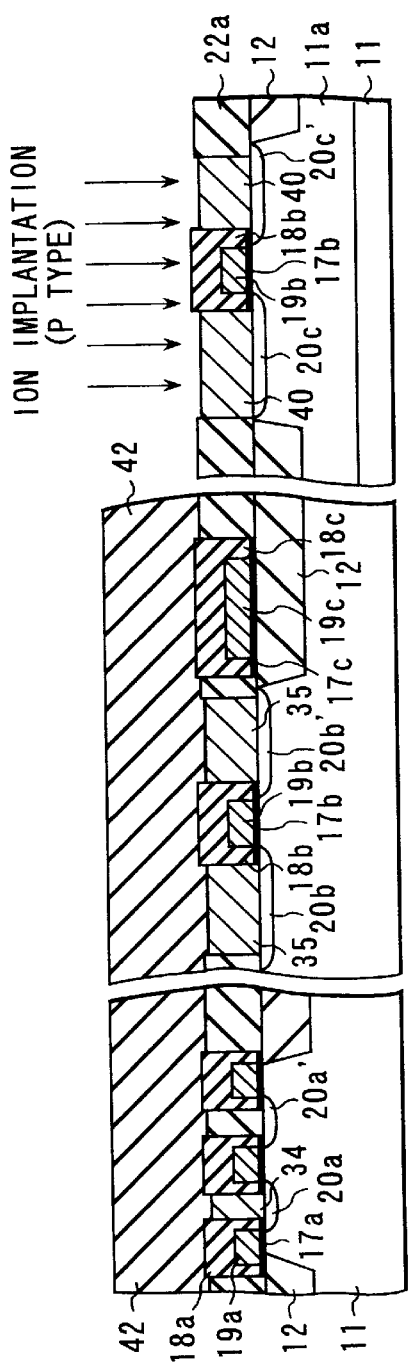

Thereafter, the resist film 41 is eliminated and, as shown in FIG. 10G, another resist film 42 is formed so as to cover the transistor section 16a and, in this state, P-type impurities (e.g., boron) are ion-implanted into the connection electrodes 40 and 40 in the PMOS transistor section 16b.

The connection electrodes 34, 35, 35, 40 and 40 formed using polysilicon are effective in preventing a junction leak from becoming worse.

As these connection electrodes 34, 35, 35, 40 and 40, a buried plug formed by selective epitaxial growth can be employed.

From then on, in the third to sixth embodiments described above, a gate contact (electrode contact) 27c on the on-field gate electrode 19c, a bit-line contact (electrode contact) 27a connected to the connection electrode 34, and active contacts (electrode contacts) 27b and 27b connected to the connection electrodes 35 and 40 are formed (see FIGS. 6D to 6G).

Figure 10H:
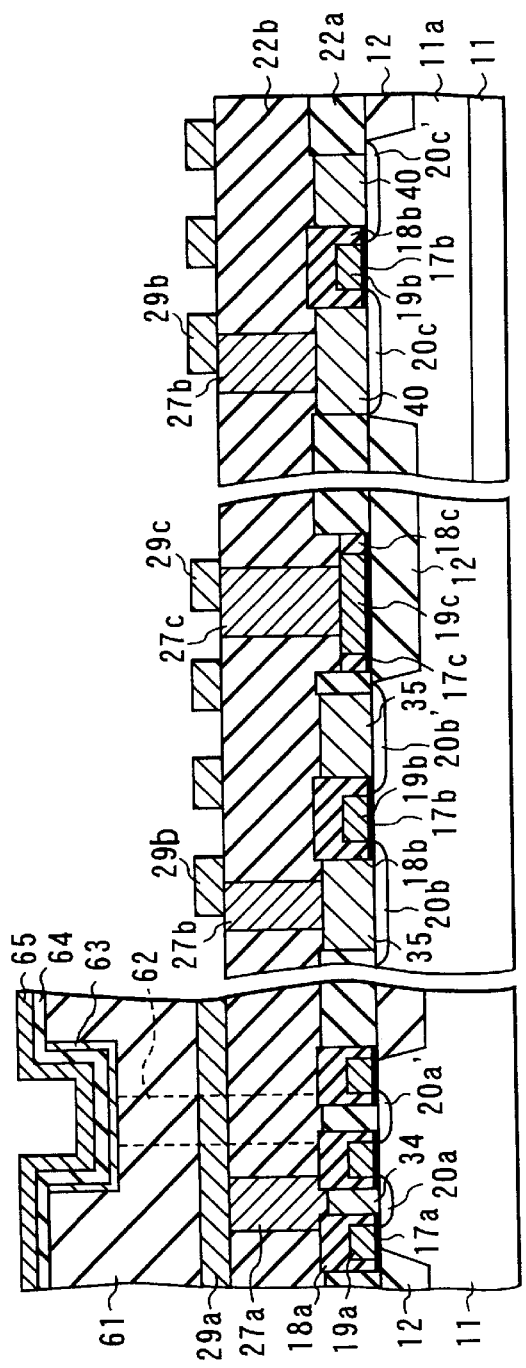

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 10H.

In the above-described method for forming a connection electrode using polysilicon, as shown in FIGS. 11A to 11H, an insulating protection film 43 of SiN can be formed almost all over the structure after the source and drain diffusion layers 20a, 20a', 20b, 20b', 20c and 20c' are formed.

The insulating protection film 43 prevents the element isolating insulation film 12 from being over-etched when the contact holes 24a, 25a, 25a, 39a and 39a are formed.

Since, therefore, the insulating protection film 43, which is exposed to the bottoms of the contact holes 24a, 25a, 25a, 39a and 39a, is removed before the electrode materials (e.g., polysilicon) are buried, the characteristics of the DRAM can be improved further.

(Seventh Embodiment)

FIGS. 12A to 12D illustrate a stacked type DRAM according to a seventh embodiment of the present invention in order to explain a method of manufacturing the same in brief. The seventh embodiment is directed to the DRAM shown in FIGS. 10A to 10H in which a connection electrode can be decreased in resistance further.

Figure 12A:
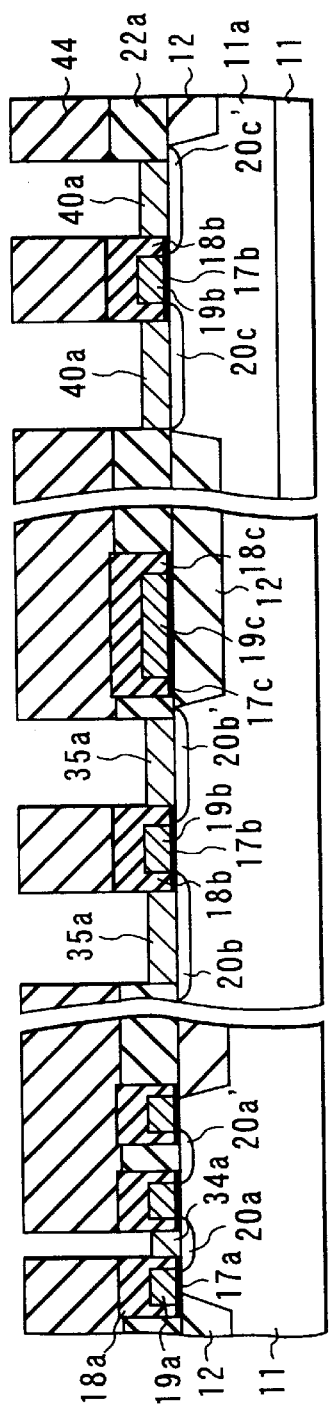
FIGS. 12A to 12D are cross-sectional views schematically showing steps of manufacturing a stacked type DRAM according to a seventh embodiment of the present invention.

First, as illustrated in FIG. 10G, P-type impurities (e.g., boron) are ion-implanted into connection electrodes 40 and 40 of a PMOS transistor section 16b, and a resist film 42 is removed. As shown in FIG. 12A, a resist pattern 44 is formed almost all over the resultant structure. Using the resist pattern 44 as a mask, the top surfaces of the connection electrodes 34, 35, 35, 40 and 40 are etched back to form connection electrodes 34a, 35a, 35a, 40a and 40a each having a thickness which is about half of that of each of insulation films 18a, 18b, 18c and 18b. A step portion is formed between the top surfaces of the insulation films and connection electrodes.

Figure 12B:
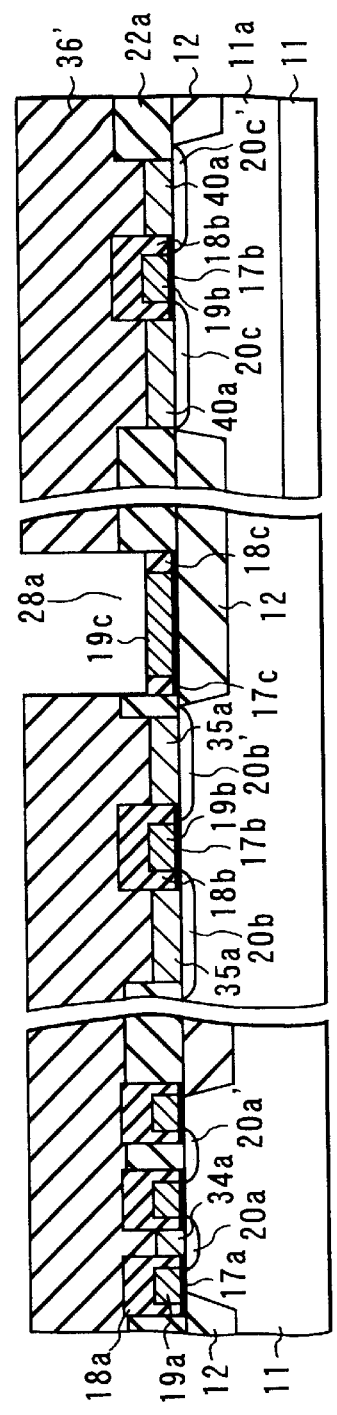

Then, the resist pattern 44 is removed and, as shown in FIG. 12B, a resist pattern 36' having an opening pattern which is larger than an on-field gate electrode 19c, is formed almost all over the resultant structure. Using the resist pattern 36' as a mask, the insulation film 18c is selectively etched using a heated phosphoric acid solution to form an opening portion 28a through which the top surfaces of the on-field gate electrode 19c and insulation film 18c are exposed.

Figure 12C:
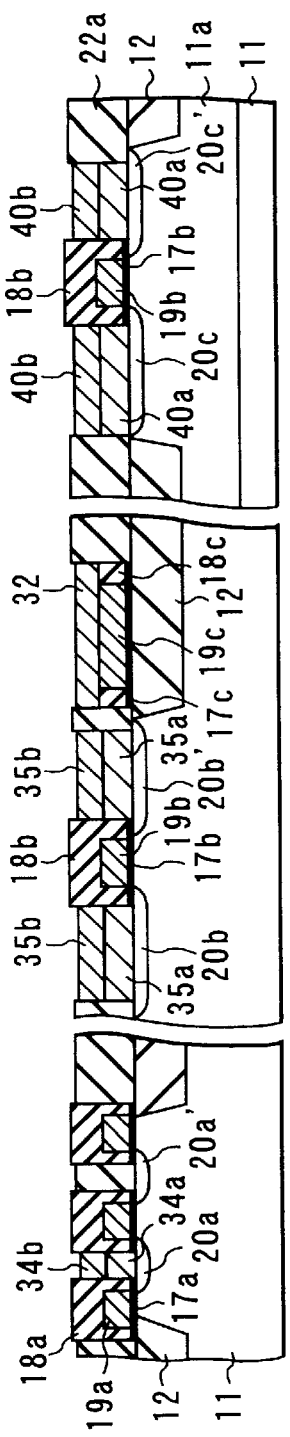

The resist pattern 36' is eliminated and, as shown in FIG. 12C, conductive materials (e.g., tungsten) whose resistance is lower than that of polysilicon, are deposited almost all over the resultant structure and their top surface is polished by CMP. The insulation film 18c is thus removed from the opening portion 28a on the on-field gate electrode 19c, and the electrode materials are buried completely into the opening portion 28a to obtain a connection electrode 32.

Simultaneously, the electrode materials are completely buried into the step portions of the top surfaces of the connection electrodes 34a, 35a, 35a, 40a and 40a to form connection electrodes 34b, 35b, 35b, 40b and 40b of lower resistance which are connected to the connection electrodes 34a, 35a, 35a, 40a and 40a, respectively.

After that, as in the fourth embodiment described above, a gate contact (electrode contact) 27c formed on the on-field gate electrode 19c and connected to the connection electrode 32, a bit-line contact (electrode contact) 27a connected to the connection electrode 34b, and active contacts (electrode contacts) 27b and 27b connected to the connection electrodes 35b and 40b, are formed (see FIGS. 7B to 7D).

Figure 12D:
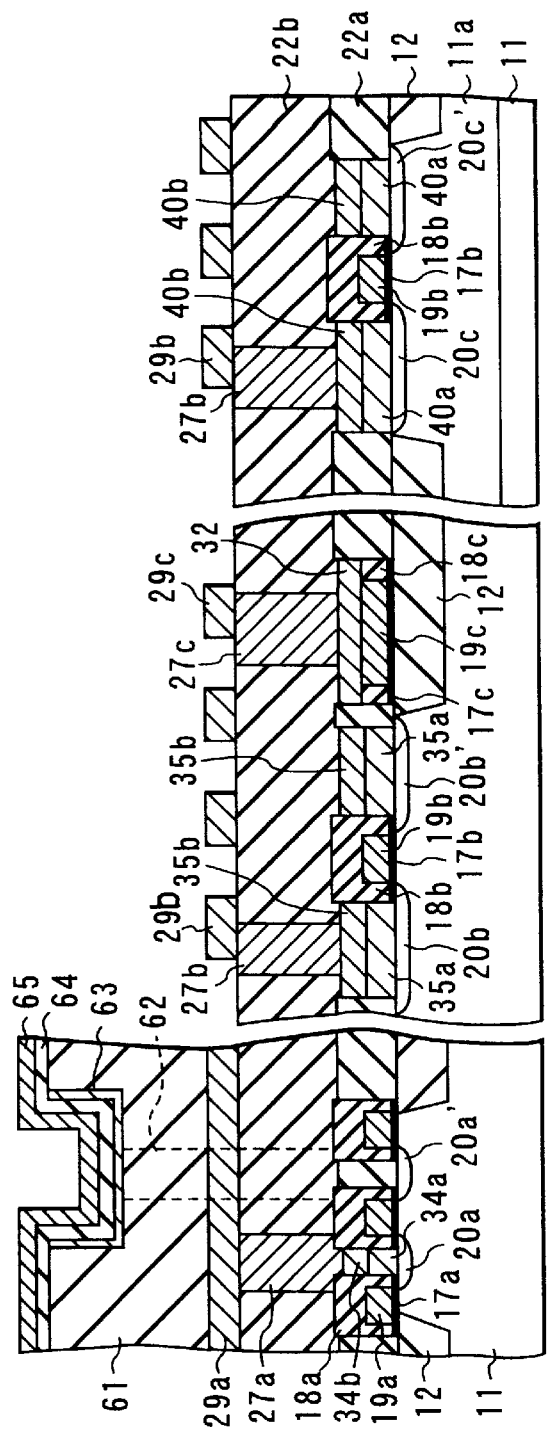

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 12D.

(Eighth Embodiment)

FIGS. 13A to 13E illustrate a stacked DRAM according to an eighth embodiment of the present invention in order to explain a method of manufacturing the same in brief. The eighth embodiment is directed to the DRAM shown in FIGS. 11A to 11H in which a connection electrode of a peripheral circuit section is decreased in resistance further.

Figure 11A:
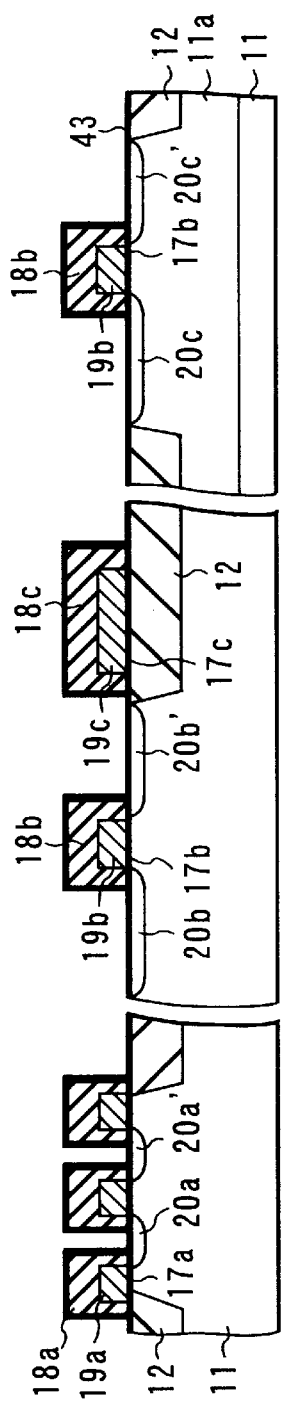

First, as shown in FIG. 11A, source and drain diffusion layers 20a and 20a', source and drain diffusion layers 20b and 20b', and source and drain diffusion layers 20c and 20c' are formed in a memory cell section 10a, an NMOS transistor section 16a, and a PMOS transistor section 16b, respectively, and then an insulating protection film 43 of SiN is formed almost all over the resultant structure.

Figure 11B:
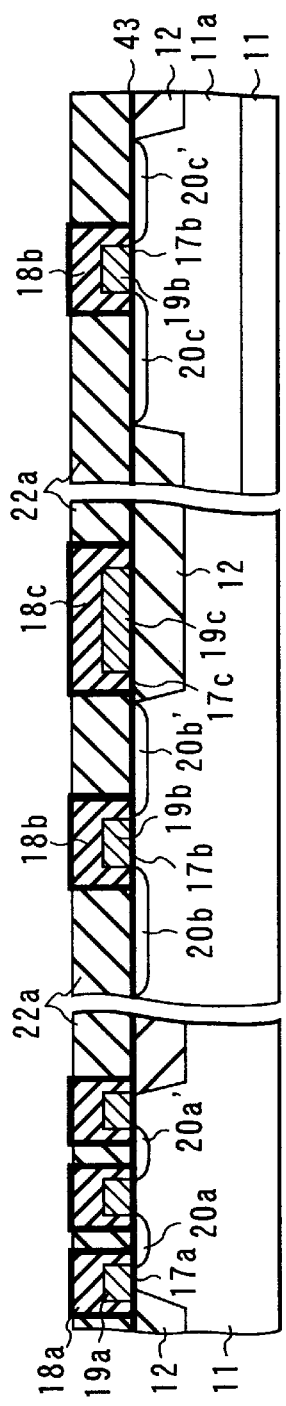

As illustrated in FIG. 11B, an interlayer insulation film (first interlayer insulation film) 22a is deposited almost all over the P-type silicon substrate 11 so as to fill a space between the gate electrodes 19a, 19b, 19c and 19b. The top surface of the interlayer insulation film 22a is polished and flattened by CMP to expose the insulating protection film 43 on the insulation films 18a, 18b, 18c and 18b.

Figure 11C:
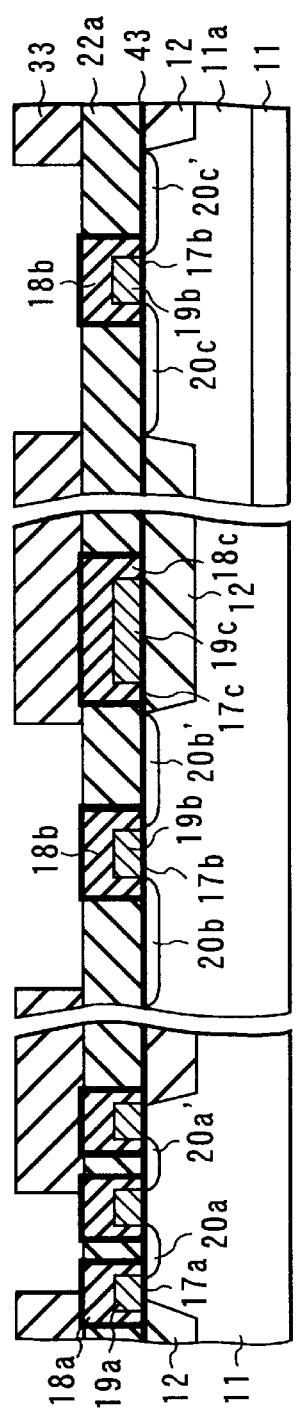
Figure 11G:
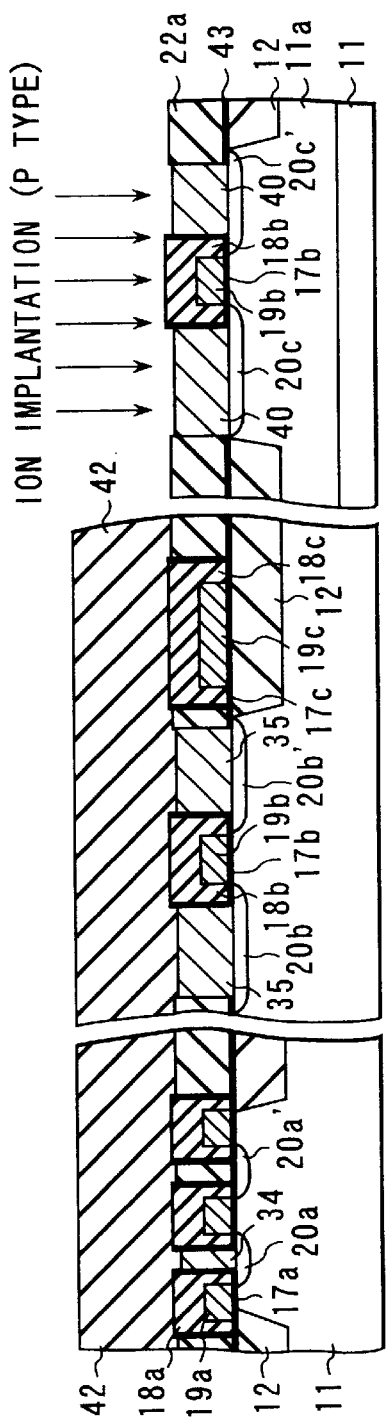
Figure 11H:
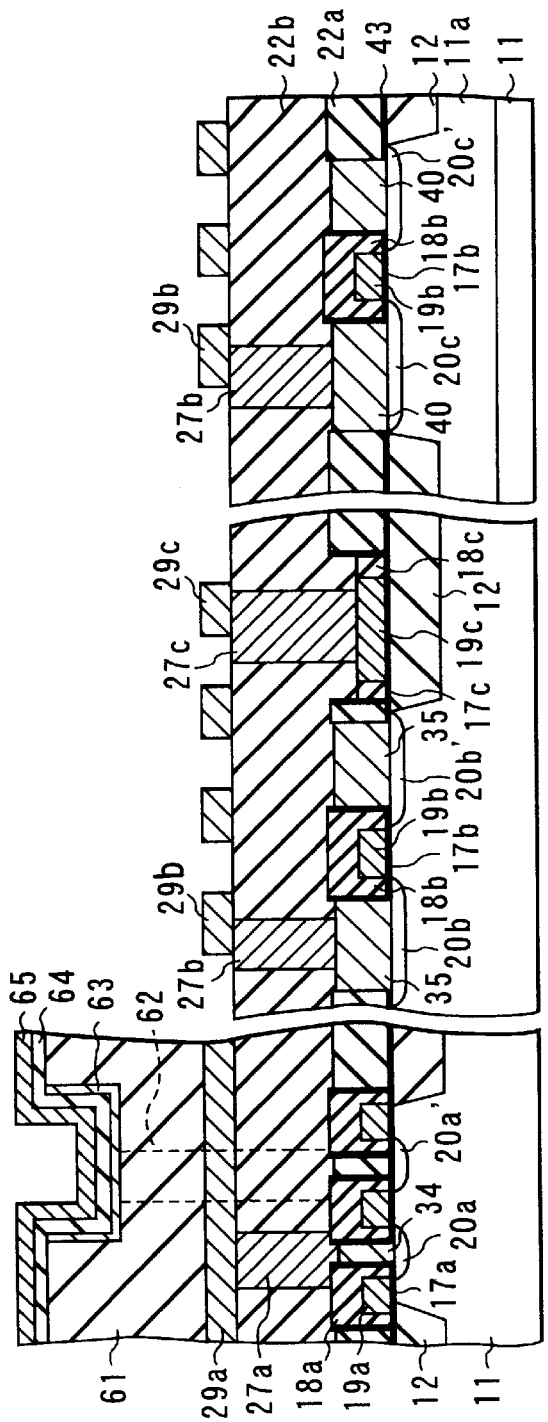

Then, a resist pattern 33 is, as shown in FIG. 11C, formed almost all over the resultant structure. Using this pattern as a mask, as shown in FIG. 11D, the interlayer insulation film 22a is etched in self-alignment to simultaneously form a contact hole (substrate contact hole) 24a reaching one of the source and drain diffusion layers 20a, contact holes (substrate contact holes) 25a and 25a reaching the source and drain diffusion layers 20b and 20b', and contact holes (substrate contact holes) 39a and 39a reaching the source and drain diffusion layers 20c and 20c'.

The contact holes 25a and 25a and contact holes 39a and 39a are formed as large as possible such that their underlying source and drain diffusion layers 20b and 20b' and source and drain diffusion layers 20c and 20c' can almost be exposed.

Figure 13A:
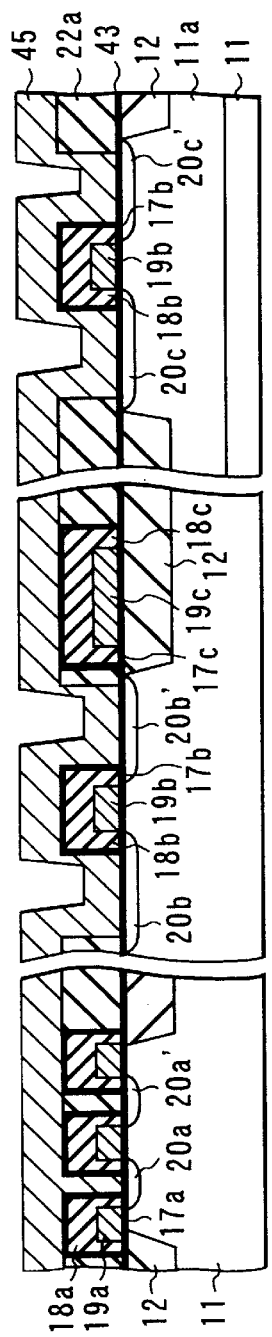
FIGS. 13A to 13E are cross-sectional views schematically showing steps of manufacturing a stacked type DRAM according to an eighth embodiment of the present invention.

The resist pattern 33 is removed and then, as shown in FIG. 13A, the peripheral circuit section 10b is covered with a resist film (not shown) and only the insulating protection film 43, which is exposed to the bottom of the contact hole 24a of the memory cell section 10a, is eliminated.

The resist film is removed and then conductive materials (e.g., polysilicon) 45 are deposited almost all over the resultant structure. The conductive materials 45 are reliably buried into the contact hole 24a of the memory cell section 10a, but they are incompletely buried into the contact holes 25a and 25a of the NMOS transistor section 16a and in the contact holes 39a and 39a of the PMOS transistor section 16b.

Figure 13B:
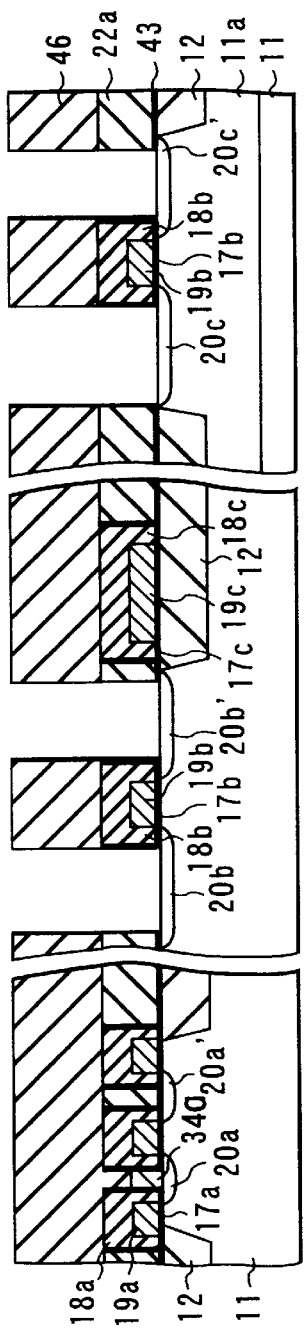

After that, as illustrated in FIG. 13B, the conductive materials 45 are etched isotropically to perfectly remove the contact holes 25a and 25a and contact holes 39a and 39a from their respective NMOS and PMOS transistor sections 16a and 16b.

Part of the conductive materials are caused to remain only in the contact hole 24a of the memory cell section 10a to form a connection electrode 34a connected to one of the source and drain diffuison layer 20a.

Thereafter, a resist pattern 46 is formed almost all over the resultant structure to eliminate the insulating protection film 43 which is exposed to the bottoms of the contact holes 25a and 25a of the NMOS transistor section 16a and those of the contact holes 39a and 39a of the PMOS transistor section 16b.

Figure 13C:
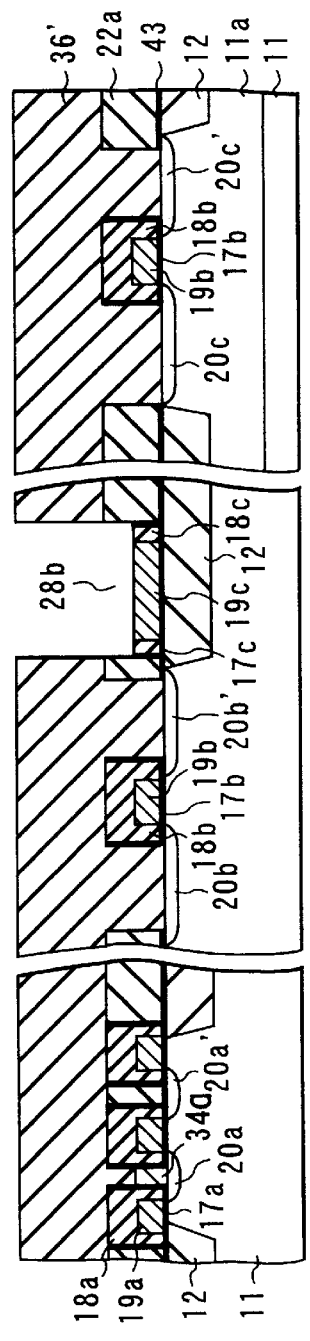

The resist pattern 46 is removed and then, as illustrated in FIG. 13C, a resist pattern 36' having an opening pattern, which is larger than an on-field gate electrode 19c, is formed almost all over the structure. Using the resist pattern 36' as a mask, the insulation film 18c and insulating protection film 43 are selectively etched using a heated phosphoric acid solution to form an opening portion 28b through which the top surface of the on-field gate electrode 19c is exposed.

Figure 13D:
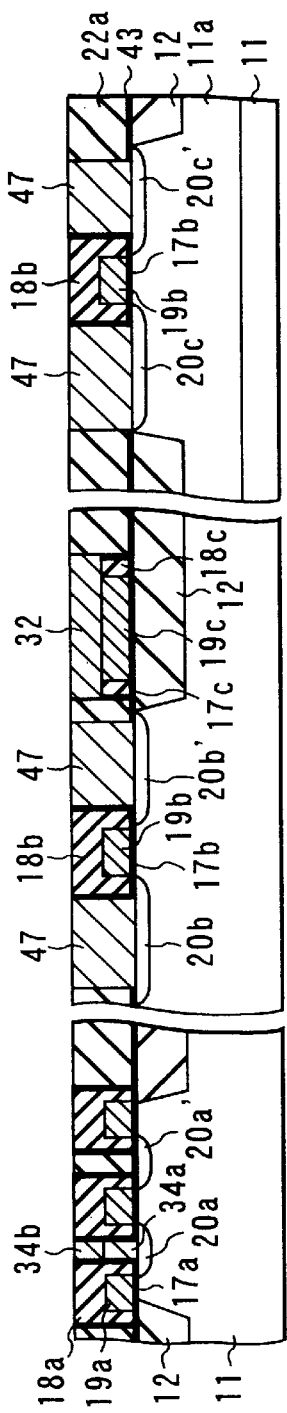

The resist pattern 36' is eliminated and, as shown in FIG. 13D, electrode materials (e.g., tungsten) whose resistance is lower than that of polysilicon, are deposited almost all over the resultant structure and their top surface is polished by CMP. The insulation film 18c is thus removed from the opening portion 28b on the on-field gate electrode 19c, and the electrode materials are buried completely into the opening portion 28b to obtain a connection electrode 32.

Simultaneously, the electrode materials are completely buried into the step portion of the top surface of the connection electrode 34a to form a connection electrode 34b of lower resistance which is connected to the connection electrode 34a, and the electrode materials are completely buried into the contact holes 25a and 25a of the NMOS transistor section 16a to form connection electrodes 47 and 47 connected to the source and drain diffusion layers 20b and 20b', respectively, while the electrode materials are completely buried into the contact holes 39a and 39a of the PMOS transistor section 16b to form connection electrodes 47 and 47 connected to the source and drain diffusion layers 20c and 20c', respectively.

After that, as in the fourth embodiment described above, a gate contact (electrode contact) 27c formed on the on-field gate electrode 19c and connected to the connection electrode 32, a bit-line contact (electrode contact) 27a connected to the connection electrode 34b, and active contacts (electrode contacts) 27b and 27b connected to the connection electrodes 47 and 47, are formed (see FIGS. 7B to 7D).

Figure 13E:
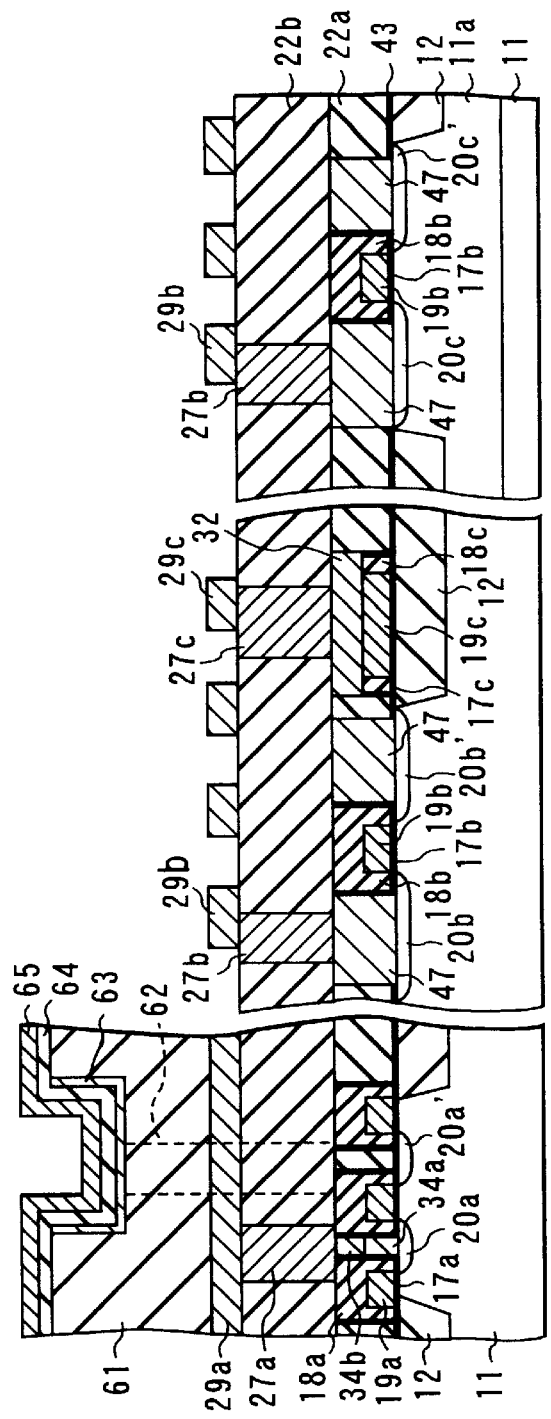

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 13E.

(Ninth Embodiment)

FIGS. 14A to 14G illustrate a stacked type DRAM according to a ninth embodiment of the present invention in order to explain a method of manufacturing the same in brief. The ninth embodiment is directed to another example of the structure of the DRAM of the eighth embodiment.

Figure 14A:
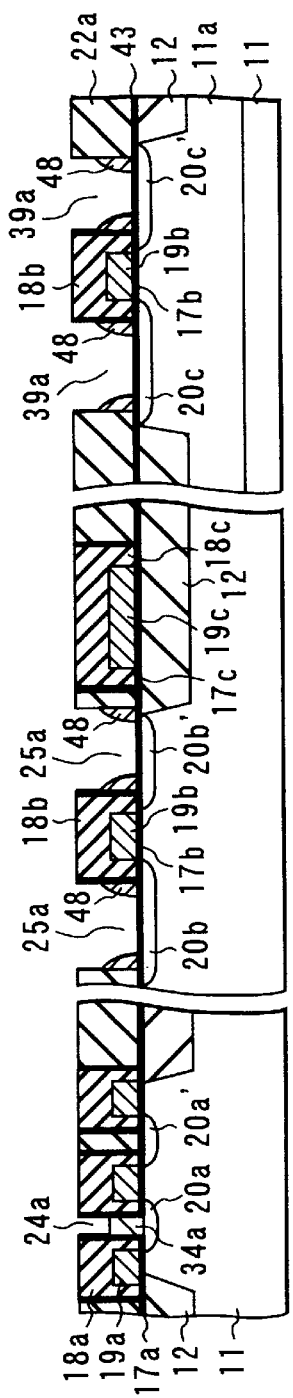
FIGS. 14A to 14G are cross-sectional views schematically showing steps of manufacturing a stacked type DRAM according to a ninth embodiment of the present invention.

As described in the foregoing eighth embodiment, only the insulating protection film 43, which is exposed to the bottom of the contact hole 24a of the memory cell section 10a, is removed, and conductive materials (e.g., polysilicon) 45 are deposited (see FIG. 13A). In this state, as shown in FIG. 14A, the entire surface of the conductive materials 45 is etched by RIE (reactive ion etching).

The conductive materials are caused to remain partly only in the contact hole 24a to form a connection electrode 34a connected to one of the source and drain diffuison layer 20a in the memory cell section 10a, and side-wall layers 48, 48, 48 and 48 of the conductive materials are formed on the side walls of the contact holes 25a and 25a of the NMOS transistor section 16a and on the side walls of the contact holes 39a and 39a of the PMOS transistor section 16b.

Figure 14B:
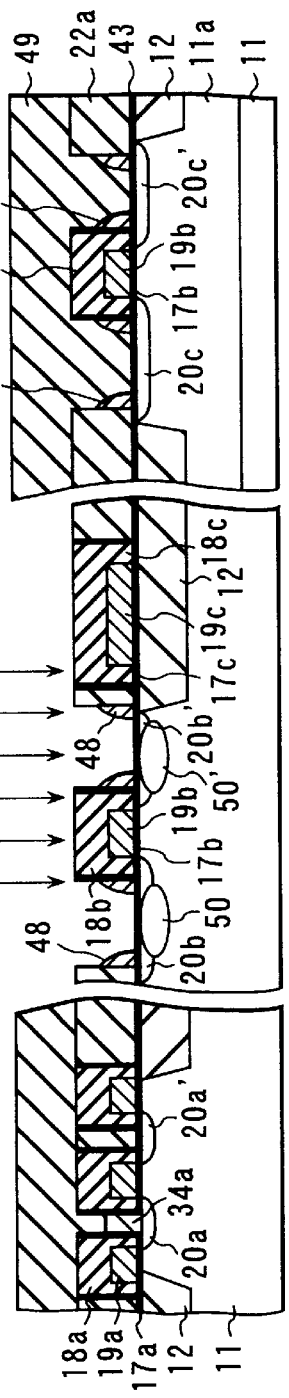

Then, as shown in FIG. 14B, a resist film 49 is formed so as to cover the memory cell section 10a and PMOS transistor section 16b. In this state, N-type impurities (e.g., arsenic) are ion-implanted into the NMOS transistor section 16a through the side-wall layers 48 and 48.

Thus, N-type impurity regions 50 and 50', which correspond to the contact holes 25a and 25a, respectively and whose concentration is higher than that of the source and drain diffusion layers 20b and 20b', are formed in the surface areas of the P-type silicon substrate 11.

Figure 14C:
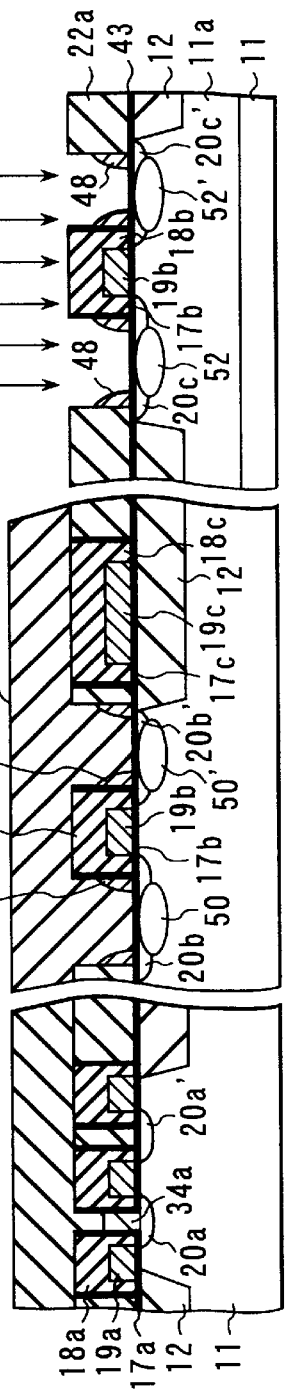

After that, the resist film 49 is removed and, as shown in FIG. 14C, a resist film 51 is formed so as to cover both the memory cell section 10a and NMOS transistor section 16a. In this state, P-type impurities (e.g., boron) are ion-implanted into the PMOS transistor section 16b through the side-wall layers 48 and 48.

Thus, P-type impurity regions 52 and 52', which correspond to the contact holes 39a and 39a, respectively and whose concentration is higher than that of the source and drain diffusion layers 20c and 20c', are formed in the surface areas of the N-type well region 11a.

Figure 14D:
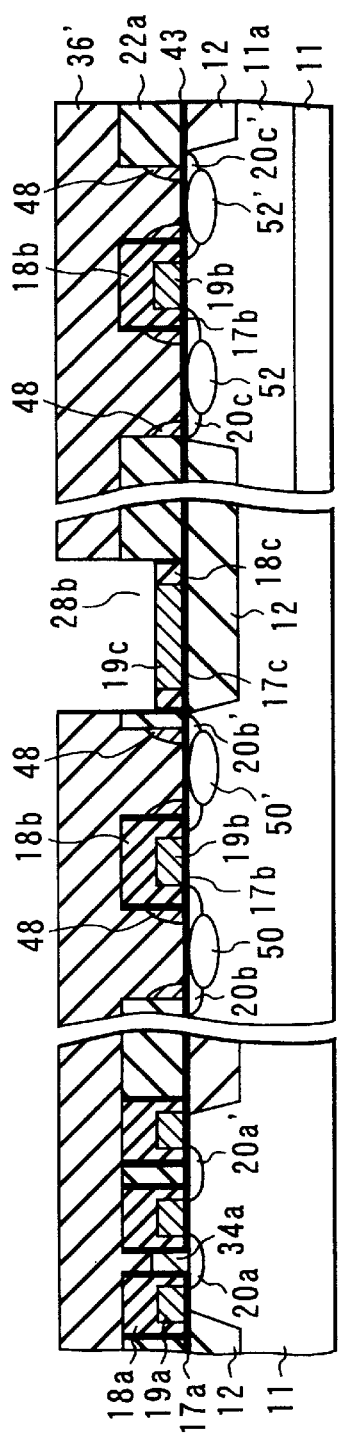

The resist film 51 is removed and then, as illustrated in FIG. 14D, a resist pattern 36' having an opening pattern, which is larger than the on-field gate electrode 19c, is formed almost all over the structure. Using the resist pattern 36' as a mask, the insulation film 18c and insulating protection film 43 are selectively etched using a heated phosphoric acid solution to form an opening portion 28b through which the top surface of the on-field gate electrode 19c is exposed.

Figure 14E:
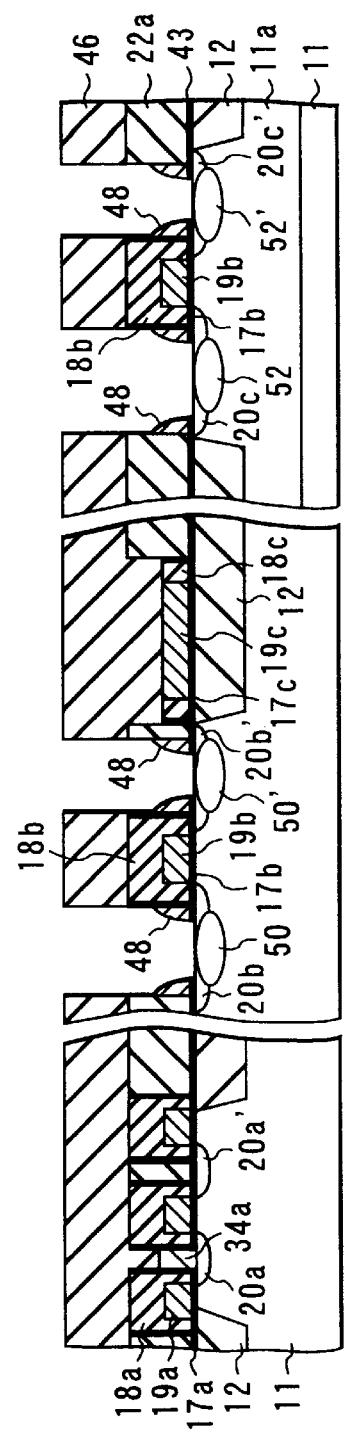

The resist pattern 36' is removed and then, as shown in FIG. 14E, a resist pattern 46 is formed almost all over the resultant structure to eliminate the insulating protection film 43 which is exposed to the bottoms of the contact holes 25a and 25a of the NMOS transistor section 16a and those of the contact holes 39a and 39a of the PMOS transistor section 16b.

Figure 14F:
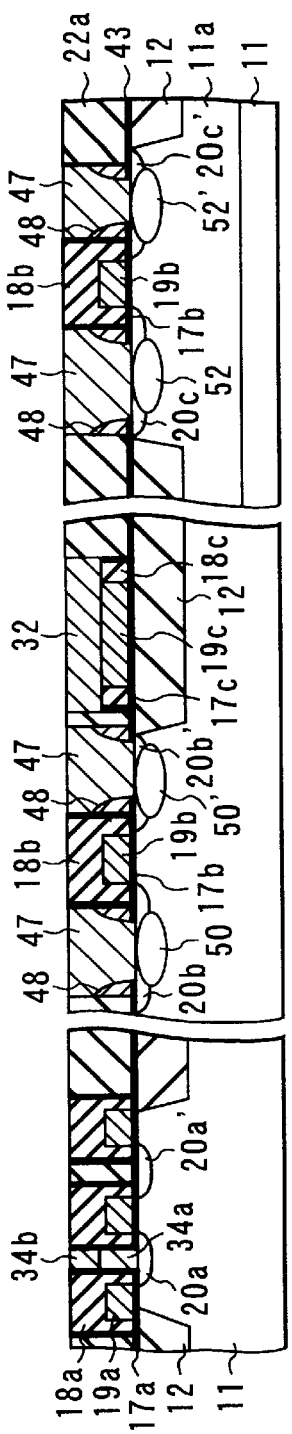

The resist pattern 46 is eliminated and, as shown in FIG. 14F, electrode materials (e.g., tungsten) whose resistance is lower than that of polysilicon, are deposited almost all over the resultant structure and their top surface is polished by CMP. The insulation film 18c is thus removed from the opening portion 28b on the on-field gate electrode 19c, and the electrode materials are buried completely into the opening portion 28b to obtain a connection electrode 32.

Simultaneously, the electrode materials are completely buried into a step portion of the top surface of the connection electrode 34a to form a connection electrode 34b of lower resistance which is connected to the connection electrode 34a.

The electrode materials are completely buried into the contact holes 25a and 25a of the NMOS transistor section 16a through the side-wall layers 48 and 48 to form connection electrodes 47 and 47 connected to the source and drain diffusion layers 20b and 20b' and N-type impurity regions 50 and 50', respectively, while the electrode materials are completely buried into the contact holes 39a and 39a of the PMOS transistor section 16b to form connection electrodes 47 and 47 connected to the source and drain diffusion layers 20c and 20c' and P-type impurity regions 52 and 52', respectively.

After that, as in the fourth embodiment described above, a gate contact (second electrode contact) 27c formed on the on-field gate electrode 19c and connected to the connection electrode 32, a bit-line contact (electrode contact) 27a connected to the connection electrode 34b, and active contacts (first electrode contacts) 27b and 27b connected to the connection electrodes 47 and 47, are formed (see FIGS. 7B to 7D).

Figure 14G:
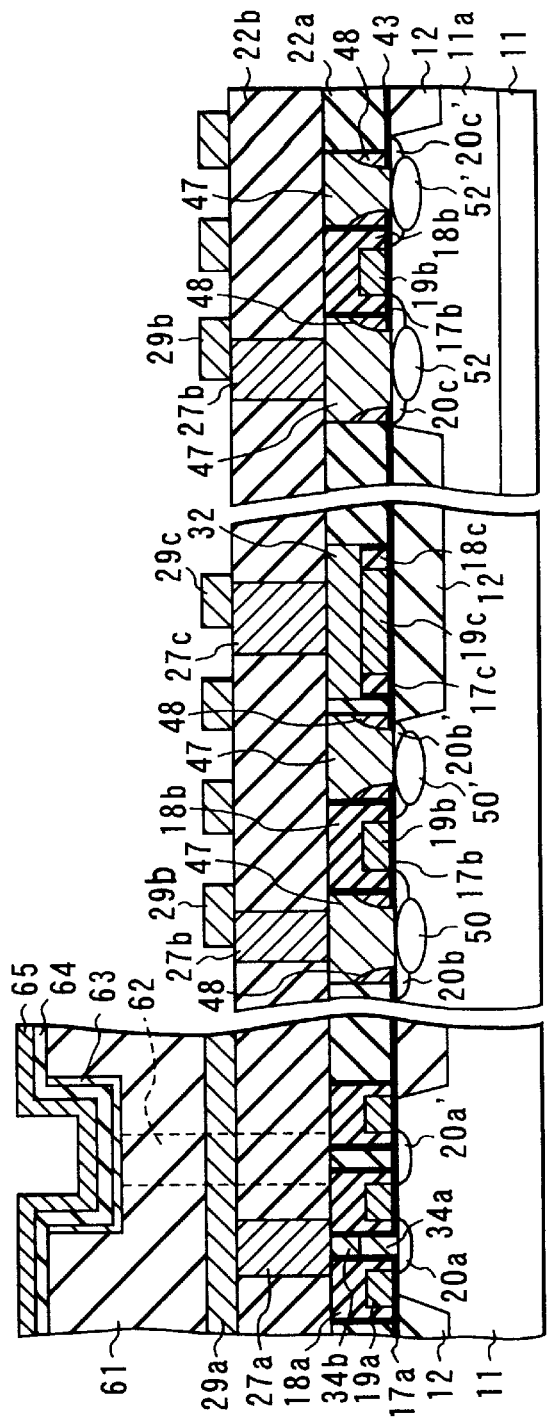

Similarly, in the memory cell section 10a, another interlayer insulation film 61 is formed and then both a plug portion 62 connected to the other of the source and drain diffusion layers 20a' and a stacked capacitor (including a storage electrode 63, a capacitor insulation film 64 and a plate electrode 65) connected to the plug portion 62 are formed, thus completing a DRAM having a desired stacked structure as shown in FIG. 14G.

(Tenth Embodiment)

FIGS. 15A to 15G illustrate a stacked DRAM according to a tenth embodiment of the present invention in order to explain a method of manufacturing the same in brief. The tenth embodiment is directed to the DRAM of the eighth embodiment in which impurities-doped polysilicon is employed as conductive materials for forming a connection electrode.

Figure 15A:
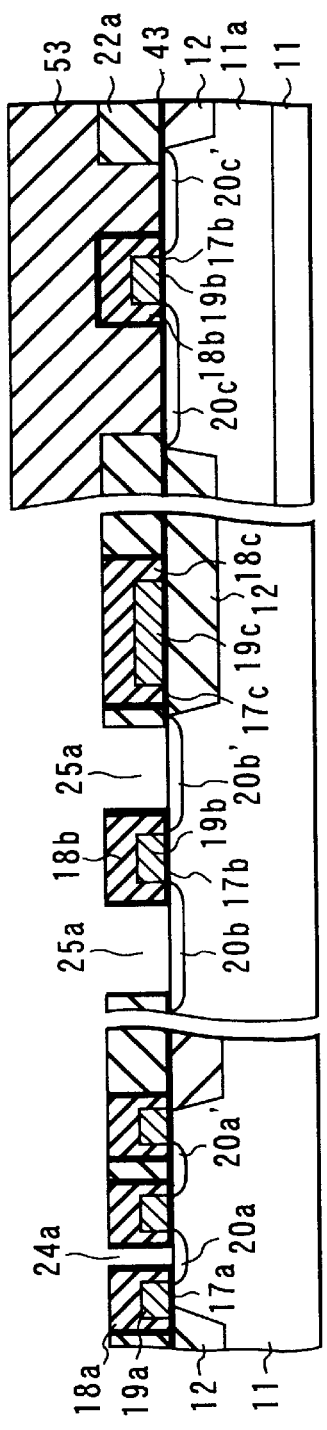
FIGS. 15A to 15G are cross-sectional views schematically showing steps of manufacturing a stacked type DRAM according to a tenth embodiment of the present invention.

First, as in the foregoing eighth embodiment, a contact hole (substrate contact hole) 24a reaching one of source and drain diffusion layers 20a, contact holes (substrate contact holes) 25a and 25a reaching the source and drain diffusion layers 20b and 20b', and contact holes (substrate contact holes) 39a and 39a reaching the source and drain diffusion layers 20c and 20c are formed. In this state, as illustrated in FIG. 15A, a resist film 53 is formed so as to cover a PMOS transistor section 16b.

An insulating protection film 43, which is exposed to the bottom of the contact hole 24a of the memory cell section 10a and the bottoms of the contact holes 25a and 25a of the NMOS transistor section 16a, is eliminated.

Figure 15B:
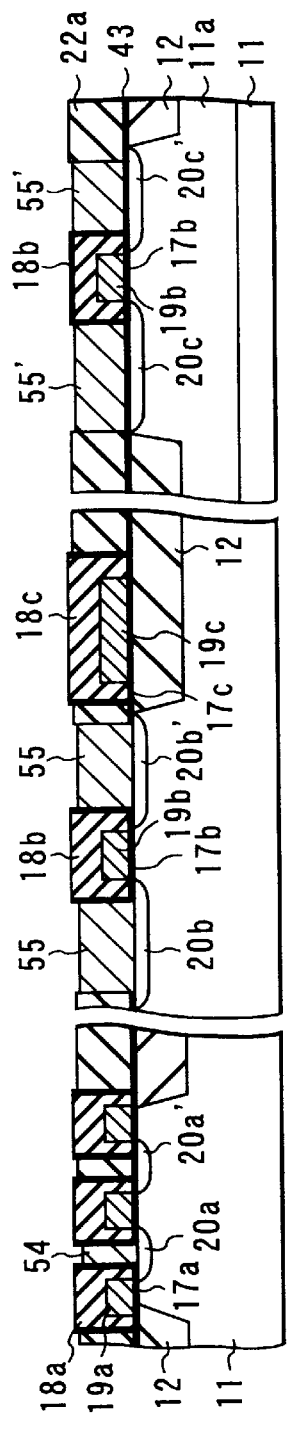

Then, the resist film 53 is removed and, as shown in FIG. 15B, a polysilicon film doped with N-type impurities (N-type silicon film) is formed almost all over the resultant structure and its top surface is polished by CMP to completely bury the N-type silicon film into the contact hole 24a of the memory cell section 10a and the contact holes 25a and 25a of the NMOS transistor section 16a, thus obtaining connection electrodes 54, 55 and 55.

Similarly, the N-type silicon film is completely buried into the contact holes 39a and 39a of the PMOS transistor section 16b to form dummy connection electrodes 55' and 55'.

Figure 15C:
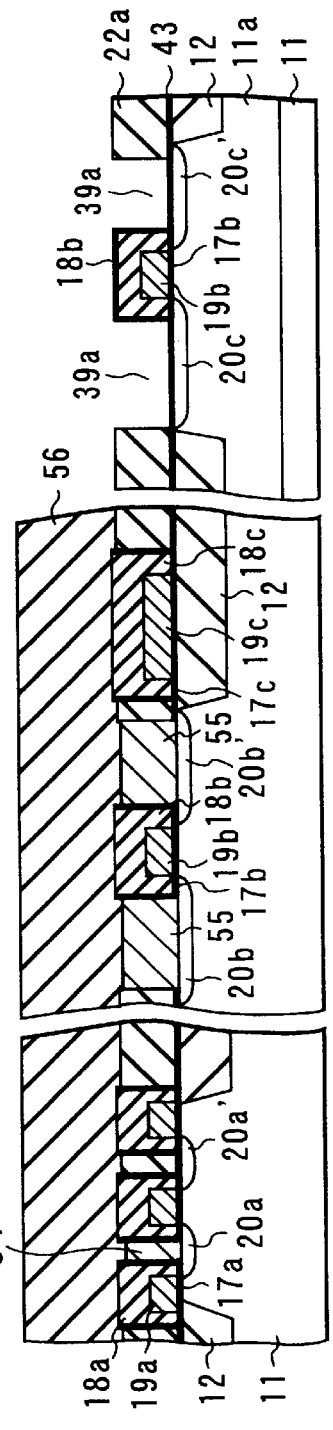

After that, as illustrated in FIG. 15C, a resist film 56 is formed so as to cover the memory cell section 10a and NMOS transistor section 16a, and the dummy connection electrodes 55' and 55' are removed from the contact holes 39a and 39a of the PMOS transistor section 16b.

Figure 15D:
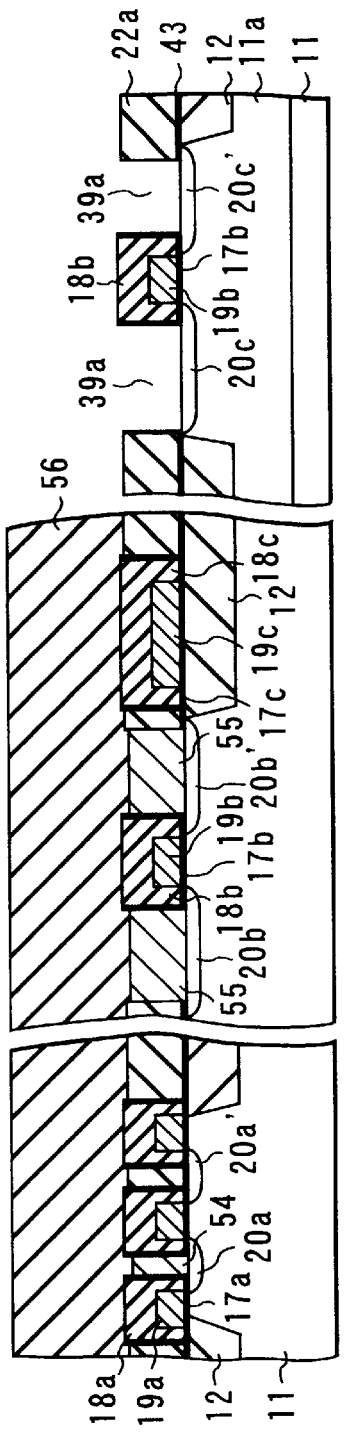

As shown in FIG. 15D, the entire surface of the resultant structure is etched by RIE to remove the insulating protection film 43 which is exposed to the bottoms of the contact holes 39a and 39a of the PMOS transistor section 16b.

Figure 15E:
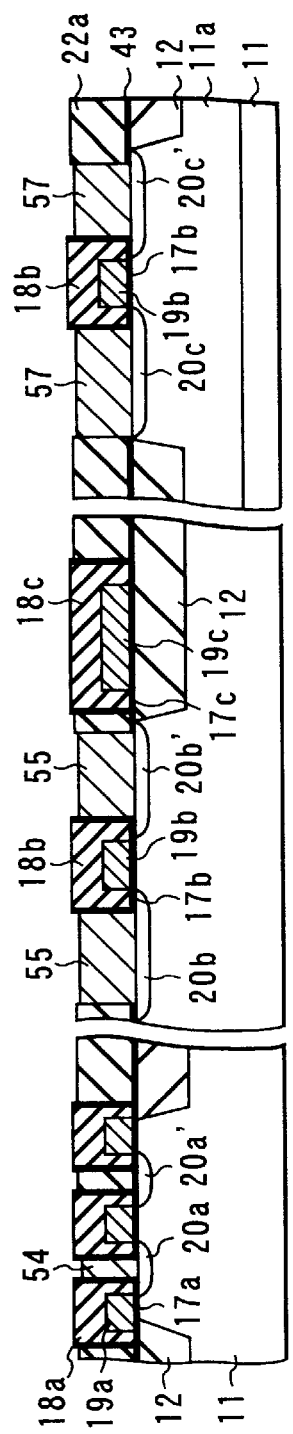

After the resist film 56 is removed, as shown in FIG. 15E, a polysilicon film doped with P-type impurities (P-type silicon film) is deposited almost all over the structure and its top surface is polished by CMP to completely bury the P-type silicon film into the contact holes 39a and 39a of the PMOS transistor section 16b, thereby forming connection electrodes 57 and 57.

Figure 15F:
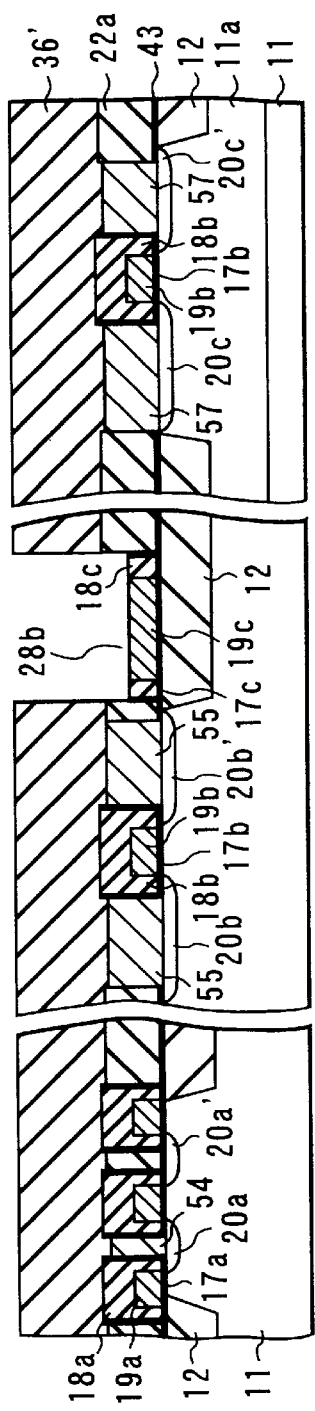

As illustrated in FIG. 15F, a resist pattern 36' having an opening pattern, which is larger than the on-field gate electrode 19c, is formed almost all over the structure. Using the resist pattern 36' as a mask, the insulation film 18c and insulating protection film 43 are selectively etched using a heated phosphoric acid solution to form an opening portion 28b through which the top surface of the on-field gate electrode 19c is exposed.

The resist pattern 36' is eliminated and electrode materials (e.g., tungsten) whose resistance is lower than that of polysilicon, are deposited almost all over the resultant structure and their top surface is polished by CMP. The insulation film 18c is thus removed from the opening portion 28b on the on-field gate electrode 19c, and the electrode materials are buried completely into the opening portion 28b to obtain a connection electrode 32 (see FIG. 13D).

After that, as in the fourth embodiment described above, a gate contact (electrode contact) 27c is formed on the on-field gate electrode 19c in contact with the connection electrode 32, a bit-line contact (electrode contact) 27a is formed in contact with the connection electrode 54, and active contacts (electrode contacts) 27b and 27b are formed in contact with the connection electrodes 55, 55, 57 and 57 (see FIGS. 7B to 7D).

Figure 15G:
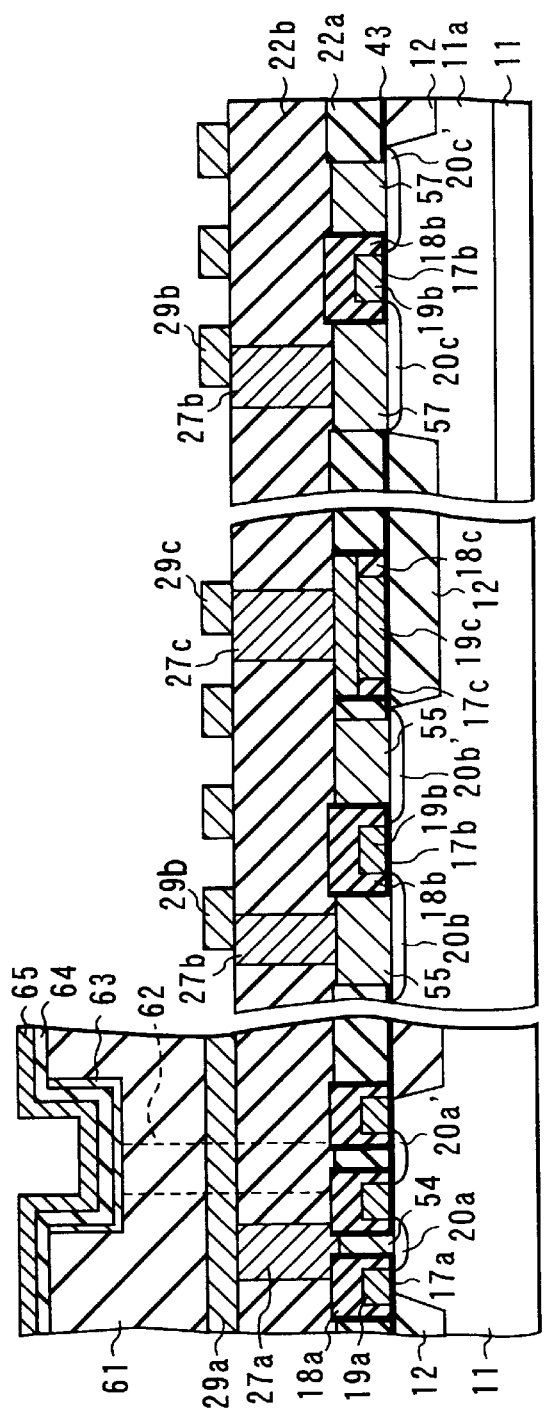

Similarly, in the memory cell section 10a, another interlayer insulation film 61 is formed, and then a plug portion 62 is formed in contact with the other of the source and drain diffusion layers 20a' and so is a stacked capacitor (including a storage electrode 63, a capacitor insulation film 64 and a plate electrode 65) connected to the plug portion 62, thus completing a DRAM having a desired stacked structure as shown in FIG. 15G.

According to the method of the tenth embodiment, the polysilicon film can be doped with impurities more uniformly than when impurities are ion-implanted; therefore, the method is excellent in controllability in forming the connection electrodes 54, 55, 55, 57 and 57.

In some of the foregoing embodiments, a connection electrode is provided for only one of source and drain diffusion layers of the memory cell section. The present invention is not limited to this. For example, a connection electrode can be provided for each of source and drain diffusion layers. This is very useful because the use of a leading electrode for connecting a storage electrode and a diffusion layer in the memory cell section is, in most cases, advantageous in the stacked type DRAM in which a capacitor is formed on a bit line.

In the above structure, both low resistance of source and drain diffusion layers in the peripheral circuit section and small leak current in the memory cell section can be achieved. The structure can thus easily be applied to a logic circuit of the stacked type DRAM, though it is generally considered to be incompatible with a logic circuit.

The above-described embodiments are all applied to a stacked type DRAM. However, the present invention can be applied to a trench type DRAM including a capacitor having a trench structure.

It is needless to say that various changes and modifications can be made without departing from the scope of the subject matter of the invention.

According to the present invention described above in detail, since contact holes for a bit-line contact, an active contact and a gate contact can be formed simultaneously using a single mask, these contacts can be formed in the same layer, and a misalignment between a mask used for lithography to form a wiring layer and each of the contacts can be minimized. Consequently, contacts formed below a first-layered wiring layer, can be formed simultaneously using a single mask, and the number of manufacturing steps can be decreased. Moreover, a yield against a short circuit between the wiring layer and contacts can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device comprising:
    a semiconductor substrate;
    an element isolating insulation film selectively provided in a surface area of the semiconductor substrate;
    at least one first electrode layer formed on a surface of the semiconductor substrate, which corresponds to an element region delimited by the element isolating insulation film, with a first insulation film interposed therebetween, the first electrode layer having a top and a side both covered with a second insulation film;
    a diffusion layer formed in a surface area of the semiconductor substrate and adjacent to the first electrode layer;
    a second electrode layer formed on the element isolating insulation film corresponding to an element isolation region, and having a top and a side both covered with a second insulation film having an opening portion of predetermined size;
    an interlayer insulation film provided almost all over the semiconductor substrate so as to fill a space between the electrode layers;
    a substrate contact formed in the interlayer insulation film in self-alignment with the first electrode layer and connected to the diffusion layer; and
    an electrode contact formed in the interlayer insulation film simultaneously with the substrate contact and connected to the second electrode layer through the opening portion of the second insulation film.

2. The semiconductor device according to claim 1, wherein the element isolating insulation film has a top surface which is substantially flush with the surface of the semiconductor substrate.

3. The semiconductor device according to claim 1, wherein the opening portion has an area which is larger than a cross-sectional area of the electrode contact.

4. The semiconductor device according to claim 1, wherein the opening portion is filled with a connection electrode.

5. The semiconductor device according to claim 1, wherein the substrate contact is connected to the diffusion layer through a connection electrode.

6. The semiconductor device according to claim 5, wherein the connection electrode has a stacked structure in which a second connection electrode is formed on a first connection electrode.

7. A semiconductor device comprising:

a semiconductor substrate;

an element isolating insulation film selectively provided in a surface area of the semiconductor substrate;

at least one first electrode layer formed on a surface of the semiconductor substrate, which corresponds to an element region delimited by the element isolating insulation film, with a first insulation film interposed therebetween, the first electrode layer having a top and a side both covered with a second insulation film;

a diffusion layer formed in a surface area of the semiconductor substrate and adjacent to the first electrode layer;

a second electrode layer formed on the element isolating insulation film corresponding to an element isolation region, and having a top and a side both covered with a second insulation film having an opening portion of predetermined size;

a first interlayer insulation film provided substantially flush with the electrode layers so as to fill a space between the electrode layers;

a side-wall layer formed on a side wall of a contact hole provided in the first interlayer insulation film in self-alignment with the second electrode layer;

a connection electrode buried into the contact hole and connected to the diffusion layer through the side-wall layer;

a second interlayer insulation film provided on the first interlayer insulation film so as to bury the connection electrode;

a first contact formed in the second interlayer insulation film and connected to the connection electrode; and a second contact formed in the second interlayer insulation film simultaneously with the first contact and connected to the first electrode layer through the opening portion of the second insulation film.

8. The semiconductor device according to claim 7, wherein the element isolating insulation film has a top surface which is substantially flush with the surface of the semiconductor substrate.

9. The semiconductor device according to claim 7, wherein the opening portion has an area which is larger than a cross-sectional area of the electrode contact.

10. The semiconductor device according to claim 7, wherein the opening portion is filled with a connection electrode.

11. The semiconductor device according to claim 7, wherein the diffusion layer has a high-concentration impurity region in close vicinity thereto.

12. A method of manufacturing a semiconductor memory device in which a memory cell section and a peripheral circuit section including a core circuit section are provided on a semiconductor substrate, the method comprising the steps of:

forming each of a plurality of first electrode layers on an element region on the semiconductor substrate with a first insulation film interposed therebetween, each of the first electrode layers having a top and a side both covered with a second insulation film, and forming at least one second electrode layer on an element isolation region on the semiconductor substrate, the second electrode layer having a top and a side both covered with the second insulation film;

selectively removing the second insulation film on the second electrode layer to form an opening portion of predetermined size;

depositing an interlayer insulation film almost all over the semiconductor substrate;

selectively removing the interlayer insulation film using a single mask so as to leave the second insulation film, and simultaneously forming a substrate contact hole reaching the semiconductor substrate and an electrode contact hole reaching the second electrode layer through the opening portion; and filling the substrate contact hole and the electrode contact hole with conductive materials to form a contact connected to the semiconductor substrate and the second electrode layer.

13. The method according to claim 12, wherein the opening portion has a cross-sectional area which is larger than that of the electrode contact hole.

14. The method according to claim 12, further comprising a step of almost flattening a top surface of the deposited interlayer insulation film.

15. The method according to claim 12, wherein the substrate contact hole is formed in self-alignment with the second electrode layer.

16. The method according to claim 12, wherein a diffusion layer is formed between the semiconductor substrate and the substrate contact hole.

17. The method according to claim 12, wherein the memory cell section has a storage capacitance of one of a stacked structure and a trench structure.

18. A method of manufacturing a semiconductor memory device in which a memory cell section and a peripheral circuit section including a core circuit section are provided on a semiconductor substrate, the method comprising the steps of:

forming each of a plurality of first electrode layers on an element region on the semiconductor substrate with a first insulation film interposed therebetween, each of the first electrode layers having a top and a side both covered with a second insulation film, and forming at least one second electrode layer on an element isolation region on the semiconductor substrate, the second electrode layer having a top and a side both covered with the second insulation film;

depositing a first interlayer insulation film almost all over the semiconductor substrate;

etching back the first interlayer insulation film to expose a top surface of the second insulation film;

selectively removing the second insulation film on the second electrode layer to form an opening portion of predetermined size;

filling the opening portion with electrode materials;

depositing a second interlayer insulation film almost all over the semiconductor substrate;

selectively removing the first and second interlayer insulation films using a single mask so as to leave the second insulation film, and simultaneously forming a substrate contact hole reaching the semiconductor substrate and an electrode contact hole reaching the electrode materials; and filling the substrate contact hole and the electrode contact hole with conductive materials to form a contact connected to the semiconductor substrate and the electrode materials.

19. The method according to claim 18, wherein the opening portion has a cross-sectional area which is larger than that of the electrode contact hole.

20. The method according to claim 18, further comprising a step of almost flattening a top surface of each of the deposited first and second interlayer insulation films.

21. The method according to claim 18, wherein the substrate contact hole is formed in self-alignment with the second electrode layer.

22. The method according to claim 18, wherein a diffusion layer is formed between the semiconductor substrate and the substrate contact hole.

23. The method according to claim 18, wherein the memory cell section has a storage capacitance of one of a stacked structure and a trench structure.

24. A method of manufacturing a semiconductor memory device in which a memory cell section and a peripheral circuit section including a core circuit section are provided on a semiconductor substrate, the method comprising the steps of:

forming each of a plurality of first electrode layers on an element region on the semiconductor substrate with a first insulation film interposed therebetween, each of the first electrode layers having a top and a side both covered with a second insulation film, and forming at least one second electrode layer on an element isolation region on the semiconductor substrate, the second electrode layer having a top and a side both covered with the second insulation film;

depositing a first interlayer insulation film almost all over the semiconductor substrate;

etching back the first interlayer insulation film to expose a top surface of the second insulation film;

selectively removing the first interlayer insulation film so as to leave the second insulation film to form a substrate contact hole reaching the semiconductor substrate;

filling the substrate contact hole with conductive materials to form a connection electrode;

selectively removing the second insulation film on the second electrode layer to form an opening portion of predetermined size;

depositing a second interlayer insulation film almost all over the semiconductor substrate;

selectively removing the second interlayer insulation film using a single mask so as to leave the second insulation film, and simultaneously forming an electrode contact hole reaching the connection electrode and an electrode contact hole reaching the second electrode layer through the opening portion; and filling each of the electrode contact holes with conductive materials to form a contact connected to the connection electrode and the second electrode layer.

25. The method according to claim 24, further comprising a step of filling the opening portion with electrode materials to connect the second electrode layer and the contact through the electrode materials.

26. The method according to claim 24, wherein the connection electrode is formed using polysilicon as conductive materials, and further comprising a step of ion-implanting impurities into the polysilicon.

27. The method according to claim 24, further comprising a step of forming an insulating protection film so as to cover at least a top surface of the semiconductor substrate and the top surface of the second insulation film to deposit the first interlayer insulation film almost all over the insulating protection film.

28. The method according to claim 24, further comprising a step of etching back a top surface of the connection electrode to form a step portion whose level is lower than that of the top surface of the second insulation film, and a step of burying electrode materials of lower resistance into both the opening portion and the step portion.

29. The method according to claim 24, further comprising a step of removing conductive materials buried incompletely into the substrate contact hole and then filling the substrate contact hole with electrode materials to form a connection electrode in the peripheral circuit section.

30. The method according to claim 29, further comprising a step of removing conductive materials buried incompletely into the substrate contact hole such that a side-wall layer is formed on a side wall of the substrate contact hole in the peripheral circuit section.

31. The method according to claim 30, further comprising a step of ion-implanting impurities through the side-wall layer to form a high-concentration impurity region in a surface area of the semiconductor substrate which corresponds to the substrate contact hole.

32. The method according to claim 24, wherein the connection electrode is formed using impurities-doped polysilicon as conductive materials.

33. The method according to claim 24, further comprising a step of almost flattening a top surface of each of the deposited first and second interlayer insulation films.

34. The method according to claim 24, wherein the substrate contact hole is formed in self-alignment with the second electrode layer.

35. The method according to claim 24, wherein a diffusion layer is formed between the semiconductor substrate and the substrate contact hole.

36. The method according to claim 24, wherein the memory cell section has a storage capacitance of one of a stacked structure and a trench structure.

37. A method of manufacturing a semiconductor memory device in which a memory cell section and a peripheral circuit section including a core circuit section are provided on a semiconductor substrate, the method comprising the steps of:

forming each of a plurality of first electrode layers on an element region on the semiconductor substrate with a first insulation film interposed therebetween, each of the first electrode layers having a top and a side both covered with a second insulation film, and forming at least one second electrode layer on an element isolation region on the semiconductor substrate, the second electrode layer having a top and a side both covered with the second insulation film;

depositing a first interlayer insulation film almost all over the semiconductor substrate;

etching back the first interlayer insulation film to expose a top surface of the second insulation film;

selectively removing the first interlayer insulation film so as to leave the second insulation film to form a substrate contact hole reaching the semiconductor substrate;

filling the substrate contact hole with conductive materials to form a connection electrode;

depositing a second interlayer insulation film almost all over the semiconductor substrate; selectively removing the second interlayer insulation film using a single mask so as to leave the second insulation film, and simultaneously forming an electrode contact hole reaching the connection electrode and a first contact hole reaching the second insulation film on the second electrode layer;

selectively removing the second insulation film exposed to the first contact hole and forming a second contact hole reaching the second electrode layer; and filling the electrode contact hole and each of the first and second contact holes with conductive materials to form a contact connected to the connection electrode and the second electrode layer.

38. The method according to claim 37, wherein the second contact hole is formed while the electrode contact hole is covered with a resist film.

39. The method according to claim 37, further comprising a step of forming a surface protection film on a top surface of the second interlayer insulation film and removing the second interlayer insulation film including the surface protection film to form the electrode contact hole and the first contact hole.

40. The method according to claim 37, wherein the connection electrode is formed using polysilicon as conductive materials, and further comprising a step of ion-implanting impurities into the polysilicon.

41. The method according to claim 37, further comprising a step of forming an insulating protection film so as to cover at least a top surface of the semiconductor substrate and the top surface of the second insulation film to deposit the first interlayer insulation film with the insulating protection film interposed therebetween.

42. The method according to claim 37, wherein the connection electrode is formed using impurities-doped polysilicon as conductive materials.

43. The method according to claim 37, further comprising a step of almost flattening a top surface of each of the deposited first and second interlayer insulation films.

44. The method according to claim 37, wherein the substrate contact hole is formed in self-alignment with the second electrode layer.

45. The method according to claim 37, wherein a diffusion layer is formed between the semiconductor substrate and the substrate contact hole.

46. The method according to claim 37, wherein the memory cell section has a storage capacitance of one of a stacked structure and a trench structure.

47. The device according to claim 1, wherein a width of said opening portion is narrower than that of the second electrode layer.

48. The device according to claim 1, wherein a protection film is further formed on a side of said second insulation film.

49. The device according to claim 48, wherein a protection insulation film is formed of a material different from that of the interlayer insulation film.

50. The device according to claim 48, wherein under a predetermined condition, the protection film is etched at a rate lower than that for the interlayer insulation film.

51. The device according to claim 48, wherein the protection film is formed of SiN and the interlayer second insulation film is formed of $SiO_2$.

52. The device according to claim 1, further comprising:
a transistor formed on the semiconductor substrate, the transistor having a gate electrode and source/drain regions;
a bit line formed on the interlayer insulation film; and
a bit line contact connecting the bit line and one of the source/drain regions of the transistor, the bit line contact being formed in the interlayer insulation film simultaneously with the electrode contact.

53. The device according to claim 5, wherein a width of the substrate contact is narrower than that of the connection electrode.

54. A semiconductor device comprising:
a semiconductor substrate;
an element isolating insulating film selectively provided in a surface area of the semiconductor substrate;
at least one first electrode layer formed on a surface of the semiconductor substrate, which corresponds to an element delimited by the element isolating insulation film, with a first insulating film interposed therebetween, the first electrode layer having a top and a side both covered with a second insulation film;
a diffusion layer formed in a surface area of the semiconductor substrate and adjacent to the first electrode layer;
a second electrode layer formed on the element isolating insulation film corresponding to an element isolation region, and having a second insulation provided on a side thereof, top surfaces of the second electrode layer on the element isolation region and the adjacent second insulation film provided on the side of the second electrode layer being flush with each other.
a first interlayer insulation film provided almost all over the semiconductor substrate so as to fill a space between the first and second electrode layers;
a connection electrode formed in the first interlayer insulation film in self-alignment with the first electrode layer and connected to the diffusion layer, a top surface of the connection electrode being higher than that of the second electrode layer on the element isolation region;
a second interlayer insulation film covering a top surface of the connection electrode and provided almost all over the semiconductor substrate;
a first electrode contact provided in the second interlayer insulation film and connected to the connection electrode;
a second electrode contact formed in the second interlayer insulation film simultaneously with the first electrode contact and connected to the second electrdode layer on the element isolating insulation region.

55. The semiconductor device, according to claim 54, wherein the element isolating insulation film has a top surface which is substantially flush with the surface of the semiconductor substrate.

56. The semiconductor device, according to claim 54, wherein the connection electrode has a stacked structure in which a second connection electrode is formed on a first connection electrode.

57. The semiconductor device, according to claim 54, wherein a protection film is further formed on a side of said second insulation film.

58. The semiconductor device, according to claim 57, wherein a protection film is formed of a material different from that of the first and second interlayer insulation films.

59. The semiconductor device, according to claim 57, wherein under a predetermined condition, the protection film is etched at a rate lower than that for the first and second interlayer insulation films.

60. The device according to claim 57, wherein the protection film is formed of SiN and the first and second interlayer insulation films are formed of $SiO_2$.

61. The device according to claim 54, further comprising:
a transistor formed on the semiconductor substrate, the transistor having a gate electrode and source/drain regions;
a bit line connection electrode formed in the first interlayer insulation film in self-alignment with the gate electrode and connected to the source/drain regions of the transistor, the bit line connection electrode being formed simultaneously with the connection electrode;
a bit line formed on the top surface of the second interlayer insulation film; and
a bit line contact connecting the bit line and the bit line connection electrode, the bit line contact formed in the second interlayer insulation film simultaneously with the second electrode contact.

62. The device according to claim 54, wherein a width of the first electrode contact is narrower than that of the connection electrode.

63. A semiconductor device comprising:
a semiconductor substrate;
an element isolating insulating film selectively provided in a surface area of the semiconductor substrate;
at least one first electrode layer formed on a surface of the semiconductor substrate, which corresponds to an element delimited by the element isolating insulation film, with a first insulating film interposed therebetween, the first electrode layer having a top and a side both covered with a second insulation film;
a diffusion layer formed in a surface area of the semiconductor substrate and adjacent to the first electrode layer;
a second electrode layer formed on the element isolating insulation film corresponding to an element isolation region, and having a second insulation provided on a side thereof, top surfaces of the second electrode layer on the element isolation region and the adjacent second insulation film provided on the side of the second electrode layer being flush with each other.
a first interlayer insulation film provided almost all over the semiconductor substrate so as to fill a space between the first and second electrode layers;
a connection electrode formed in the first interlayer insulation film in self-alignment with the first electrode layer and connected to the diffusion layer, a top surface of the connection electrode being higher than that of the second electrode layer on the element isolation region;
upper connection electrodes provided on the top surfaces of the second electrode layer on the element isolation region and of the second insulation film provided on the side of the second electrode layer;
a second interlayer insulation film covering the top surface of the connection electrode and provided almost all over the semiconductor substrate;
a second interlayer insulation film covering the top surfaces of the connection electrode and the upper connection electrode and provided almost all over the semiconductor substrate;
a first electrode contact provided in the second interlayer insulation film and connected to the connection electrode; and
a second electrode contact formed in the second interlayer insulation film simultaneously with the first electrode contact and connected to the second electrdode layer on the element isolating insulation region.

64. The device according to claim 63, wherein the upper connection electrode is formed simultaneously with the connection electrode.

65. The device according to claim 63, wherein the top surface of the upper connection electrode is flush with the top surface of the connection electrode.

66. The device according to claim 63, wherein the element isolating insulation film has a top surface which is substantially flush with the surface of the semiconductor substrate.

67. The device according to claim 63, wherein the first electrode contact is connected to the diffusion layer region via the connection electrode.

68. The device according to claim 63, wherein the connection electrode has a stacked structure in which a second connection electrode is formed on a first connection electrode.

69. The device according to claim 63, wherein a protection film is further formed on a side of said second insulation film.

70. The device according to claim 69, wherein the protection film is formed of a material different from that of the first and second interlayer insulation films.

71. The device according to claim 69, wherein under a predetermined condition, the protection film is etched at a rate lower than that for the first and second interlayer insulation films.

72. The device according to claim 69, wherein the protection film is formed of SiN and the first and second interlayer insulation films are formed of $SiO_2$.

73. The device according to claim 63, further comprising:
a transistor formed on the semiconductor substrate, the transistor having a gate electrode and source/drain regions;
a bit line connection electrode formed in the first interlayer insulation film in self-alignment with the gate electrode and connected to the source/drain regions of the transistor, the bit line connection electrode being formed simultaneously with the connection electrode;
a bit line formed on the top surface of the second interlayer insulation film; and
a bit line contact connecting the bit line and the bit line connection electrode, the bit line contact formed in the second interlayer insulation film simultaneously with the second electrode contact.

74. The device according to claim 63, wherein a width of the first electrode contact is narrower than that of the connection electrode.

* * * * *